(12) United States Patent
Song

(10) Patent No.: US 11,996,157 B2
(45) Date of Patent: *May 28, 2024

(54) PROCESSING-IN-MEMORY (PIM) DEVICES

(71) Applicant: SK hynix Inc., Icheon-si (KR)

(72) Inventor: Choung Ki Song, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 358 days.

This patent is subject to a terminal disclaimer.

(21) Appl. No.: 17/375,622

(22) Filed: Jul. 14, 2021

(65) Prior Publication Data

US 2021/0344357 A1 Nov. 4, 2021

Related U.S. Application Data

(63) Continuation of application No. 17/347,262, filed on Jun. 14, 2021, which is a continuation-in-part of (Continued)

(30) Foreign Application Priority Data

Sep. 23, 2019 (KR) .......................... 10-2019-0117098

(51) Int. Cl.
*G11C 29/42* (2006.01)
*G06F 7/544* (2006.01)
(Continued)

(52) U.S. Cl.
CPC ............ *G11C 29/42* (2013.01); *G06F 7/5443* (2013.01); *G06F 17/16* (2013.01); *G06N 3/063* (2013.01);
(Continued)

(58) Field of Classification Search
CPC .............. H03M 13/19; H03M 13/098; H03M 13/1575; H03M 13/09; G06F 7/5443;
(Continued)

(56) References Cited

U.S. PATENT DOCUMENTS 7,716,269 B2 5/2010 Simon et al.
7,844,880 B2 11/2010 Vainsencher et al.
(Continued)

FOREIGN PATENT DOCUMENTS

CN 109146070 A 1/2019
CN 110088727 A 8/2019
(Continued)

*Primary Examiner* — Shelly A Chase
*Assistant Examiner* — Enam Ahmed
(74) *Attorney, Agent, or Firm* — WILLIAM PARK & ASSOCIATES LTD.

(57) ABSTRACT

A processing-in-memory (PIM) device includes an ECC logic circuit configured to generate first write data, first write parity, second write data, and second write parity from first write input data and second write input data when a write operation in an operation mode is performed, and generate first converted data and second converted data from first read data, first read parity, second read data, and second read parity when a read operation in the operation mode is performed; and a MAC operator configured to perform a MAC arithmetic operation for the first converted data and the second converted data to generate MAC operation result data.

24 Claims, 54 Drawing Sheets

Related U.S. Application Data application No. 17/002,341, filed on Aug. 25, 2020, now Pat. No. 11,720,441.

(60) Provisional application No. 63/041,358, filed on Jun. 19, 2020.

(51) Int. Cl.
  *G06F 17/16* (2006.01)
  *G06N 3/063* (2023.01)
  *H03M 13/09* (2006.01)
  *H03M 13/15* (2006.01)
  *H03M 13/19* (2006.01)

(52) U.S. Cl.
  CPC ..... *H03M 13/098* (2013.01); *H03M 13/1575* (2013.01); *H03M 13/19* (2013.01)

(58) Field of Classification Search
  CPC . G06F 17/16; G06F 2207/4824; G06N 3/063; G11C 29/42; G11C 2029/0411
  USPC ........................................................ 714/764
  See application file for complete search history.

(56) References Cited

U.S. PATENT DOCUMENTS

| | | | |
|---|---|---|---|
| 7,966,513 B2 | 6/2011 | Desai et al. | |
| 8,209,403 B2 | 6/2012 | Szabo et al. | |
| 8,667,265 B1* | 3/2014 | Hamlet | H04L 9/3278 713/185 |
| 8,706,701 B1 | 4/2014 | Stefanov et al. | |
| 8,707,107 B1 | 4/2014 | Panna et al. | |
| 8,793,440 B2 | 7/2014 | Miller et al. | |
| 9,668,011 B2 | 5/2017 | D'Luna et al. | |
| 10,366,019 B1 | 7/2019 | Stark | |
| 10,725,841 B1 | 7/2020 | Rahul et al. | |
| 11,640,331 B2* | 5/2023 | Eckhardt | G06F 11/1048 714/764 |
| 11,704,063 B2 | 7/2023 | Foo | |
| 11,720,446 B2* | 8/2023 | Hornung | G06F 11/1048 714/764 |
| 11,755,409 B2* | 9/2023 | Boehm | G06F 11/3037 714/764 |
| 11,762,732 B2* | 9/2023 | Noguchi | G06F 11/1012 714/764 |
| 2008/0016430 A1 | 1/2008 | Yoshida | |
| 2014/0025866 A1 | 1/2014 | Kim et al. | |
| 2014/0108887 A1 | 4/2014 | Hida et al. | |
| 2014/0149827 A1 | 5/2014 | Kim et al. | |
| 2014/0164875 A1 | 6/2014 | Kim et al. | |
| 2015/0082122 A1 | 3/2015 | Udipi et al. | |
| 2015/0199234 A1 | 7/2015 | Choi et al. | |
| 2015/0261605 A1 | 9/2015 | Yamauchi et al. | |
| 2016/0203045 A1 | 7/2016 | Suzuki et al. | |
| 2016/0203046 A1 | 7/2016 | Hanafusa | |
| 2017/0060676 A1 | 3/2017 | Kodera et al. | |
| 2018/0075902 A1 | 3/2018 | Shirakawa et al. | |
| 2019/0044542 A1 | 2/2019 | Hogaboam et al. | |
| 2019/0220349 A1 | 7/2019 | Deutsch et al. | |
| 2019/0272121 A1 | 9/2019 | Khan et al. | |
| 2021/0036719 A1 | 2/2021 | Kim et al. | |
| 2023/0231573 A1* | 7/2023 | Sforzin | G06F 11/1048 714/764 |
| 2023/0251929 A1 | 8/2023 | Radi et al. | |

FOREIGN PATENT DOCUMENTS

| | | |
|---|---|---|
| JP | 6212396 B2 | 10/2017 |
| JP | 2019109887 A | 7/2019 |
| TW | 201823973 A | 7/2018 |
| TW | 201928701 A | 7/2019 |

* cited by examiner

PROCESSING-IN-MEMORY (PIM) DEVICES

CROSS-REFERENCE TO RELATED APPLICATIONS

The present application is a continuation application of U.S. patent application Ser. No. 17/347,262, filed on Jun. 14, 2021, which is a continuation-in-part of U.S. patent application Ser. No. 17/002,341, filed on Aug. 25, 2020, which claims priority under 35 U.S.C 119(a) to Korean Application No. 10-2019-0117098, filed on Sep. 23, 2019. Also, U.S. patent application Ser. No. 17/347,262 claims the priority of U.S. Provisional Application Ser. No. 63/041,358, filed on Jun. 19, 2020. The disclosures of all of the above applications are incorporated herein by reference in their entirety.

BACKGROUND

1. Technical Field

Various embodiments of the disclosed technology relate to processing-in-memory (PIM) devices and methods of performing a multiplication/accumulation arithmetic operation in the PIM devices.

2. Related Art

Recently, interest in artificial intelligence (AI) has been increasing not only in the information technology industry but also in the financial and medical industries. Accordingly, in various fields, the artificial intelligence, more precisely, the introduction of deep learning is considered and prototyped. In general, techniques for effectively learning deep neural networks (DNNs) or deep networks having the increased layers as compared with general neural networks to utilize the deep neural networks (DNNs) or the deep networks in pattern recognition or inference are commonly referred to as the deep learning.

One of backgrounds or causes of this widespread interest may be due to the improved performance of a processor performing arithmetic operations. To improve the performance of the artificial intelligence, it may be necessary to increase the number of layers constituting a neural network in the artificial intelligence to educate the artificial intelligence. This trend has continued in recent years, which has led to an exponential increase in the amount of computation required for the hardware that actually does the computation. Moreover, if the artificial intelligence employs a general hardware system including a memory and a processor which are separated from each other, the performance of the artificial intelligence may be degraded due to limitation of the amount of data communication between the memory and the processor. In order to solve this problem, a PIM device in which a processor and a memory are integrated in one semiconductor chip has been used as a neural network computing device. Because the PIM device directly performs arithmetic operations in the PIM device, a data processing speed in the neural network may be improved.

SUMMARY

According to an embodiment of the present disclosure, there may be provided a processing-in-memory (PIM) device including an error correction code (ECC) logic circuit configured to generate first write data, first write parity, second write data, and second write parity from first write input data and second write input data when a write operation in an operation mode is performed, and generate first converted data and second converted data from first read data, first read parity, second read data, and second read parity when a read operation in the operation mode is performed; and a multiplication and accumulation (MAC) operator configured to perform a MAC arithmetic operation for the first converted data and the second converted data to generate MAC operation result data.

According to another embodiment, there may be provided a processing-in-memory (PIM) device including a storage region configured to receive and store first write data, first write parity, second write data, and second write parity when a write operation in an operation mode is performed, and output first read data, first read parity, second read data, and second read parity when a read operation in the operation mode is performed; and an error correction code (ECC) logic circuit configured to generate the first write data, the first write parity, the second write data, and the second write parity from first write input data and second write input data when the write operation in the operation mode is performed, and generate first converted data and second converted data from the first read data, the first read parity, the second read data, and the second read parity when the read operation in the operation mode is performed.

BRIEF DESCRIPTION OF THE DRAWINGS

Certain features of the disclosed technology are illustrated by various embodiments with reference to the attached drawings, in which.

DETAILED DESCRIPTION

In the following description of the embodiments, it will be understood that the terms "first" and "second" are intended to identify an element, but not used to define only the element itself or to mean a particular sequence. In addition, when an element is referred to as being located "on", "over", "above", "under" or "beneath" another element, it is intended to mean relative position relationship, but not used to limit certain cases that the element directly contacts the other element, or at least one intervening element is present therebetween. Accordingly, the terms such as "on", "over", "above", "under", "beneath", "below" and the like that are used herein are for the purpose of describing particular embodiments only and are not intended to limit the scope of the present disclosure. Further, when an element is referred to as being "connected" or "coupled" to another element, the element may be electrically or mechanically connected or coupled to the other element directly, or may form a connection relationship or coupling relationship by replacing the other element therebetween. As used herein, the character '/' means any and all combinations of the terms recited before and after the character '/.'

Figure 1:
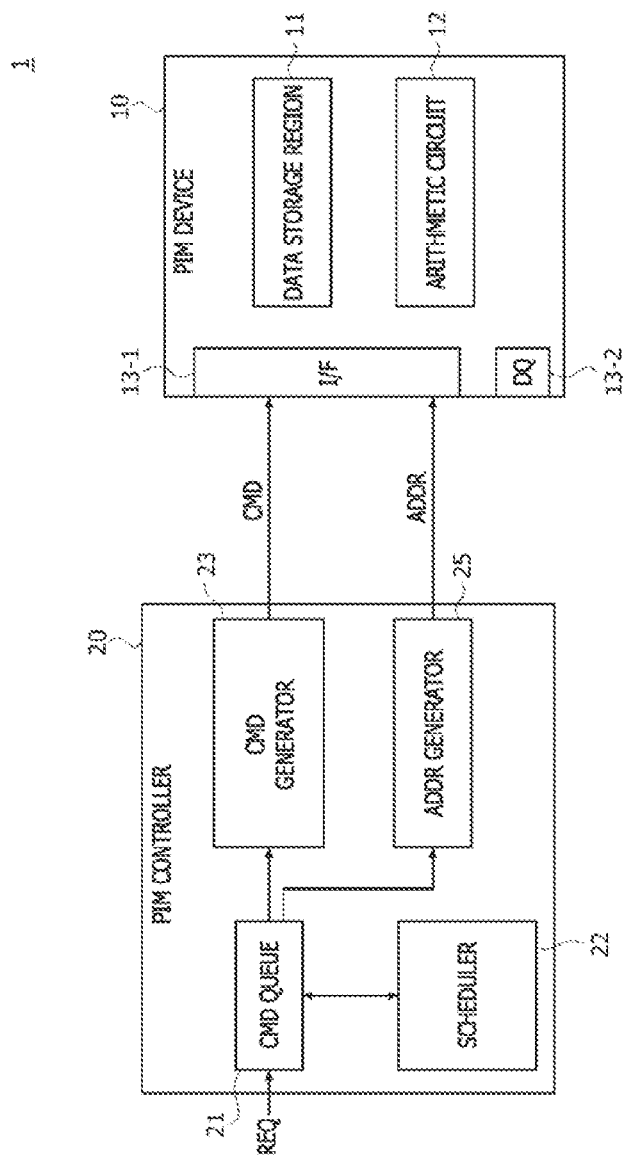
FIG. 1 is a block diagram illustrating a PIM system according to the present disclosure.

FIG. 1 is a block diagram illustrating a PIM system according to the present disclosure. As illustrated in FIG. 1, the PIM system 1 may include a PIM device 10 and a PIM controller 20. The PIM device 10 may include a data storage region 11, arithmetic circuit 12, an interface (I/F) 13-1, and a data input/output (I/O) pad 13-2. The data storage region 1 may include a first storage region and a second storage region. In an embodiment, the first storage region and the second storage region may be memory bank, respectively. In another embodiment, the first data storage region and the second storage region may be memory bank and buffer memory, respectively. The data storage region may include a volatile memory element or a non-volatile memory element. The data storage region may include both the volatile memory element and the non-volatile memory element.

The arithmetic circuit 12 may perform an arithmetic operation of the data transferred from the data storage region 11. In an embodiment, the arithmetic circuit 12 may include a multiplying-and-accumulating (MAC) operator. The MAC operator may perform a multiplying calculation of the data transferred from the data storage region 11 and perform an accumulating calculation of the multiplication result data. After MAC operating, the MAC operator may output a MAC result data. The MAC result data may store the data storage region 11 or output from the PIM device 10 through the data I/O pad 13-2.

The interface 13-1 of the PIM device 10 may receive a command CMD and address ADDR from the PIM controller 20. The interface 13-1 may output the command CMD to the data storage region 11 or the arithmetic circuit 12 in the PIM device 10. The interface 13-1 may output the address ADDR to the data storage region 11 in the PIM device 10. The data I/O pad 13-2 of the PIM device 10 may function as a data communication terminal between an external device of the PIM device 10, for example the PIM controller 20 and the data storage region 11 included in the PIM device 10. The external device of the PIM device 10 may correspond to the PIM controller 20 of the PIM system 1 or a host located outside the PIM system 1. Accordingly, data output from the host or the PIM controller 20 may be input into the PIM device 10 through the data I/O pad 13-2.

The PIM controller 20 may control operations of the PIM device 10. In an embodiment, the PIM controller 20 may control the PIM device 10 such that the PIM device 10 operates in a memory mode or a MAC mode. In the event that the PIM controller 20 controls the PIM device 10 such that the PIM device 10 operates in the memory mode, the PIM device 10 may perform a data read operation or a data write operation for the data storage region 11. In the event that the PIM controller 20 controls the PIM device 10 such that the PIM device 10 operates in the MAC mode, the PIM device 10 may perform a MAC operation for the arithmetic circuit 12. In the event that the PIM controller 20 controls the PIM device 10 such that the PIM device 10 operates in the MAC mode, the PIM device 10 may also perform the data read operation and the data write operation for the data storage region 11 to execute the MAC operation.

The PIM controller 20 may be configured to include a command queue logic 21, a scheduler 22, a command generator 23, and an address generator 25. The command queue logic 21 may receive a request REQ from an external device (e.g., a host of the PIM system 1) and store the command queue corresponding to the request REQ in the command queue logic 21. The command queue logic 21 may transmit information on a storage status of the command queue to the scheduler 22 whenever the command queue logic 21 stores the command queue. The commands queues stored in the command queue logic 21 may be transmitted to the command generator 23 according to a sequence determined by the scheduler 22.

The scheduler 22 may adjust a sequence of the command queue when the command queue stored in the command queue logic 21 is output from the command queue logic 21. In order to adjust the output sequence of the command queue stored in the command queue logic 21, the scheduler 22 may analyze the information on the storage status of the command queue provided by the command queue logic 21 and may readjust a process sequence of the command queue such that the command queue is processed according to a proper sequence.

The command generator 23 may receive the command queue related to the memory mode of the PIM device 10 the MAC mode of the PIM device 10 from the command queue logic 21. The command generator 23 may decode the command queue to generate and output the command CMD. The command CMD may include a memory command for the memory mode or a MAC command for the MAC mode. The command CMD output from the command generator 23 may be transmitted to the PIM device 10.

The address generator 25 may receive address information from the command queue logic 21 and generate the address ADDR for accessing to a region in the data storage region 11. In an embodiment, the address ADDR may include a bank address, a row address, and a column address. The address ADDR output from the address generator 25 may be input to the data storage region 11 through the interface (I/F) 13-1.

Figure 2:
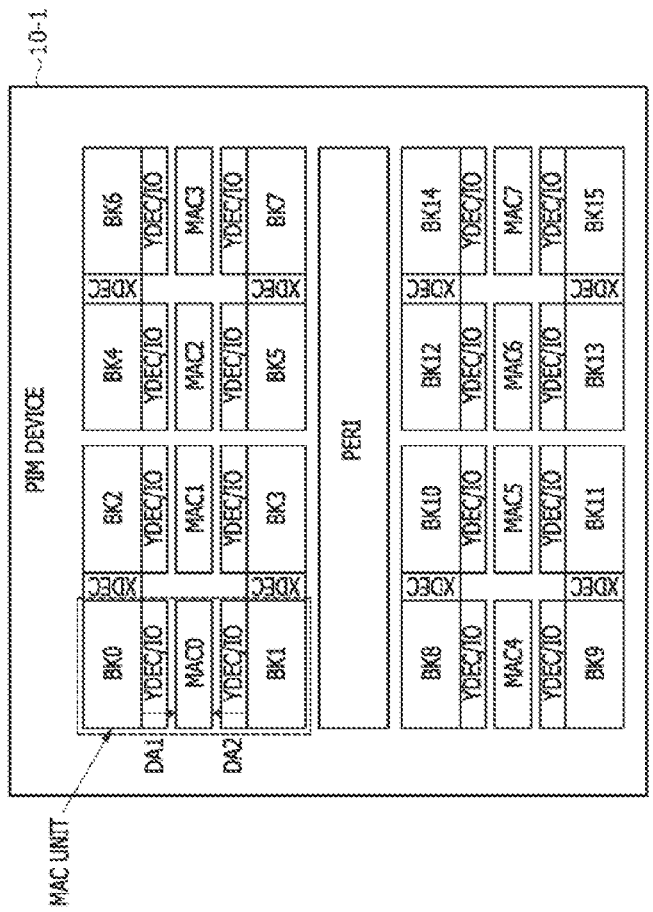
FIG. 2 is a schematic diagram illustrating an example of a disposal structure between memory banks and multiplication/accumulation (MAC) operators included in a PIM device according to the present disclosure.

FIG. 2 illustrates an example of a disposal structure of memory banks BK0, . . . , and BK15 and MAC operators MAC0, . . . , and MAC7 included in a PIM device 10-1 according to the present disclosure. Referring to FIG. 2, the PIM device 10-1 may include storage regions and processing devices. In an embodiment, the storage regions may be the memory banks BK0, . . . , and BK15. Although the present embodiment illustrates an example in which the storage regions are the memory banks BK0, . . . , and BK15, the memory banks BK0, . . . , and BK15 are merely examples which are suitable for the storage regions. In some embodiments, the memory banks BK0, . . . , and BK15 may be a memory region corresponding to a volatile memory device, for example, a DRAM device. In an embodiment, each of the memory banks BK0, . . . , and BK15 may be a component unit which is independently activated and may be configured to have the same data bus width as external input/output lines, for example, data input/output (I/O) lines. In an embodiment, the memory banks BK0, . . . , and BK15 may operate in an interleaving way that an active operation of any one of the memory banks is performed in parallel while another memory bank is selected. Although the present embodiment illustrates an example in which the PIM device 10 includes the memory banks BK0, . . . , and BK15, the number of the memory banks is not limited to be '16' but may be set to be different according to the embodiments. Each of the memory banks BK0, . . . , and BK15 may include a memory cell array which is comprised of memory unit cells that are respectively located at cross points of a plurality of rows and a plurality of columns. The memory banks BK0, . . . , and BK15 may include first memory banks, for example, odd-numbered memory banks BK0, BK2, . . . , and BK14 and second memory banks, for example, even-numbered memory banks BK1, BK3, . . . , and BK15.

A core circuit may be disposed to be adjacent to the memory banks BK0, . . . , and BK15. The core circuit may include X-decoders XDECs and Y-decoders/IO circuits YDEC/IOs. The X-decoder XDEC may also be referred to as a word line decoder or a row decoder. In an embodiment, two odd-numbered memory banks arrayed to be adjacent to each other in one row among the odd-numbered memory banks BK0, BK2, . . . , and BK14 may share one of the X-decoders XDECs with each other. For example, the first memory bank BK0 and the third memory bank BK2 adjacent to each other in a first row may share one of the X-decoders XDECs, and the fifth memory bank BK4 and the seventh memory bank BK6 adjacent to each other in the first row may also share one of the X-decoders XDECs. Similarly, two even-numbered memory banks arrayed to be adjacent to each other in one row among the even-numbered memory banks BK1, BK3, . . . , and BK15 may share one of the X-decoders XDECs with each other. For example, the second memory bank BK1 and the fourth memory bank BK3 adjacent to each other in a second row may share one of the X-decoders XDECs, and the sixth memory bank BK5 and the eighth memory bank BK7 adjacent to each other in the second row may also share one of the X-decoders XDECs. Each of the X-decoders XDECs may receive a row address from an address latch included in a peripheral circuit PERI and may decode the row address to select and enable one of rows (i.e., word lines) coupled to the memory banks adjacent to the X-decoder XDEC.

The Y-decoders/IO circuits YDEC/IOs may be disposed to be allocated to the memory banks BK0, . . . , and BK15, respectively. For example, the first memory bank BK0 may be allocated to one of the Y-decoders/IO circuits YDEC/IOs, and the second memory bank BK1 may be allocated to another one of the Y-decoders/IO circuits YDEC/IOs. Each of the Y-decoders/IO circuits YDEC/IOs may include a Y-decoder YDEC and an I/O circuit IO. The Y-decoder YDEC may also be referred to as a bit line decoder or a column decoder. Each of the Y-decoders YDECs may receive a column address from an address latch included in the peripheral circuit PERI and may decode the column address to select and enable at least one of columns (i.e., bit lines) coupled to the selected memory bank. Each of the I/O circuits may include an I/O sense amplifier for sensing and amplifying a level of a read datum output from the corresponding memory bank during a read operation and a write driver for driving a write datum during a write operation for the corresponding memory bank.

In an embodiment, the processing devices may include MAC operators MAC0, . . . , and MAC7. Although the present embodiment illustrates an example in which the MAC operators MAC0, . . . , and MAC7 are employed as the processing devices, the present embodiment may be merely an example of the present disclosure. For example, in some other embodiments, processors other than the MAC operators MAC0, . . . , and MAC7 may be employed as the processing devices. The MAC operators MAC0, . . . , and MAC7 may be disposed such that one of the odd-numbered memory banks BK0, BK2, . . . , and BK14 and one of the even-numbered memory banks BK1, BK3, . . . , and BK15 share any one of the MAC operators MAC0, . . . , and MAC7 with each other. Specifically, one odd-numbered memory bank and one even-numbered memory bank arrayed in one column to be adjacent to each other may constitute a pair of memory banks sharing one of the MAC operators MAC0, . . . , and MAC7 with each other. One of the MAC operators MAC0, . . . , and MAC7 and a pair of memory banks sharing the one MAC operator with each other will be referred to as 'a MAC unit' hereinafter.

In an embodiment, the number of the MAC operators MAC0, . . . , and MAC7 may be equal to the number of the odd-numbered memory banks BK0, BK2, . . . , and BK14 or the number of the even-numbered memory banks BK1, BK3, . . . , and BK15. The first memory bank BK0, the second memory bank BK1, and the first MAC operator MAC0 between the first memory bank BK0 and the second memory bank BK1 may constitute a first MAC unit. Similarly, the third memory bank BK2, the fourth memory bank BK3, and the second MAC operator MAC1 between the third memory bank BK2 and the fourth memory bank BK3 may constitute a second MAC unit. The first MAC operator MAC0 included in the first MAC unit may receive first data DA1 output from the first memory bank BK0 included in the first MAC unit and second data DA2 output from the second memory bank BK1 included in the first MAC unit. In addition, the first MAC operator MAC0 may perform a MAC operation of the first data DA1 and the second data DA2. In the event that the PIM device 10-1 performs neural network calculation, for example, an arithmetic operation in a deep learning process, one of the first data DA1 and the second data DA2 may be weight data and the other may be vector data. A configuration of any one of the MAC operators MAC0~MAC7 will be described in more detail hereinafter.

In the PIM device 10-1, the peripheral circuit PERI may be disposed in a region other than an area in which the memory banks BK0, BK1, . . . , and BK15, the MAC operators MAC0, . . . , and MAC7, and the core circuit are disposed. The peripheral circuit PERI may include a control circuit and a transmission path for a command/address signal, a control circuit and a transmission path for input/output of data, and a power supply circuit. The control circuit for the command/address signal may include a command decoder for decoding a command included in the command/address signal to generate an internal command signal, an address latch for converting an input address into a row address and a column address, a control circuit for controlling various functions of row/column operations, and a control circuit for controlling a delay locked loop (DLL) circuit. The control circuit for the input/output of data in the peripheral circuit PERI may include a control circuit for controlling a read/write operation, a read/write buffer, and an output driver. The power supply circuit in the peripheral circuit PERI may include a reference power voltage generation circuit for generating an internal reference power voltage and an internal power voltage generation circuit for generating an internal power voltage from an external power voltage.

The PIM device 10-1 according to the present embodiment may operate in any one mode of a memory mode and a MAC mode. In the memory mode, the PIM device 10-1 may operate to perform the same operations as general memory devices. The memory mode may include a memory read operation mode and a memory write operation mode. In the memory read operation mode, the PIM device 10-1 may perform a read operation for reading out data from the memory banks BK0, BK1, . . . , and BK15 to output the read data, in response to an external request. In the memory write operation mode, the PIM device 10-1 may perform a write operation for storing data provided by an external device into the memory banks BK0, BK1, . . . , and BK15, in response to an external request.

In the MAC mode, the PIM device 10-1 may perform the MAC operation using the MAC operators MAC0, ..., and MAC7. Specifically, the PIM device 10-1 may perform the read operation of the first data DA1 for each of the odd-numbered memory banks BK0, BK2, ..., and BK14 and the read operation of the second data DA2 for each of the even-numbered memory banks BK1, BK3, ..., and BK15, for the MAC operation in the MAC mode. In addition, each of the MAC operators MAC0, ..., and MAC7 may perform the MAC operation of the first data DA1 and the second data DA2 which are read out of the memory banks to store a result of the MAC operation into the memory bank or to output the result of the MAC operation. In some cases, the PIM device 10-1 may perform a data write operation for storing data to be used for the MAC operation into the memory banks before the data read operation for the MAC operation is performed in the MAC mode.

The operation mode of the PIM device 10-1 according to the present embodiment may be determined by a command which is transmitted from a host or a controller to the PIM device 10-1. In an embodiment, if a first external command requesting a read operation or a write operation for the memory banks BK0, BK1, ..., and BK15 is input to the PIM device 10-1, the PIM device 10-1 may perform the data read operation or the data write operation in the memory mode. Meanwhile, if a second external command requesting a MAC operation from external host or controller is input to the PIM device 10-1, the PIM device 10-1 may perform the data read operation and the MAC operation.

Figure 3:
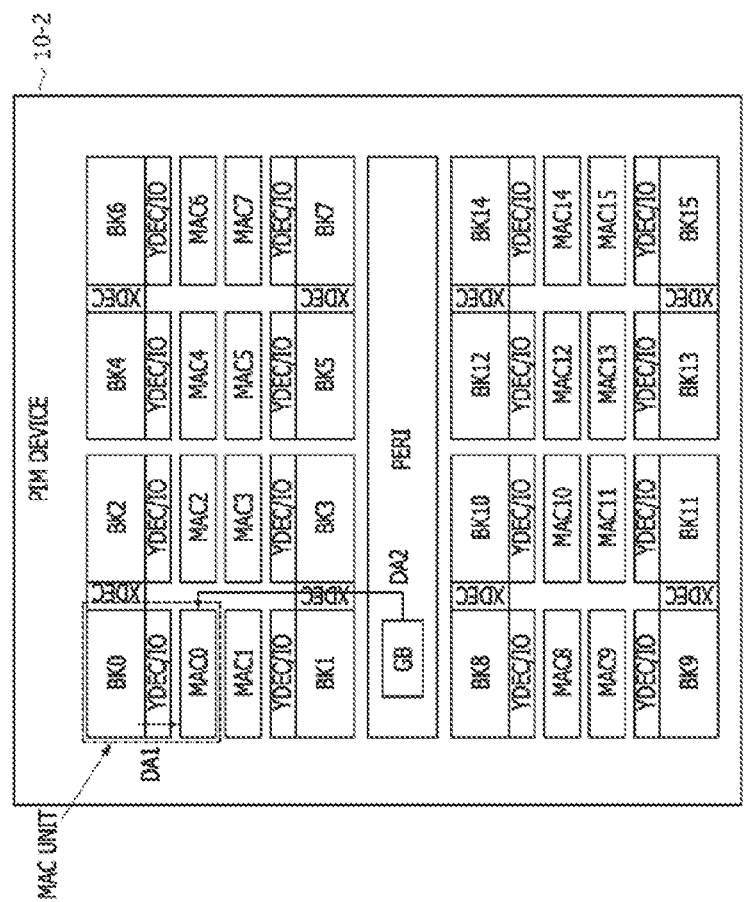
FIG. 3 is a schematic diagram illustrating an other example of a disposal structure between memory banks and MAC operators included in a PIM device according to the present disclosure.

FIG. 3 illustrates an other example of a disposal structure of memory banks and MAC operators included in a PIM device 10-2 according to the present disclosure. Referring to FIG. 3, the PIM device 10-2 may include first storage regions such as a plurality of memory banks (e.g., first to sixteenth memory banks BK0, ..., and BK15), processing devices such as a plurality of MAC operators (e.g., first to sixteenth MAC operators MAC0, ..., and MAC15), and a second storage region such as a global buffer GB. A core circuit may be disposed to be adjacent to the memory banks BK0, ..., and BK15. The core circuit may include X-decoders XDECs and Y-decoders/IO circuits YDEC/IOs. The memory banks BK0, ..., and BK15 and the core circuit may have the same configuration as described with reference to FIG. 2. Thus, descriptions of the memory banks BK0, ..., and BK15 and the core circuit will be omitted hereinafter. Each of the MAC operators MAC0, ..., and MAC15 may be disposed to be allocated to each of the memory banks BK0, ..., and BK15, respectively. That is, in the PIM device 20, two or more memory banks do not share one MAC operator with each other. Thus, the number of the MAC operators MAC0, ..., and MAC15 included in the PIM device 20 may be equal to the number of the memory banks BK0, ..., and BK15 included in the PIM device 10-2. One of the memory banks BK0, ..., and BK15 and one of the MAC operators MAC0, ..., and MAC15 may constitute one MAC unit. For example, the first memory bank BK0 and the first MAC operator MAC0 may constitute a first MAC unit, and the second memory bank BK1 and the second MAC operator MAC1 may constitute a second MAC unit. Similarly, the sixteenth memory bank BK15 and the sixteenth MAC operator MAC15 may constitute a sixteenth MAC unit. In each of the first to sixteenth MAC units, the MAC operator may receive first data DA1 to be used for the MAC operation from the memory bank.

The peripheral circuit PERI may be disposed in a region other than an area in which the memory banks BK0, BK1, ..., and BK15, the MAC operators MAC0, ..., and MAC15, and the core circuit are disposed, and the peripheral circuit PERI may be configured to include a control circuit relating to a command/address signal, a control circuit relating to input/output of data, and a power supply circuit. The peripheral circuit PERI of the PIM device 10-2 may have substantially the same configuration as the peripheral circuit PERI of the PIM device 10-1 illustrated in FIG. 2. The difference between the peripheral circuit PERI of the PIM device 10-2 and the peripheral circuit PERI of the PIM device 10-1 is that the global buffer GB is disposed in the peripheral circuit PERI of the PIM device 10-2. The global buffer GB may receive second data DA2 to be used for the MAC operation from an external device and may store the second data DA2 therein. The global buffer GB may output the second data DA2 to each of the MAC operators MAC0, ..., and MAC15 through a GIO line. In the event that the PIM device 10-2 performs neural network calculation, for example, an arithmetic operation in a deep learning process, the first data DA1 may be weight data and the second data DA2 may be vector data.

The PIM device 10-2 according to the present embodiment may operate in any one mode of a memory mode and a MAC mode. In the memory mode, the PIM device 10-2 may operate to perform the same operations as general memory devices. The memory mode may include a memory read operation mode and a memory write operation mode. In the memory read operation mode, the PIM device 10-2 may perform a read operation for reading out data from the memory banks BK0, BK1, ..., and BK15 to output the read data, in response to an external request. In the memory write operation mode, the PIM device 10-2 may perform a write operation for storing data provided by an external device into the memory banks BK0, BK1, ..., and BK15, in response to an external request. In the MAC mode, the PIM device 10-2 may perform the MAC operation using the MAC operators MAC0, ..., and MAC15. The PIM device 10-2 may perform the read operation of the first data DA1 for each of the memory banks BK0, ..., and BK154 and the read operation of the second data DA2 for the global buffer GB, for the MAC operation in the MAC mode. In addition, each of the MAC operators MAC0, ..., and MAC15 may perform the MAC operation of the first data DA1 and the second data DA2 to store a result of the MAC operation into the memory bank or to output the result of the MAC operation to an external device. In some cases, the PIM device 20 may perform a data write operation for storing data to be used for the MAC operation into the memory banks before the data read operation for the MAC operation is performed in the MAC mode.

The operation mode of the PIM device 10-2 according to the present embodiment may be determined by a command which is transmitted from an external controller to the PIM device 10-2. In an embodiment, if a first external command requesting a read operation or a write operation for the memory banks BK0, BK1, ..., and BK15 is transmitted from the host or the controller to the PIM device 10-2, the PIM device 10-2 may perform the data read operation or the data write operation in the memory mode. Alternatively, if a second external command requesting the MAC operation is transmitted from the host or the controller to the PIM device 10-2, the PIM device 10-2 may perform the read operation, write operation and the MAC operation.

Figure 4:
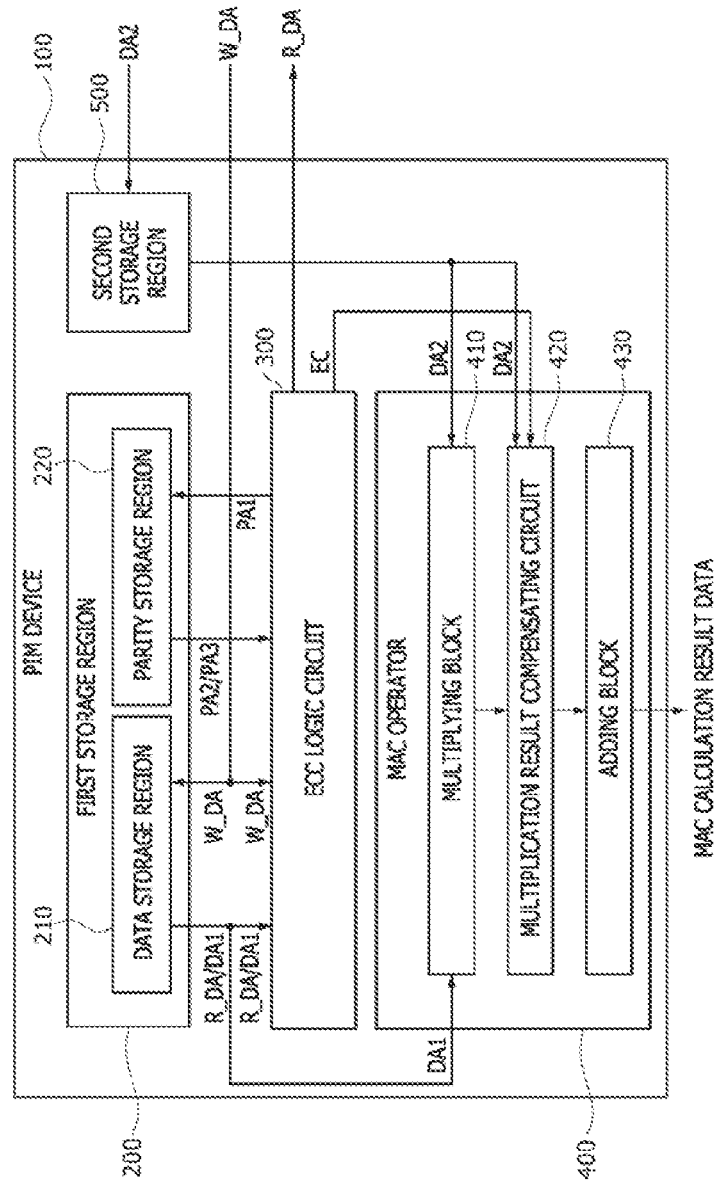
FIG. 4 is a block diagram illustrating a configuration of a PIM device according to an embodiment of the present disclosure.

FIG. 4 is a block diagram illustrating a configuration of a PIM device 100 according to an embodiment of the present disclosure. Referring to FIG. 4, the PIM device 100 may be configured to include a first storage region 200, an error correction code (ECC) logic circuit 300, a multiplication/ accumulation (MAC) operator 400, and a second storage region 500. In an embodiment, the PIM device 100 may be applied to a neural network circuit. In such a case, vector data necessary to neural network calculation may be stored in the first storage region 200, and weight data may be temporarily stored in the second storage region 500. In an embodiment, while the first storage region 200 may be a memory region (e.g., a bank) of the PIM device 100, the second storage region 500 may be a buffer memory which is distinguished from the memory region (e.g., a bank) of the PIM device 100. In other embodiment, the first storage region 200 may be a bank of the PIM device 100, and the second storage region 500 may be an other bank of the PIM device 100. The first storage region 200 may have a data storage region 210 and a parity storage region 220. The data storage region 210 and the parity storage region 220 may be regions which are physically distinguished from each other. Alternatively, the data storage region 210 and the parity storage region 220 may be regions which are only logically distinguished from each other. Data may be stored in the data storage region 210, and parities for correcting errors of the data may be stored in the parity storage region 220. In an embodiment, the first storage region 200 may be realized using a volatile memory device such as a DRAM device. In another embodiment, the first storage region 200 may be realized using a nonvolatile memory device. In yet another embodiment, the first storage region 200 may be realized to include both of a volatile memory device and a nonvolatile memory device.

The ECC logic circuit 300 may perform an ECC operation for error correction during access to the first storage region 200. In an embodiment the ECC operation may include an ECC encoding operation and an ECC decoding operation. The ECC encoding operation may be performed while write data W_DA are written into the first storage region 200. In an embodiment, the ECC encoding operation may include an operation generating a parity PA1 for the write data W_DA. The write data W_DA may be stored into the data storage region 210 of the first storage region 200. The parity PA1 generated by the ECC encoding operation may be stored into the parity storage region 220 of the first storage region 200. The ECC decoding operation may be performed while read data R_DA are output from the first storage region 200. In an embodiment, the ECC decoding operation may include an operation for generating a syndrome using a parity PA2 of the read data R_DA, an operation for finding out an error location of the read data R_DA using the syndrome, and an operation for correcting an error located at the error location.

The ECC logic circuit 300 may output different data in a memory mode and in an MAC mode. The "memory mode" may be defined as a mode in which the PIM device 100 performs an operation for accessing to the first storage region 200 regardless of calculating operations. The "MAC mode" may be defined as a mode in which the PIM device 100 performs an operation for accessing to the first storage region 200 and an operation for calculating the accessed data. An operation of the ECC logic circuit 300 for writing the write data W_DA into the first storage region 200 in the memory mode may be the same as an operation of the ECC logic circuit 300 for writing the write data W_DA into the first storage region 200 in the MAC mode. During a read operation for reading out the read data R_DA stored in the first storage region 200 in the memory mode, the ECC logic circuit 300 may output corrected data of the read data R_DA to an external device (not shown). In contrast, during a read operation for reading out first data DA1 stored in the first storage region 200 in the MAC mode, the ECC logic circuit 300 does not output corrected data generated by correcting the first data DA1 using a parity PA3 which is provided by the parity storage region 220. Instead the ECC logic circuit 300 may generate an error code EC indicating an error location using the parity PA3 and may output the error code EC to the MAC operator 400. That is, during the read operation in the MAC mode, no corrected data of the first data DA1 may be output from the ECC logic circuit 300.

The MAC operator 400 may perform a MAC calculation in the MAC mode of the PIM device 100. The MAC operator 400 does not perform any MAC calculation in the memory mode of the PIM device 100. In an embodiment, the MAC operator 400 may include a multiplying block 410, a multiplication result compensating circuit 420, and an adding block 430. The multiplying block 410 may receive the first data DA1 stored in the data storage region 210 of the first storage region 200 and second data DA2 stored in the second storage region 500. The second data DA2 may be provided by an external device (not shown) and may be input to the MAC operator 400 through the second storage region 500 without passing through the ECC logic circuit 300. The multiplying block 410 may execute a multiplying calculation of the first data DA1 and the second data DA2 to output multiplication result data (M_DA_1<0:255> of FIG. 13).

The multiplication result compensating circuit 420 may receive the multiplication result data (M_DA_1<0:255> of FIG. 13) output from the multiplying block 410 and the error code EC output from the ECC logic circuit 300. The multiplication result compensating circuit 420 may output the multiplication result data (M_DA_1<0:255> of FIG. 13) generated by the multiplying block 410 without any compensation or compensated data of the multiplication result data (C_M_DA_1<0:255> of FIG. 13) after compensating the multiplication result data (M_DA_1<0:255> of FIG. 13) according to the error code EC. Specifically, if no error exists in the error code EC output from the ECC logic circuit 300, the multiplication result compensating circuit 420 may output the multiplication result data (M_DA_1<0:255> of FIG. 13) generated by the multiplying block 410 without any compensation. In contrast, if an error exists in the error code EC output from the ECC logic circuit 300, the multiplication result compensating circuit 420 may perform a compensating calculation for the multiplication result data (M_DA_1<0:255> of FIG. 13) generated by the multiplying block 410 to output the compensated multiplication result data (C_M_DA_1<0:255> of FIG. 13). The adding block 430 may execute an adding calculation of the multiplication result data (M_DA_1<0:255> of FIG. 13) or the compensated multiplication result data (C_M_DA_1<0:255> of FIG. 13) output from the multiplication result compensating circuit 420 and may output the addition result data as MAC calculation result data corresponding to final output data.

Figure 5:
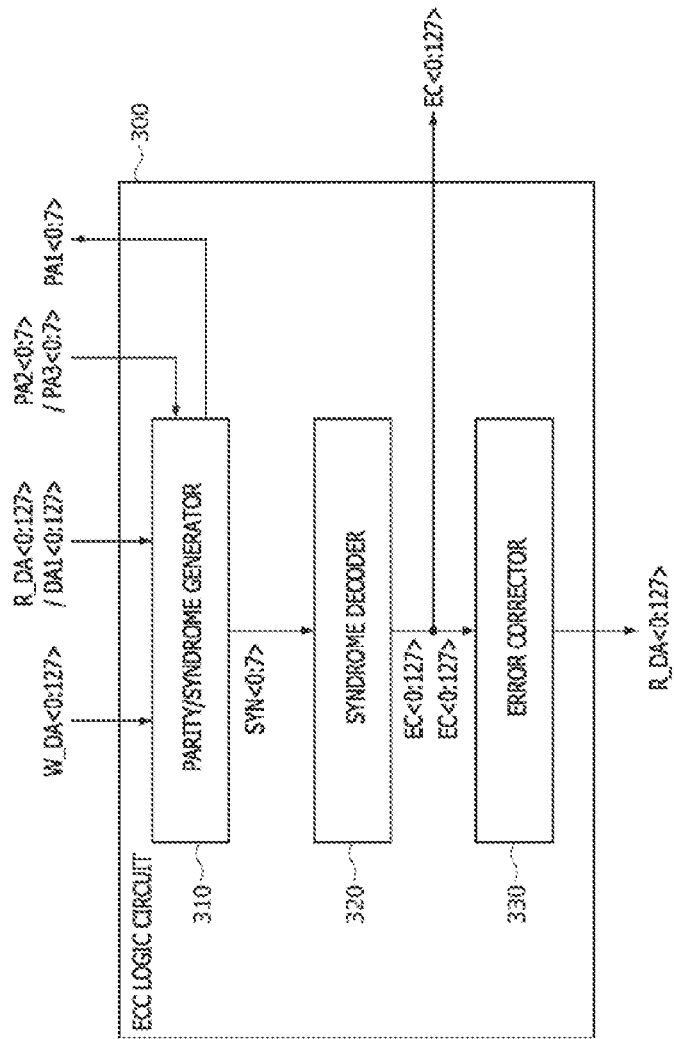
FIG. 5 is a block diagram illustrating a configuration of an error correction code (ECC) logic circuit included in a PIM device according to an embodiment of the present disclosure.

FIG. 5 is a block diagram illustrating a configuration of the ECC logic circuit 300 included in the PIM device 100. Referring to FIG. 5, the ECC logic circuit 300 may include a parity/syndrome generator 310, a syndrome decoder 320, and an error corrector 330. The parity/syndrome generator 310 may generate and output the parity PA1<0:7> for the write data W_DA<0:127> to perform a write operation of the first storage region 200. An embodiment will be described in conjunction with a case that the write data W_DA<0:127> are comprised of 128 bits and the parity PA1<0:7> is comprised of 8 bits. However, the present embodiment may be merely an example of various embodiments. Thus, the number of bits included in the write data W_DA may be set to be different according to the embodiments. Similarly, the number of bits included in the parity PA1 may also be set to be different according to the embodiments. As described with reference to FIG. 3, the parity PA1<0:7> may be stored into the parity storage region 220 of the first storage region 200. The parity/syndrome generator 310 may generate and output a syndrome SYN<0:7> of the read data R_DA<0:127> and the parity PA2<0:7> to perform the read operation of the first storage region 200 in the memory mode. Similarly, the parity/syndrome generator 310 may generate and output the syndrome SYN<0:7> of the first data DA1<0:127> and the parity PA3<0:7> to perform the read operation of the first storage region 200 in the MAC mode. The syndrome SYN<0:7> may be input to the syndrome decoder 320.

The syndrome decoder 320 may generate and output the error code EC<0:127> indicating an error location based on the syndrome SYN<0:7>. The error code EC<0:127> may be a binary stream having the same number of bits as the read data R_DA<0:127> or the first data DA1<0:127>. In order to generate the error code EC<0:127>, the syndrome decoder 320 may execute a calculation for finding an error location polynomial and a solution of the error location polynomial. In the memory mode, the error code EC<0:127> output from the syndrome decoder 320 may be input to the error corrector 330. In contrast, the error code EC<0:127> output from the syndrome decoder 320 may be input to the multiplication result compensating circuit 420 of the MAC operator 400 in the MAC mode, as described with reference to FIG. 3. The error corrector 330 may correct the read data to output the corrected read data R_DA<0:127> if an error exists in the error code EC<0:127> output from the syndrome decoder 320.

Figure 6:
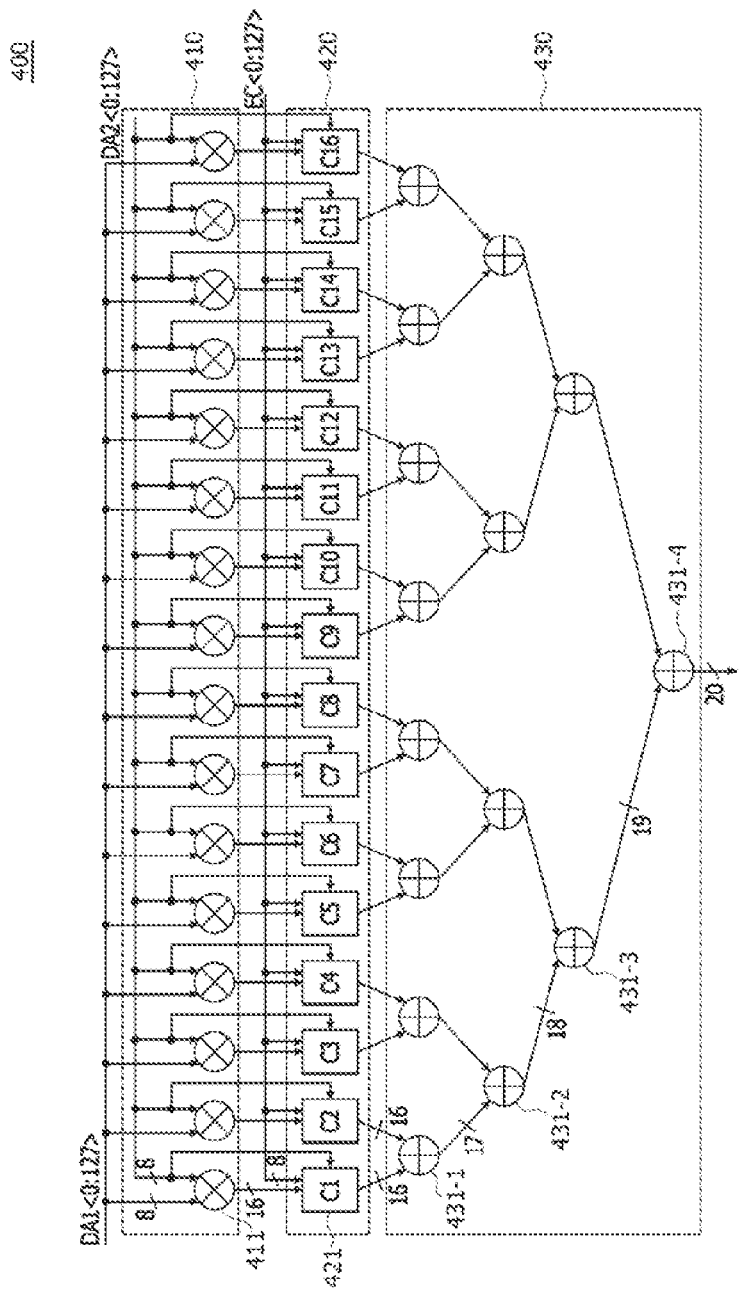
FIG. 6 illustrates a multiplication/accumulation (MAC) calculator included in a PIM device according to an embodiment of the present disclosure.

FIG. 6 illustrates the MAC operator 400 included in the PIM device 100. Referring to FIG. 6, the MAC operator 400 may include a plurality of multipliers 411 constituting the multiplying block 410, a plurality of multiplication result compensators (C1~C16) 421 constituting the multiplication result compensating circuit 420, and a plurality of adders 431-1, 431-2, 431-3 and 431-4 constituting the adding block 430. The number of the multipliers 411 may be equal to the number of the multiplication result compensators 421. The adders 431-1, 431-2, 431-3 and 431-4 may be disposed at respective ones of a plurality of stages to form a tree structure.

When the first data DA1<0:127> have 128 bits and the second data DA2<0:127> also have 128 bits, the number of the multipliers 411 may be 16 and the number of the multiplication result compensators 421 may also be 16. Each of the multipliers 411 may receive 8-bit data of the first data DA1<0:127> and 8-bit data of the second data DA2<0:127>. That is, the first data DA1<0:127> may be divided into 16 groups of data in units of 8 bits, and the 16 groups of data of the first data DA1<0:127> may be input to the 16 multipliers 411, respectively. Similarly, the second data DA2<0:127> may be divided into 16 groups of data in units of 8 bits, and the 16 groups of data of the second data DA2<0:127> may be input to the 16 multipliers 411, respectively. Each of the multipliers 411 may execute a multiplying calculation of 8-bit data of the first data DA1<0:127> and 8-bit data of the second data DA2<0:127> to generate and output 16-bit multiplication result data. Because the number of the multipliers 411 is 16, 256-bit multiplication result data may be generated by and output through all of the multipliers 411.

Each of the multiplication result compensators 421 may receive the 16-bit multiplication result data output from any one of the multipliers 411. That is, the first multiplication result compensator C1 may receive first 16-bit multiplication result data output from the first one of the multipliers 411. Similarly, the last multiplication result compensator (i.e., the sixteenth multiplication result compensator C16) may receive sixteenth 16-bit multiplication result data output from the last one (i.e., the sixteenth one) of the multipliers 411. Each of the multiplication result compensators 421 may also receive the 8-bit data of the second data DA2<0:127> like any one of the multipliers 411. That is, the 8-bit data of the second data DA2<0:127> input to the first one of the multipliers 411 may also be input to the first multiplication result compensator C1. Similarly, the 8-bit data of the second data DA2<0:127> input to the sixteenth one of the multipliers 411 may also be input to the sixteenth multiplication result compensator C16. In addition, the 128-bit error code EC<0:127> output from the syndrome decoder 320 of the ECC logic circuit 300 may be divided into 16 groups of data in units of 8 bits, and the 16 groups of data of the 128-bit error code EC<0:127> may be input to the multiplication result compensators 421 (i.e., the first to sixteenth multiplication result compensators C1~C16), respectively. Each of the multiplication result compensators 421 may output the 16-bit multiplication result data without any compensation or may execute a compensating calculation for the 16-bit multiplication result data to output the compensated 16-bit multiplication result data, according to the 8-bit error code EC input thereto.

Each of the eight adders 431-1 disposed at a first stage may receive two sets of the 16-bit data output from two of the multiplication result compensators 421 to execute an adding calculation of the two sets of the 16-bit data. Each of the eight adders 431-1 disposed at the first stage may generate and output 17-bit addition data including one-bit carry as a result of the adding calculation. Each of the four adders 431-2 disposed at a second stage may receive two sets of the 17-bit addition data output from two of the eight adders 431-1 to execute an adding calculation of the two sets of the 17-bit addition data. Each of the four adders 431-2 disposed at the second stage may generate and output 18-bit addition data including one-bit carry as a result of the adding calculation. Each of the two adders 431-3 disposed at a third stage may receive two sets of the 18-bit addition data output from two of the four adders 431-2 to execute an adding calculation of the two sets of the 18-bit addition data. Each of the two adders 431-3 disposed at the third stage may generate and output 19-bit addition data including one-bit carry as a result of the adding calculation. Finally, the adder 431-4 disposed at a last stage (i.e., a fourth stage) may receive two sets of the 19-bit addition data output from the two adders 431-3 to execute an adding calculation of the two sets of the 19-bit addition data. The adders 431-4 disposed at the fourth stage may generate and output 20-bit addition data including one-bit carry as a result of the adding calculation.

Figure 7:
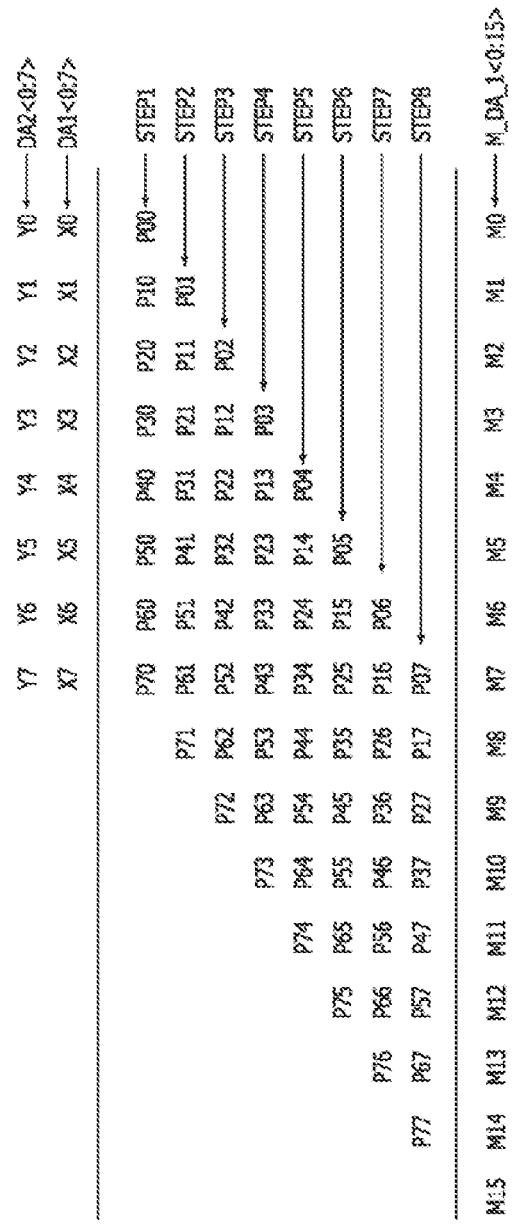
FIG. 7 illustrates a multiplying calculation executed by a multiplier included in a PIM device according to an embodiment of the present disclosure.

FIG. 7 illustrates a multiplying calculation executed by any one of the multiplier 411 included in the PIM device 100. The present embodiment will be described in conjunction with a case that the multiplier 411 receives binary data of "X7 X6 X5 X4 X3 X2 X1 X0" as the first data DA1<0:7> having eight bits and binary data of "Y7 Y6 Y5 Y4 Y3 Y2 Y1 Y0" as the second data DA2<0:7> having eight bits. As illustrated in FIG. 7, the multiplying calculation of the first data DA1<0:7> having eight bits and the second data DA2<0:7> having eight bits may include shifting calculations of first to eighth steps STEP1~STEP8 and a final adding calculation. Data "P70 P60 P50 P40 P30 P20 P10

P00" corresponding to result data of the first step STEP1 may be the same as the second data DA2<0:7> when the first bit "X0" corresponding to a least significant bit (LSB) of the first data DA1<0:7> has a value of "1", and all of bits included in the data "P70 P60 P50 P40 P30 P20 P10 P00" corresponding to the result data of the first step STEP1 may have a value of "0" when the first bit "X0" corresponding to the LSB of the first data DA1<0:7> has a value of "0". Data "P71 P61 P51 P41 P31 P21 P11 P01" corresponding to result data of the second step STEP2 may be located to be shifted by one bit from a position of the data "P70 P60 P50 P40 P30 P20 P10 P00" in a direction of a most significant bit (MSB) of the data "P70 P60 P50 P40 P30 P20 P10 P00". In such a case, the data "P71 P61 P51 P41 P31 P21 P11 P01" may be the same as the second data DA2<0:7> when the second bit "X1" of the first data DA1<0:7> has a value of "1", and all of bits included in the data "P71 P61 P51 P41 P31 P21 P11 P01" may have a value of "0" when the second bit "X1" of the first data DA1<0:7> has a value of "0".

Similarly, data "P72 P62 P52 P42 P32 P22 P12 P02" corresponding to result data of the third step STEP3 may be located to be shifted by two bits from a position of the data "P70 P60 P50 P40 P30 P20 P10 P00" in a direction of the MSB of the data "P70 P60 P50 P40 P30 P20 P10 P00". In such a case, the data "P72 P62 P52 P42 P32 P22 P12 P02" may be the same as the second data DA2<0:7> when the third bit "X2" of the first data DA1<0:7> has a value of "1", and all of bits included in the data "P72 P62 P52 P42 P32 P22 P12 P02" may have a value of "0" when the third bit "X2" of the first data DA1<0:7> has a value of "0". In the same way, data "P77 P67 P57 P47 P37 P27 P17 P07" corresponding to result data of the eighth step STEP8 may be located to be shifted by seven bits from a position of the data "P70 P60 P50 P40 P30 P20 P10 P00" in a direction of the MSB of the data "P70 P60 P50 P40 P30 P20 P10 P00". In such a case, the data "P77 P67 P57 P47 P37 P27 P17 P07" may be the same as the second data DA2<0:7> when the eighth bit "X7" corresponding to the MSB of the first data DA1<0:7> has a value of "1", and all of bits included in the data "P77 P67 P57 P47 P37 P27 P17 P07" may have a value of "0" when the eighth bit "X7" of the first data DA1<0:7> has a value of "0". After all of the shifting calculations of the first to eighth steps STEP1~STEP8 are executed, the multiplier 411 may add all of the result data of the first to eighth steps STEP1~STEP8 to output 16-bit multiplication result data M_DA_1<0:15> of "M15 M14 M13 M12 M11 M10 M9 M8 M7 M6 M5 M4 M3 M2 M1 M0".

Figure 8:
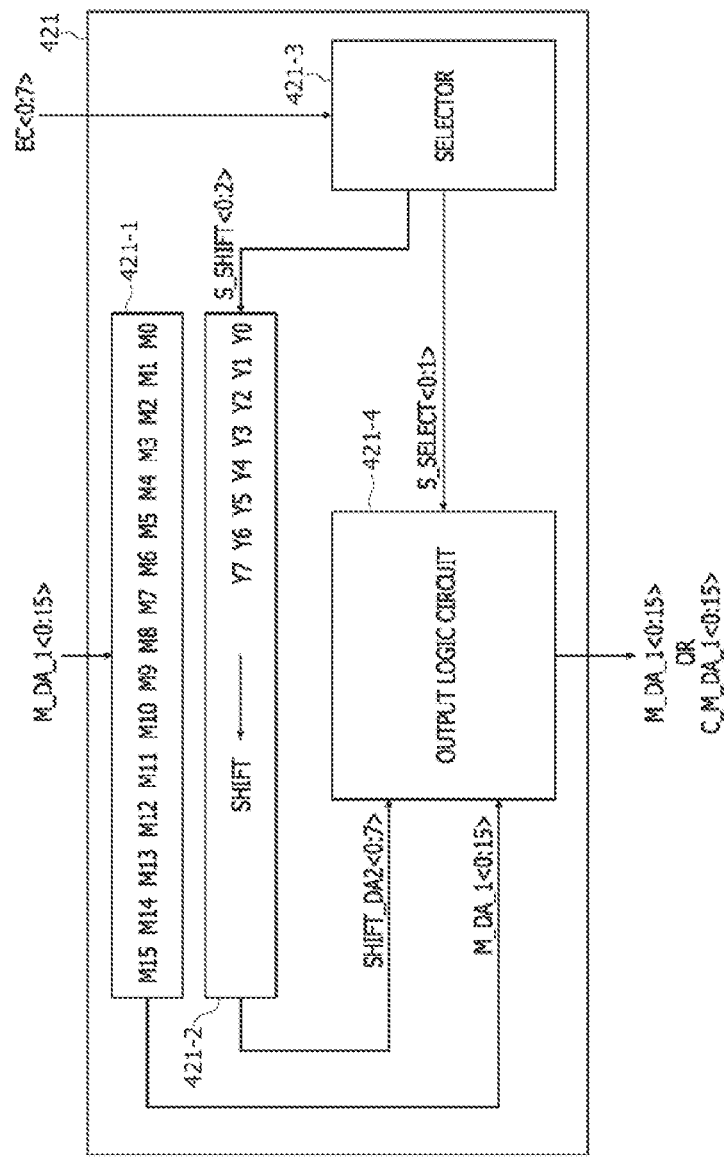
FIG. 8 illustrates one of multiplication result compensators included in a PIM device according to an embodiment of the present disclosure.

FIG. 8 illustrates one of the multiplication result compensators 421 included in the PIM device 100. Referring to FIG. 8, the multiplication result compensator 421 may be configured to include a register 421-1, a shift register 421-2, a selector 421-3, and an output logic circuit 421-4. The 16-bit multiplication result data M_DA_1<0:15> output from the multiplier 411 may be stored into the register 421-1. The second data DA2<0:7> may be stored into the shift register 421-2. The second data DA2<0:7> stored in the shift register 421-2 may be shifted by a certain number of bits in a direction from the LSB toward the MSB of the second data DA2<0:7> in response to a shift signal S_SHIFT<0:2> output from the selector 421-3, and the shifted data of the second data DA2<0:7> may be output from the shift register 421-2. The selector 421-3 may output the shift signal S_SHIFT<0:2> and a selection signal S_SELECT<0:1> to respective ones of the shift register 421-2 and the output logic circuit 421-4 in response to the error code EC<0:7> output from the syndrome decoder 320 of the ECC logic circuit 300.

The output logic circuit 421-4 may receive the multiplication result data M_DA_1<0:15> output from the register 421-1 and shifted second data SHIFT_DA2<0:7> output from the shift register 421-2. The output logic circuit 421-4 may output the multiplication result data M_DA_1<0:15> or the compensated multiplication result data C_M_DA_1<0:15> in response to the selection signal S_SELECT<0:1> output from the selector 421-3. The multiplication result data M_DA_1<0:15> output from the output logic circuit 421-4 may be the same as the multiplication result data M_DA_1<0:15> output from the register 421-1. The compensated multiplication result data C_M_DA_1<0:15> output from the output logic circuit 421-4 may be data which are generated by a compensating calculation of the multiplication result data M_DA_1<0:15> provided without error correction. A configuration and an operation of the output logic circuit 421-4 will be described hereinafter with reference to FIG. 9.

Figure 9:
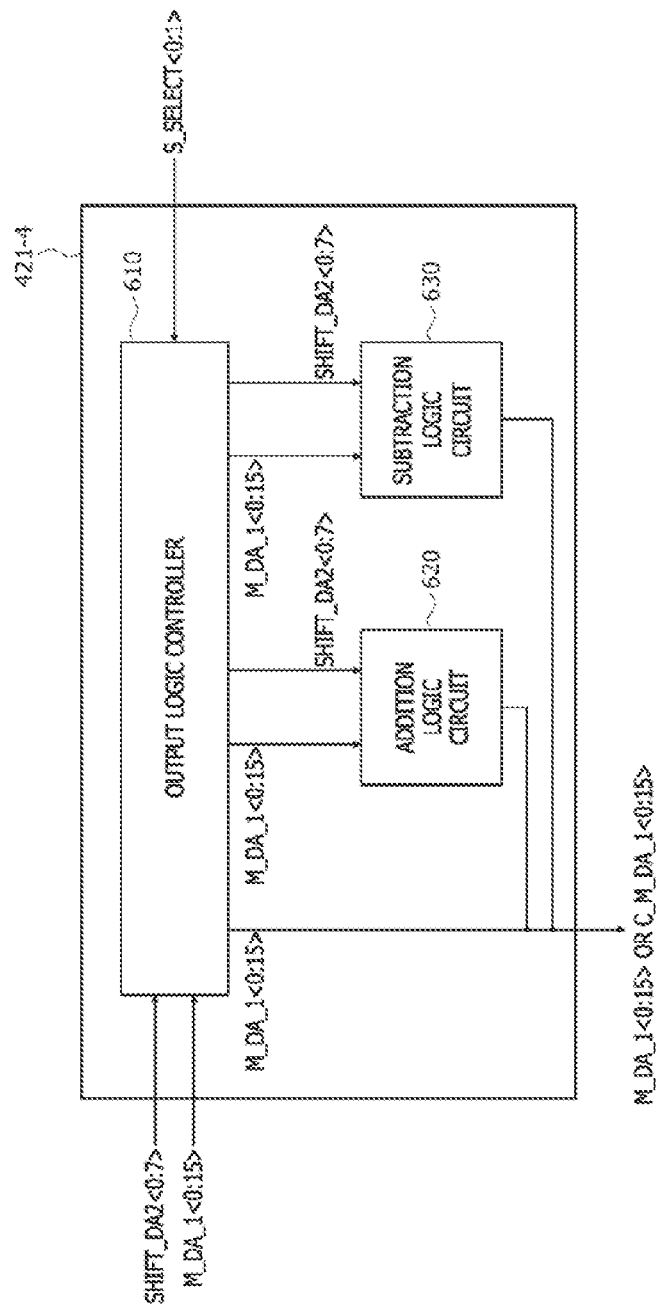
FIG. 9 is a block diagram illustrating a configuration of an output logic circuit included in a PIM device according to an embodiment of the present disclosure.

FIG. 9 is a block diagram illustrating a configuration of the output logic circuit 421-4 included in the PIM device 100. Referring to FIG. 9, the output logic circuit 421-4 may be configured to include an output logic controller 610, an addition logic circuit 620, and a subtraction logic circuit 630. The output logic controller 610 may receive the selection signal S_SELECT<0:1> from the selector 421-3. In addition, the output logic controller 610 may receive the multiplication result data M_DA_1<0:15> output from the register 421-1 and the shifted second data SHIFT_DA2<0:7> output from the shift register 421-2. The output logic controller 610 may operate in one mode of first to third output operation modes in response to the selection signal S_SELECT<0:1>.

The first output operation mode may be activated when the selection signal S_SELECT<0:1> corresponding to a case that no error exists by the error code EC<0:7> is generated. In the first output operation mode, the output logic controller 610 may directly output the multiplication result data M_DA_1<0:15> to the adding block 430 without any compensation of the multiplication result data M_DA_1<0:15>. The second and third output operation modes may be activated when the selection signal S_SELECT<0:1> corresponding to a case that an error exists by the error code EC<0:7> is generated. In particular, the output logic controller 610 may operate in the second output operation mode when an erroneous bit of the first data DA1<0:7> has a value of "0". In the second output operation mode, the output logic controller 610 may output the multiplication result data M_DA_1<0:15> and the shifted second data SHIFT_DA2<0:7> to the addition logic circuit 620. In contrast, when an erroneous bit of the first data DA1<0:7> has a value of "1", the output logic controller 610 may operate in the third output operation mode. In the third output operation mode, the output logic controller 610 may output the multiplication result data M_DA_1<0:15> and the shifted second data SHIFT_DA2<0:7> to the subtraction logic circuit 630.

The addition logic circuit 620 may execute an adding calculation of the multiplication result data M_DA_1<0:15> and the shifted second data SHIFT_DA2<0:7> provided in the second output operation mode and may output the result data of the adding calculation as the compensated multiplication result data C_M_DA_1<0:15>. The subtraction logic circuit 630 may execute a subtracting calculation subtracting the shifted second data SHIFT_DA2<0:7> from the multiplication result data M_DA_1<0:15> in the third output operation mode and may output the result data of the subtracting calculation as the compensated multiplication result data C_M_DA_1<0:15>.

As described above, according to the PIM device 100, the multiplying calculation for the MAC calculation in the MAC mode may be executed regardless of the error correction operation of the ECC logic circuit. In addition, the PIM device 100 may execute a compensating calculation of the multiplication result data to output the compensated multiplication result data only when an error is detected during the error correction operation performed by the ECC logic circuit. Thus, it may be possible to reduce a time it takes the multiplying calculation for the MAC calculation to be executed in most of cases that errors are not detected. Moreover, even though an error is detected, the compensating calculation may be executed at a state that only an error location is found out before the error correction operation completely terminates. In such a case, the multiplying calculation spending a relatively long time has already finished, and only the compensating calculation spending a relatively short time may be additionally executed. Accordingly, it may be possible to reduce a time it takes the multiplying calculation for the MAC calculation to be executed.

Figure 10:
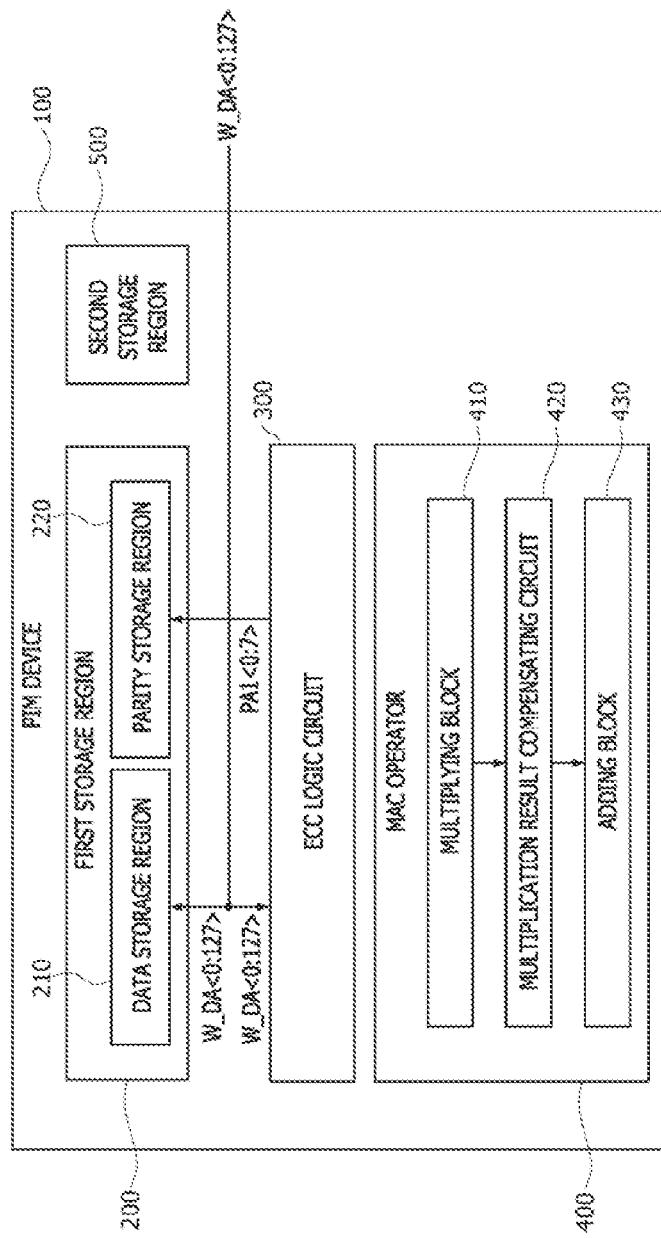
FIG. 10 is a block diagram illustrating a write operation performed in a memory mode of a PIM device according to an embodiment of the present disclosure.

FIG. 10 is a block diagram illustrating a write operation performed in the memory mode of the PIM device 100. In FIG. 10, the same reference numerals as used in FIG. 3 denote the same elements. Referring to FIG. 10, the PIM device 100 may receive the 128-bit write data W_DA<0:127> from an external device (not shown) to perform the write operation in the memory mode. The write data W_DA<0:127> may be stored into the data storage region 210 of the first storage region 200 and may also be input to the ECC logic circuit 300. As described with reference to FIG. 5, the parity/syndrome generator 310 of the ECC logic circuit 300 may generate the 8-bit parity PA1<0:7>. The 8-bit parity PA1<0:7> may be stored into the parity storage region 220 of the first storage region 200.

Figure 11:
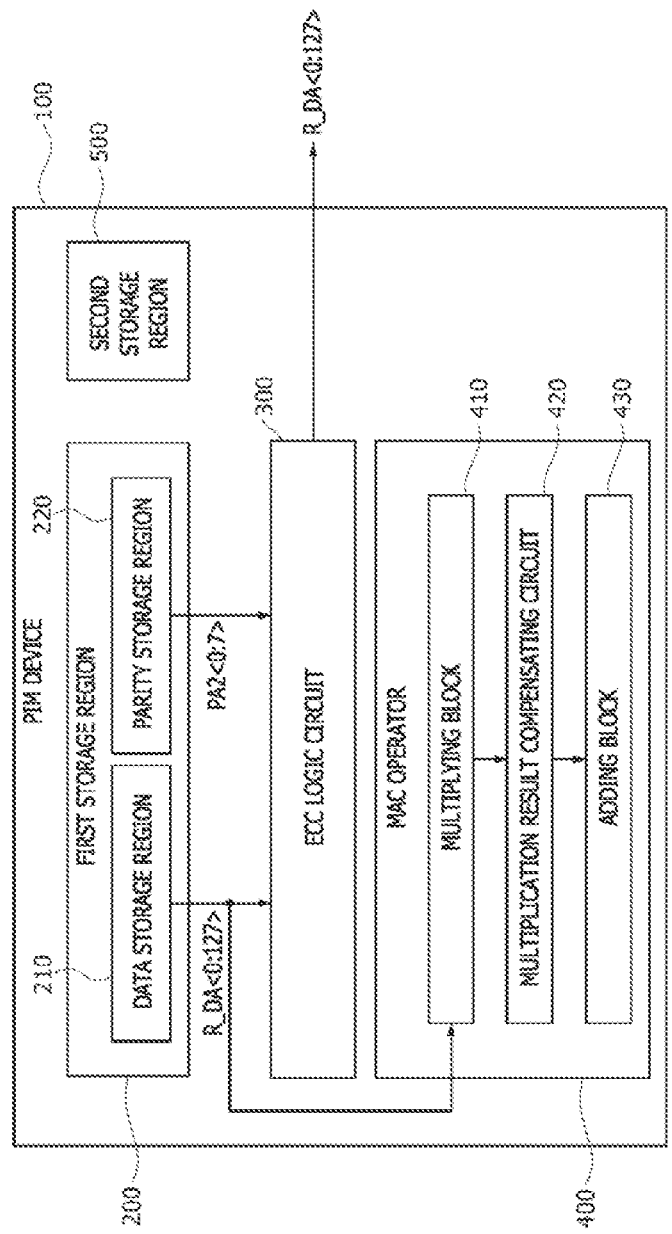
FIG. 11 is a block diagram illustrating a read operation performed in a memory mode of a PIM device according to an embodiment of the present disclosure.

FIG. 11 is a block diagram illustrating the read operation performed in the memory mode of the PIM device 100. In FIG. 11, the same reference numerals as used in FIG. 4 denote the same elements. Referring to FIG. 11, when the read operation is requested in the memory mode (i.e., a read command is generated by an external device such as a host or an external controller), the 128-bit read data R_DA<0:127> stored in the data storage region 210 of the first storage region 200 and the 8-bit parity PA2<0:7> stored in the parity storage region 220 of the first storage region 200 may be input to the ECC logic circuit 300. As described with reference to FIG. 5, the parity/syndrome generator 310 of the ECC logic circuit 300 may generate the 8-bit syndrome SYN<0:7>. The syndrome decoder 320 of the ECC logic circuit 300 may find an error location polynomial and a solution of the error location polynomial using the syndrome SYN<0:7> to generate the 128-bit error code EC<0:127> indicating an error location. The error corrector 330 of the ECC logic circuit 300 may correct an error of the read data R_DA<0:127> to output the corrected read data R_DA<0:127>. The corrected read data R_DA<0:127> output from the ECC logic circuit 300 may be transmitted to an external device, for example, a host or an external controller.

Figure 12:
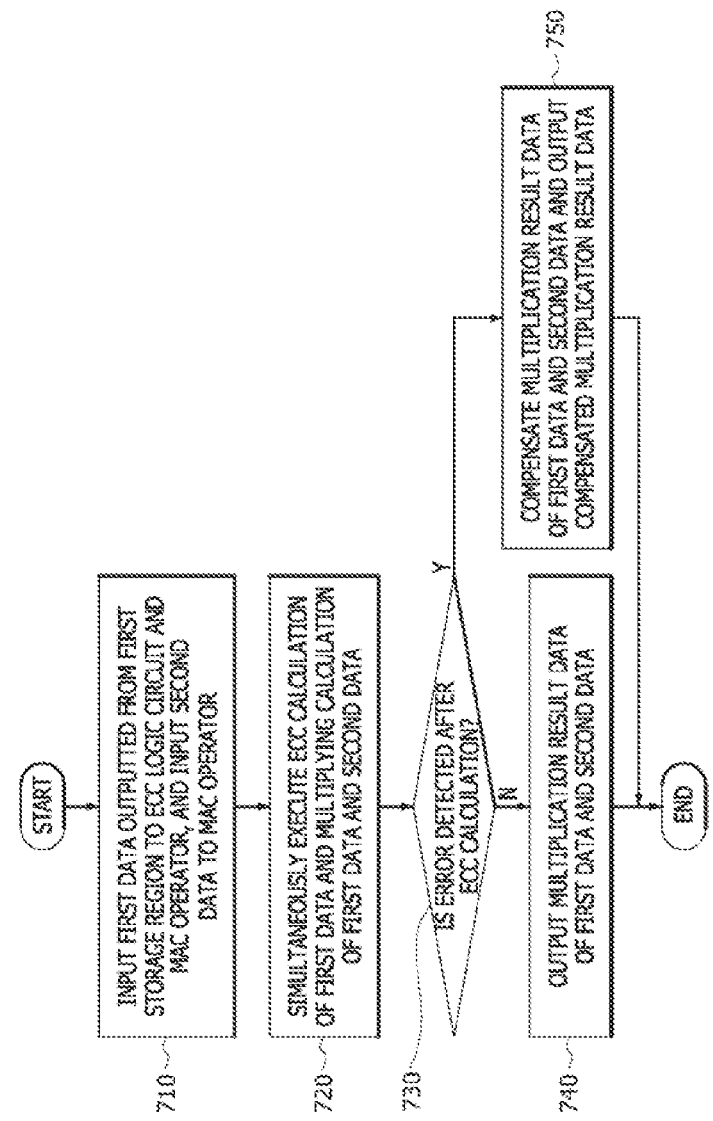
FIG. 12 is a flowchart illustrating a MAC operation performed in an MAC mode of a PIM device according to an embodiment of the present disclosure.
Figure 13:
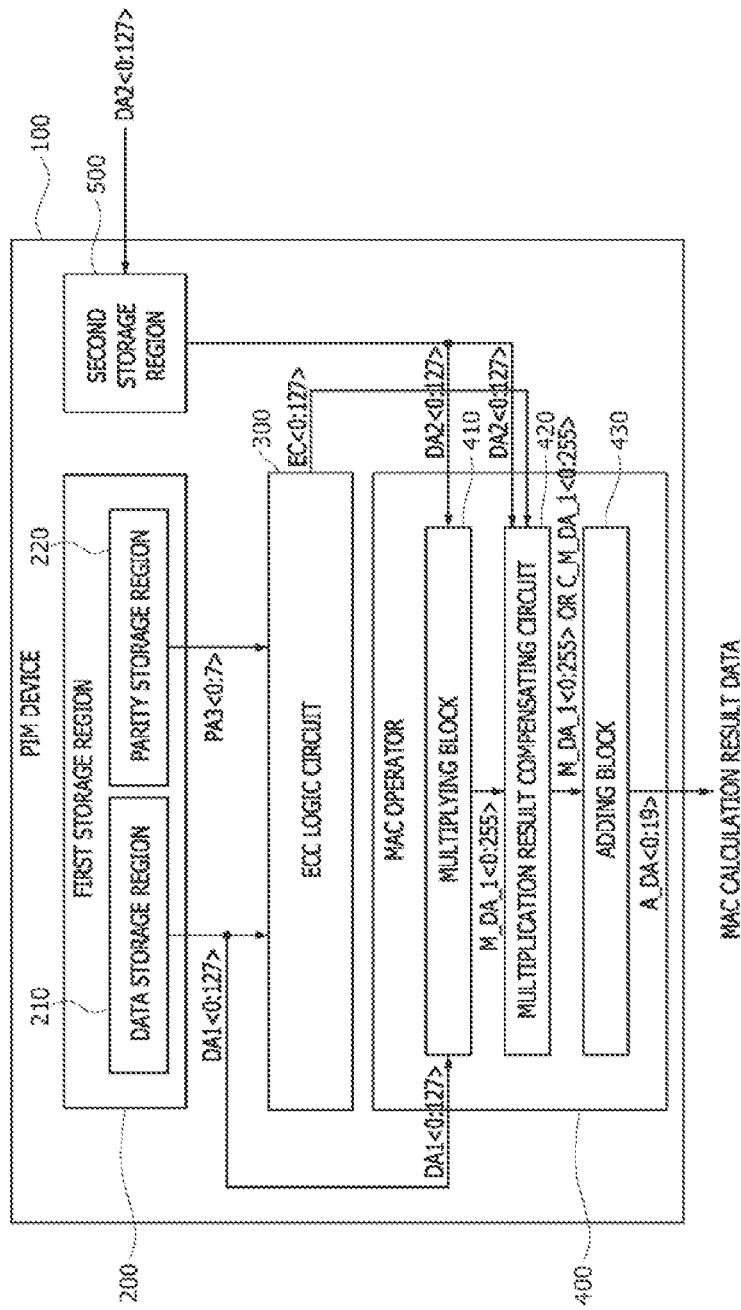
FIG. 13 is a block diagram illustrating a MAC operation performed in an MAC mode of a PIM device according to an embodiment of the present disclosure.

FIG. 12 is a flowchart illustrating a MAC operation performed in the MAC mode of the PIM device 100, and FIG. 13 is a block diagram illustrating the MAC operation performed in the MAC mode of the PIM device 100. In FIG. 13, the same reference numerals as used in FIG. 4 denote the same elements. Referring to FIGS. 12 and 13, the first data DA1<0:127> having 128 bits and the parity PA3<0:7> may be output from the first storage region 200 at a step 710. In addition, the first data DA1<0:127> may be input to the ECC logic circuit 300 and the MAC operator 400, and the parity PA3<0:7> may be input to the ECC logic circuit 300. Moreover, the second data DA2<0:127> may be input to the MAC operator 400. The first and second data DA1<0:127> and DA2<0:127> may be input to the multiplying block 410 of the MAC operator 400. The second data DA2<0:127> may also be input to the multiplication result compensating circuit 420 of the MAC operator 400.

At a step 720, an ECC calculation of the first data DA1<0:127> and the multiplying calculation of the first and second data DA1<0:127> and DA2<0:127> may be simultaneously executed. The words "simultaneous" and "simultaneously" as used herein with respect to calculations mean that the calculations take place on overlapping intervals of time. For example, if a first calculation takes place over a first interval of time and a second calculation takes place simultaneously over a second interval of time, then the first and second intervals at least partially overlap each other such that there exists a time at which the first and second calculations are both taking place. Specifically, the ECC logic circuit 300 may generate a syndrome using the first data DA1<0:127> and the parity PA3<0:7>. The ECC logic circuit 300 may perform an ECC decoding operation using the syndrome to generate and output the 128-bit error code EC<0:127> indicating an error location. The error code EC<0:127> may be input to the multiplication result compensating circuit 420 of the MAC operator 400. The multiplying block 410 of the MAC operator 400 may execute the multiplying calculation of the first and second data DA1<0:127> and DA2<0:127> to generate and output the 256-bit multiplication result data M_DA_1<0:255>. The multiplication result data M_DA_1<0:255> may be input to the multiplication result compensating circuit 420 of the MAC operator 400.

At a step 730, whether an error exists as a result of the ECC calculation may be discriminated. Specifically, the multiplication result compensating circuit 420 of the MAC operator 400 may analyze bit values of the error code EC<0:127> output from the ECC logic circuit 300 to discriminate whether an error exists in the first data DA1<0:127> and to find out an error location if an error exists in the first data DA1<0:127>. When no error exists in the first data DA1<0:127> at the step 730, the multiplication result compensating circuit 420 of the MAC operator 400 may output the multiplication result data M_DA_1<0:255> corresponding to a result of the multiplying calculation of the first data DA1<0:127> and the second data DA2<0:127> at a step 740. When an error exits the first data DA1<0:127> at the step 730, the multiplication result compensating circuit 420 of the MAC operator 400 may compensate for the multiplication result data M_DA_1<0:255> of the first and second data DA1<0:127> and DA2<0:127> to output the compensated multiplication result data C_M_DA_1<0:255>. The multiplication result data M_DA_1<0:255> or the compensated multiplication result data C_M_DA_1<0:255> output from the multiplication result compensating circuit 420 may be input to the adding block 430. The adding block 430 may execute an adding calculation of the multiplication result data M_DA_1<0:255> or the compensated multiplication result data C_M_DA_1<0:255> to output 20-bit output data A_DA<0:19> as the MAC calculation result data.

Figure 14:
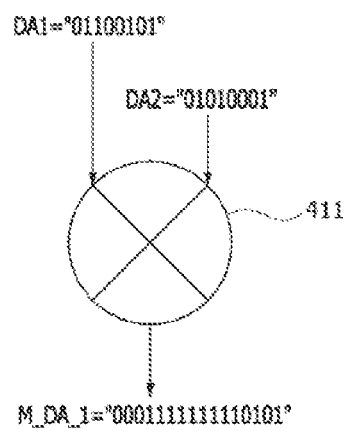
FIG. 14 illustrates an example of a multiplying calculation executed in an MAC mode of a PIM device according to an embodiment of the present disclosure.

FIG. 14 illustrates an example of a multiplying calculation executed in the MAC mode of the PIM device 100. Referring to FIG. 14, it may be assumed that the first data DA1 of "01100101" output from the first storage region 200 are input to one input terminal of the multiplier 411 and the second data DA2 of "01010001" output from the second storage region 500 are input to the other terminal of the multiplier 411. The first data DA1 of "01100101" may be data whose parity is generated by the ECC logic circuit 300 when the first data DA1 are written into the first storage region 200 by a previous write operation. In contrast, the second data DA2 of "01010001" may be merely data that are input to the multiplier 411 of the multiplying block 410 only through the second storage region 500 from an external device. Thus, the ECC calculation in the MAC mode may be executed for only the first data DA1 of "01100101". The multiplier 411 may execute a multiplying calculation of the first data DA1 of "01100101" and the second data DA2 of "01010001" to output data of "0001111111110101" as the multiplication result data M_DA_1.

Figure 15:
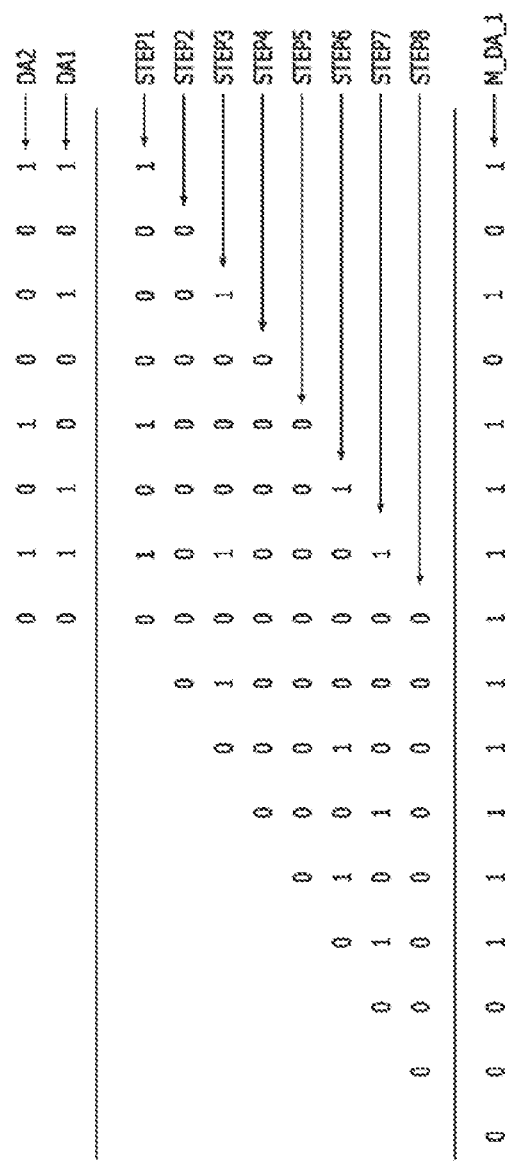
FIG. 15 illustrates a process of the multiplying calculation shown in FIG. 14.

FIG. 15 illustrates a process of the multiplying calculation shown in FIG. 14. Referring to FIG. 15, the multiplying calculation of the present embodiment may be executed in the same way as the multiplying calculation described with reference to FIG. 7. Specifically, because a first bit corresponding to an LSB of the first data DA1 has a value of "1", data "01010001" may be provided as result data of the first step STEP1. Because a second bit of the first data DA1 has a value of "0", data "00000000" may be provided as result data of the second step STEP2 and the data "00000000" may be shifted by one bit from a position of the result data "01010001" of the first step STEP1 in a direction of the MSB of the data "01010001". Because a third bit of the first data DA1 has a value of "1", data "01010001" may be provided as result data of the third step STEP3 and the data "01010001" may be shifted by two bits from a position of the result data "01010001" of the first step STEP1 in a direction of the MSB of the data "01010001". Because both of a fourth bit and a fifth bit of the first data DA1 have a value of "0", data "00000000" may be provided as result data of the fourth and fifth steps STEP4 and STEP5 and the result data "00000000" of the fourth and fifth steps STEP4 and STEP5 may be respectively shifted by three bits and four bits from a position of the result data "01010001" of the first step STEP1 in a direction of the MSB of the data "01010001". Because both of a sixth bit and a seventh bit of the first data DA1 have a value of "1", data "01010001" may be provided as result data of the sixth and seventh steps STEP6 and STEP7 and the result data "01010001" of the sixth and seventh steps STEP6 and STEP7 may be respectively shifted by five bits and six bits from a position of the result data "01010001" of the first step STEP1 in a direction of the MSB of the data "01010001". Finally, because an eighth bit of the first data DA1 has a value of "0", data "00000000" may be provided as result data of the eighth STEP8 and the result data "00000000" of the eighth step STEP8 may be shifted by seven bits from a position of the result data "01010001" of the first step STEP1 in a direction of the MSB of the data "01010001". Next, all of the result data of the first to eighth steps STEP1~STEP8 may be added to generate the multiplication result data M_DA_1 of "0001111111110101".

Figure 16:
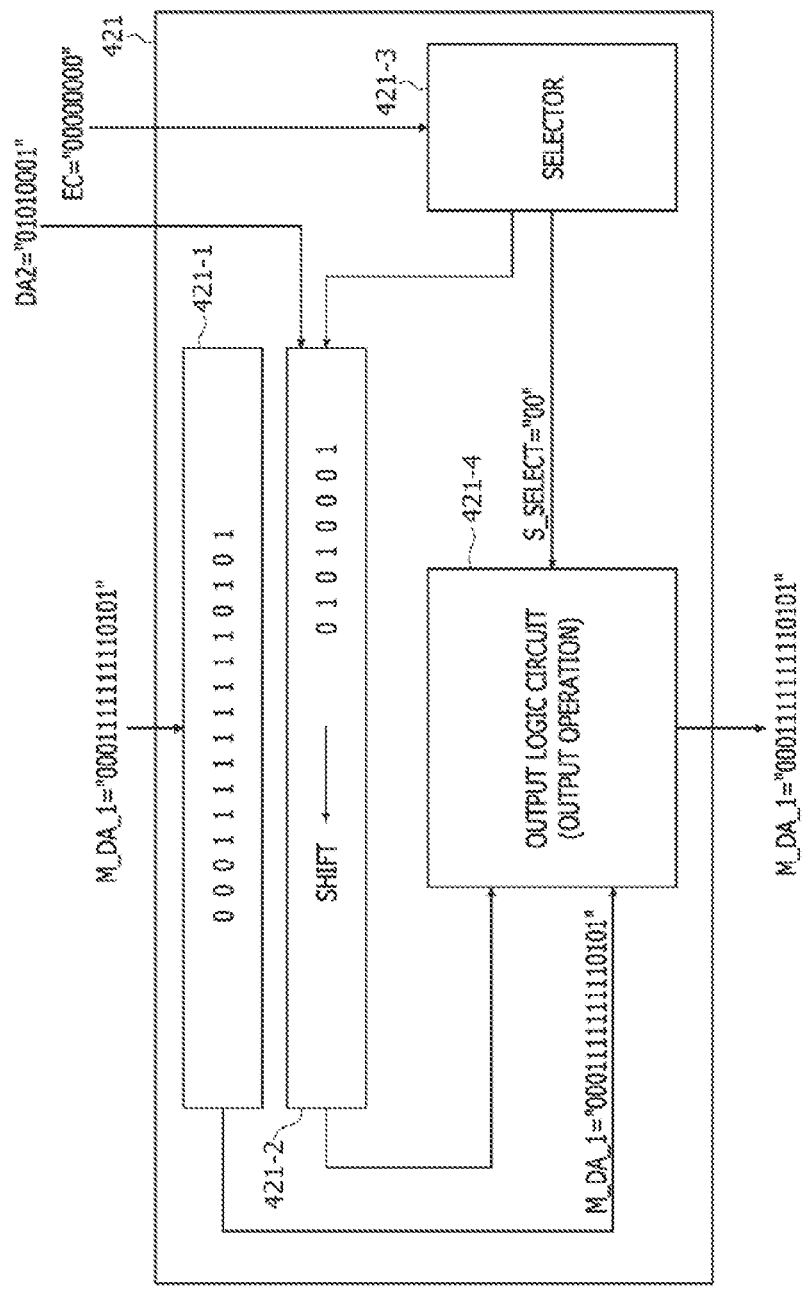
FIG. 16 is a block diagram illustrating a multiplication output compensation operation performed in the multiplication result compensator of FIG. 8 when no error occurs in the multiplying calculation of FIG. 14.

FIG. 16 is a block diagram illustrating a multiplication output compensation operation performed in the multiplication result compensator 421 of FIG. 8 when no error occurs in the multiplying calculation of FIG. 14. In FIG. 16, the same reference numerals as used in FIG. 8 denote the same elements. Referring to FIG. 16, the multiplication result data M_DA_1 of "0001111111110101" output from the multiplier 411 may be stored into the register 421-1. The multiplication result data M_DA_1 of "0001111111110101" stored in the register 421-1 may be input to the output logic circuit 421-4. The second data DA2 of "01010001" may be stored into the shift register 421-2. Because the present embodiment corresponds to a case that no error exists in the first data, the error code EC of "00000000" may be input to the selector 421-3. The selector 421-3 may output the selection signal S_SELECT of "00" to the output logic circuit 421-4 to drive the output logic circuit 421-4 in the first output operation mode. The output logic circuit 421-4 may transmit the multiplication result data M_DA_1 of "0001111111110101" output from the register 421-1 to the adding block 430.

Figure 17:
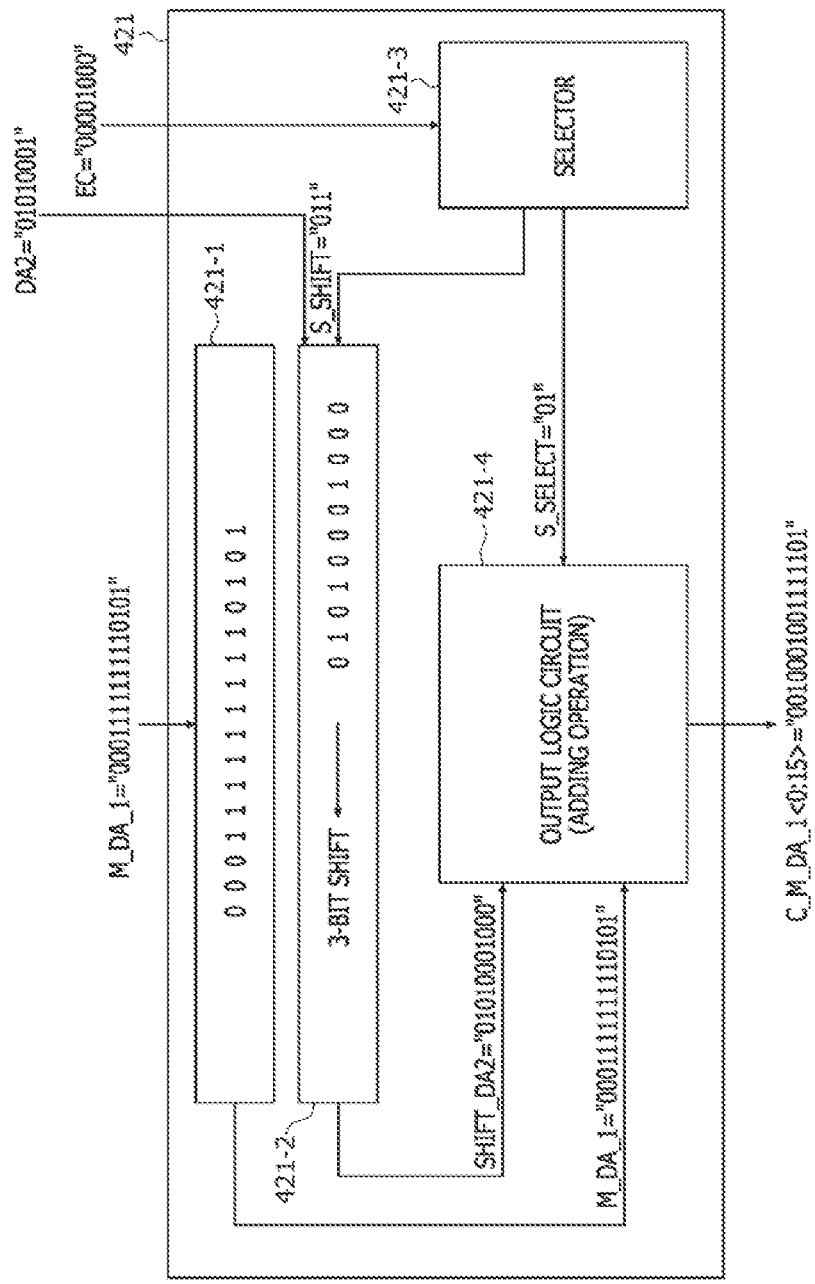
FIG. 17 is a block diagram illustrating an example of a multiplication output compensation operation performed in the multiplication result compensator of FIG. 8 when an error occurs in the multiplying calculation of FIG. 14.
Figure 18:
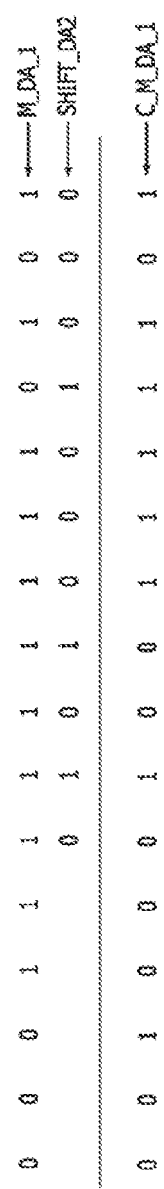
FIG. 18 illustrates a process of an adding calculation of multiplication result data and shifted data in the multiplication output compensation operation shown in FIG. 17.

FIG. 17 is a block diagram illustrating an example of a multiplication output compensation operation performed in the multiplication result compensator 421 of FIG. 8 when an error occurs in the multiplying calculation of FIG. 14, and FIG. 18 illustrates a process of an adding calculation of the multiplication result data M_DA_1 and the shifted second data SHIFT_DA2 in the multiplication output compensation operation shown in FIG. 17. In FIG. 17, the same reference numerals as used in FIG. 8 denote the same elements. First, referring to FIG. 17, the multiplication result data M_DA_1 of "0001111111110101" output from the multiplier 411 may be stored into the register 421-1. The multiplication result data M_DA_1 of "0001111111110101" stored in the register 421-1 may be input to the output logic circuit 421-4. The second data DA2 of "01010001" may be stored into the shift register 421-2. It may be assumed that the present embodiment corresponds to a case that the first data are erroneous data and the error code EC is "00001000" indicating that a fourth bit of the first data is an erroneous bit. Because the fourth bit (i.e., the erroneous bit) of the first data has a value of "0", the output logic circuit 421-4 may operate in the second output operation mode as described with reference to FIG. 9.

The error code EC of "00001000" may be input to the selector 421-3. The selector 421-3 may output the shift signal S_SHIFT of "011" to the shift register 421-2 such that the shift register 421-2 shifts the second data DA2 of "01010001" stored in the shift register 421-2 by three bits in a direction from the LSB of the second data DA2 toward the MSB of the second data DA2. In addition, the selector 421-3 may output the selection signal S_SELECT of "01" to the output logic circuit 421-4 to drive the output logic circuit 421-4 in the second output operation mode. In the second output operation mode, the shift register 421-2 may shift the second data DA2 by three bits in a direction from the LSB of the second data DA2 toward the MSB of the second data DA2 in response to the shift signal S_SHIFT of "011" and may output the shifted second data SHIFT_DA2 of "01010001000" to the output logic circuit 421-4. The output logic circuit 421-4 may operate in the second output operation mode in response to the selection signal S_SELECT of "01". Thus, as illustrated in FIG. 18, the output logic circuit 421-4 may execute an adding calculation of the multiplication result data M_DA_1 of "0001111111110101" and the shifted second data SHIFT_DA2 of "01010001000" to generate and output the compensated multiplication result data C_M_DA_1 of "0010001001111101".

Figure 19:
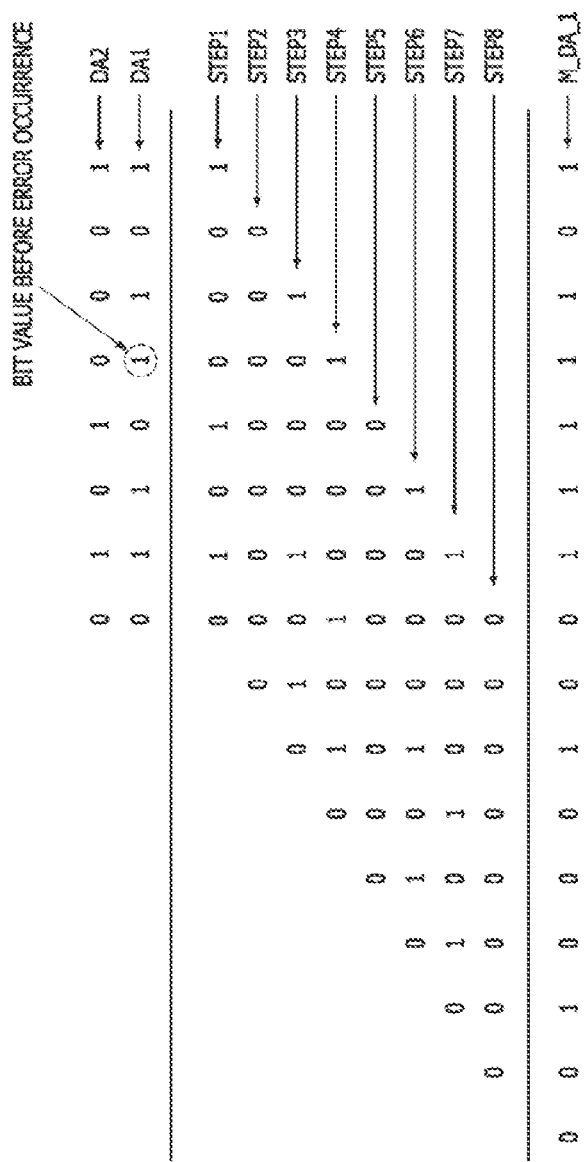
FIG. 19 illustrates a process of a multiplication result data calculation when no error occurs in the multiplication output compensation operation of FIG. 17.

FIG. 19 illustrates a process of a multiplication result data calculation when no error occurs in the multiplication output compensation operation of FIG. 17. Referring to FIG. 19, because the error code EC is "00001000", a fourth bit of the first data DA1 may correspond to an erroneous bit. Thus, the first data DA1 before error occurrence may be "01101101". If the ECC calculation is executed, the fourth erroneous bit of the first data DA1 may be corrected such that the first data DA1 are changed from the erroneous data of "01100101" into the corrected data of "01101101". Accordingly, if the MAC calculation is executed after the ECC calculation is executed, the corrected first data DA1 of "01101101" and the second data DA2 of "01010001" may be used in the MAC calculation. The multiplying calculation of the corrected first data DA1 of "01101101" and the second data DA2 of "01010001" may be executed in the same way as the described with reference to FIG. 7, thereby generating the multiplication result data M_DA_1 of "0010001001111101". This multiplication result data M_DA_1 of "0010001001111101" may be the same as the compensated multiplication result data C_M_DA_1 of "0010001001111101" described with reference to FIGS. 17 and 18. That is, even though an error exists in the first data DA1 like the present embodiment, the same data as the multiplication result data after error correction may be obtained by executing the compensating calculation after the multiplying calculation regardless of the ECC calculation.

Figure 20:
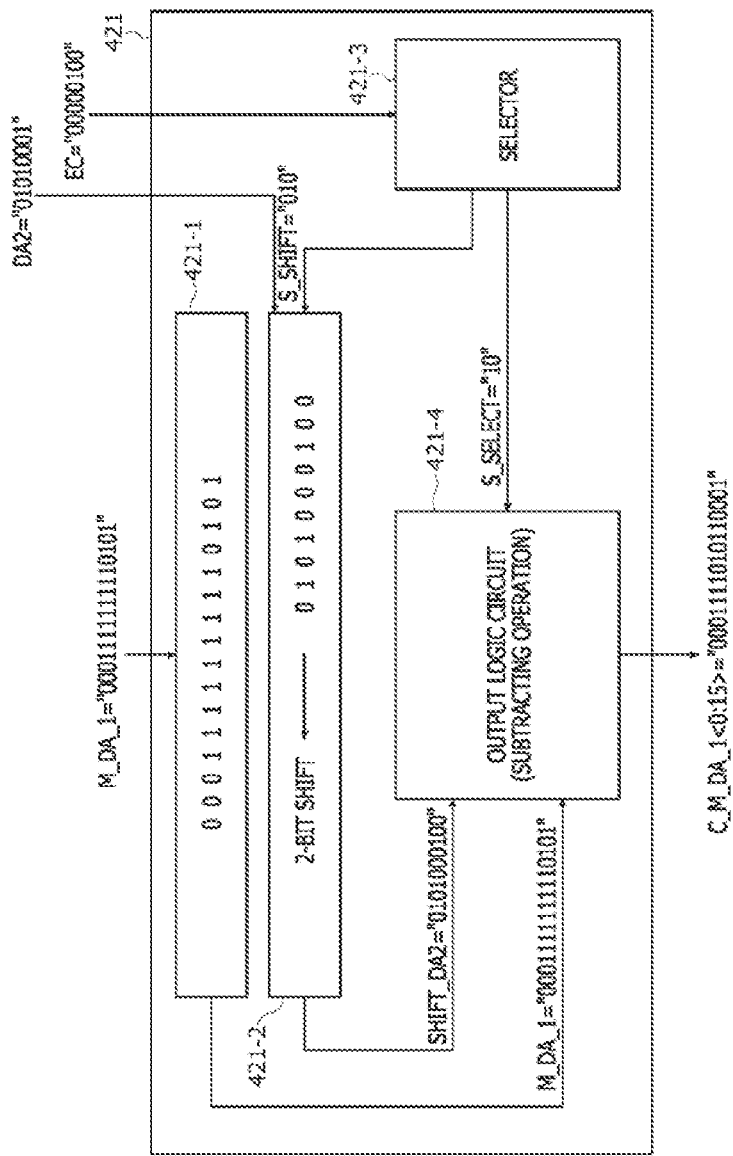
FIG. 20 is a block diagram illustrating another example of a multiplication output compensation operation performed in the multiplication result compensator of FIG. 8 when an error occurs in the multiplying calculation of FIG. 14.
Figure 21:
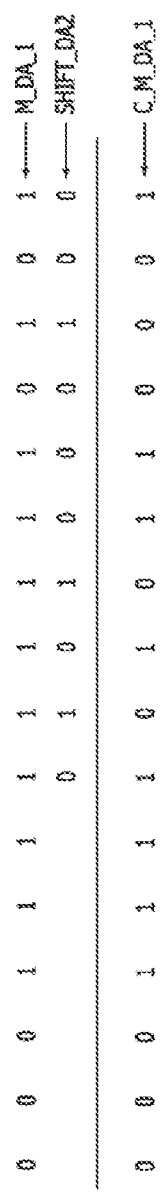
FIG. 21 illustrates a process of a subtracting calculation for subtracting shifted data from multiplication result data in the multiplication output compensation operation shown in FIG. 20.

FIG. 20 is a block diagram illustrating another example of a multiplication output compensation operation performed in the multiplication result compensator 421 of FIG. 8 when an error occurs in the multiplying calculation of FIG. 14, and FIG. 21 illustrates a process of a subtracting calculation for subtracting the shifted second data SHIFT_DA2 from the multiplication result data M_DA_1 in the multiplication output compensation operation shown in FIG. 20. In FIG. 20, the same reference numerals as used in FIG. 8 denote the same elements. First, referring to FIG. 20, the multiplication result data M_DA_1 of "0001111111110101" output from the multiplier 411 may be stored into the register 421-1. The multiplication result data M_DA_1 of "0001111111110101" stored in the register 421-1 may be input to the output logic circuit 421-4. The second data DA2 of "01010001" may be stored into the shift register 421-2. It may be assumed that the present embodiment corresponds to a case that the first data are erroneous data and the error code EC is "00000100" indicating that a third bit of the first data is an erroneous bit. Because the third bit (i.e., the erroneous bit) of the first data has a value of "1", the output logic circuit 421-4 may operate in the third output operation mode as described with reference to FIG. 9.

The error code EC of "00000100" may be input to the selector 421-3. The selector 421-3 may output the shift signal S_SHIFT of "010" to the shift register 421-2 such that the shift register 421-2 shifts the second data DA2 of "01010001" stored in the shift register 421-2 by two bits in a direction from the LSB of the second data DA2 toward the MSB of the second data DA2. In addition, the selector 421-3 may output the selection signal S_SELECT of "10" to the output logic circuit 421-4 to drive the output logic circuit 421-4 in the third output operation mode. In the third output operation mode, the shift register 421-2 may shift the second data DA2 by two bits in a direction from the LSB of the second data DA2 toward the MSB of the second data DA2 in response to the shift signal S_SHIFT of "010" and may output the shifted second data SHIFT_DA2 of "0101000100" to the output logic circuit 421-4. The output logic circuit 421-4 may operate in the third output operation mode in response to the selection signal S_SELECT of "10". Thus, as illustrated in FIG. 21, the output logic circuit 421-4 may execute a subtracting calculation for subtracting the shifted second data SHIFT_DA2 of "0101000100" from the multiplication result data M_DA_1 of "0001111111110101" to generate and output the compensated multiplication result data C_M_DA_1 of "0001111010110001".

Figure 22:
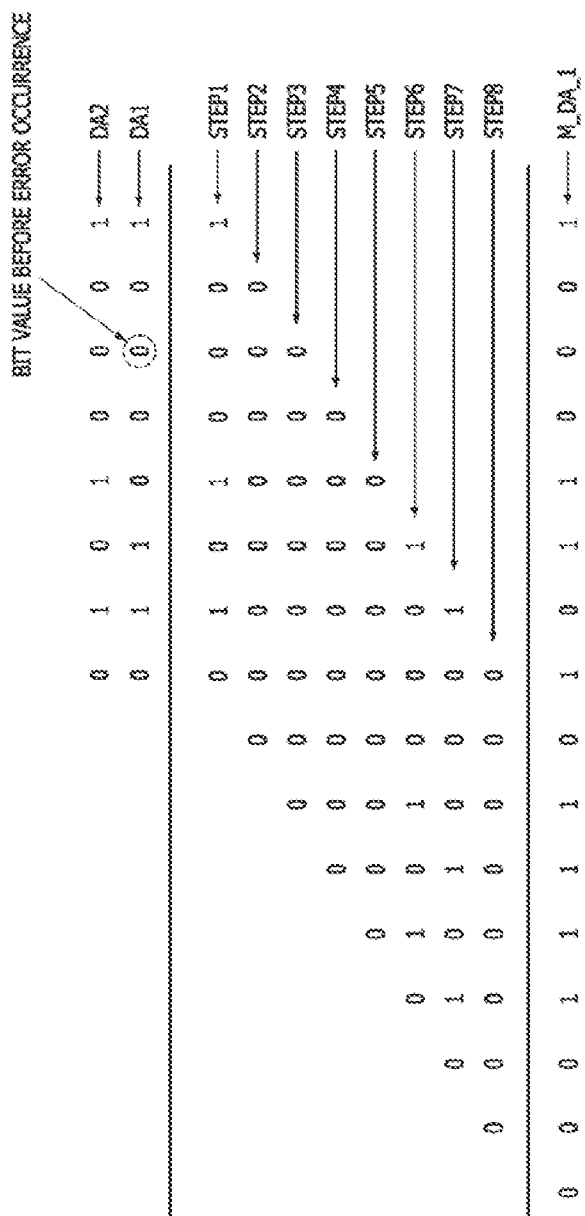
FIG. 22 illustrates a process of a multiplication result data calculation when no error occurs in the multiplication output compensation operation of FIG. 20.

FIG. 22 illustrates a process of a multiplication result data calculation when no error occurs in the multiplication output compensation operation of FIG. 20. Referring to FIG. 22, because the error code EC is "00000100", a third bit of the first data DA1 may correspond to an erroneous bit. Thus, the first data DA1 before error occurrence may be "01100001". If the ECC calculation is executed, the third erroneous bit of the first data DA1 may be corrected such that the first data DA1 are changed from the erroneous data of "01100101" into the corrected data of "01100001". Accordingly, if the MAC calculation is executed after the ECC calculation is executed, the corrected first data DA1 of "01100001" and the second data DA2 of "01010001" may be used in the MAC calculation. The multiplying calculation of the corrected first data DA1 of "01100001" and the second data DA2 of "01010001" may be executed in the same way as the described with reference to FIG. 7, thereby generating the multiplication result data M_DA_1 of "0001111010110001". This multiplication result data M_DA_1 of "0001111010110001" may be the same as the compensated multiplication result data C_M_DA_1 of "0001111010110001" described with reference to FIGS. 20 and 21.

Figure 23:
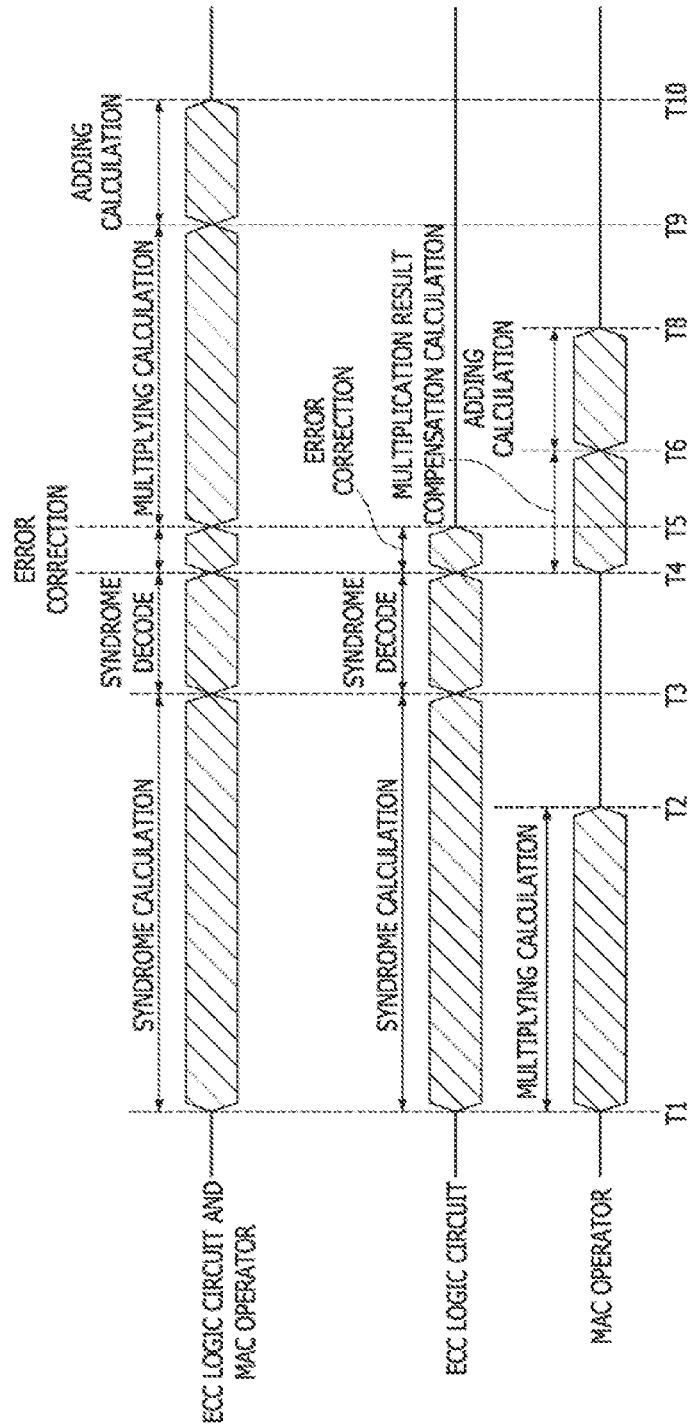
FIG. 23 is a timing diagram illustrating a MAC operation performed when an error occurs in an MAC mode of a PIM device according to an embodiment of the present disclosure.

FIG. 23 is a timing diagram illustrating a MAC operation performed when an error occurs in the MAC mode of the PIM device 100. In FIG. 23, a topmost timing diagram denotes a case that the ECC calculation and the MAC calculation are sequentially executed, and an intermediate timing diagram and a bottommost timing diagram denote a case that the ECC calculation and the MAC calculation are independently executed in parallel, respectively. Referring to FIG. 23, the ECC calculation executed by the ECC logic circuit (300 of FIG. 4) may be executed from a first point in time "T1" till a fifth point in time "T5". Specifically, a syndrome calculation may be executed from the first point in time "T1" till a third point in time "T3", the syndrome may be decoded from the third point in time "T3" till a fourth point in time "T4", and an error correction may be executed from the fourth point in time "T4" till the fifth point in time "T5". The multiplying calculation of the MAC calculation may be executed from the fifth point in time "T5" when the ECC calculation terminates till a ninth point in time "T9". In addition, the adding calculation of the MAC calculation may be executed from the ninth point in time "T9" till a tenth point in time "T10". That is, in the event that the ECC calculation and the MAC calculation are sequentially executed, the MAC calculation may terminate at the tenth point in time "T10".

In contrast, in the event that the ECC calculation and the MAC calculation are independently executed in parallel, the ECC calculation may be executed during the same period (from the first point in time "T1" till the fifth point in time "T5") as the ECC calculation shown in the topmost timing diagram. However, the multiplying calculation of the MAC calculation may start from the first point in time "T1". That is, the multiplying calculation may be executed during a period from the first point in time "T1" till the second point in time "T2". In general, a time it takes the syndrome calculation of the ECC calculation to be executed may be longer than a time it takes the multiplying calculation of the MAC calculation to be executed. Thus, the second point in time "T2" when the multiplying calculation of the MAC calculation terminates may precede the third point in time "T3" when the syndrome calculation of the ECC calculation terminates. A multiplication result compensation calculation may be executed during a period from the fourth point in time "T4" when the syndrome decoding calculation terminates till a sixth point in time "T6". As described with reference to FIGS. 8 and 9, the multiplication result compensation calculation may be executed during a relatively short period because the multiplication result compensation calculation is achieved by a shift operation and an addition operation (or a subtraction operation) of the shift register. The adding calculation of the MAC calculation may be executed during a period from the sixth point in time "T6" when the multiplication result compensation calculation terminates till an eighth point in time "T8". As a result, when the ECC calculation and the MAC calculation are independently executed in parallel like the present embodiment, it may be possible to reduce a calculation time by a period between the eighth point in time "T8" and the tenth point in time "T10" as compared with the case that the ECC calculation and the MAC calculation are sequentially executed.

Figure 24:
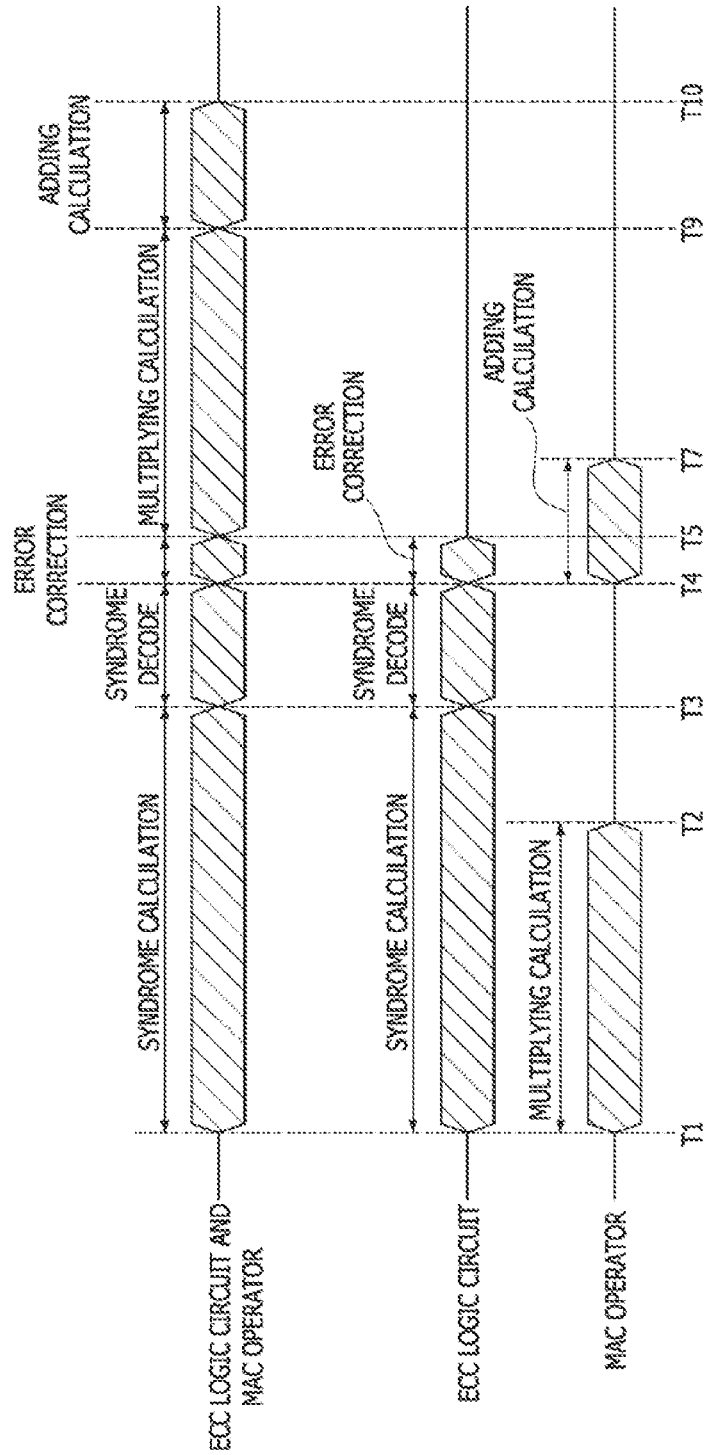
FIG. 24 is a timing diagram illustrating a MAC operation performed when no error occurs in an MAC mode of a PIM device according to an embodiment of the present disclosure.

FIG. 24 is a timing diagram illustrating a MAC operation performed when no error occurs in the MAC mode of the PIM device 100. In FIG. 24, a topmost timing diagram denotes a case that the ECC calculation and the MAC calculation are sequentially executed, and an intermediate timing diagram and a bottommost timing diagram denote a case that the ECC calculation and the MAC calculation are independently executed in parallel, respectively. Referring to FIG. 24, the case that ECC calculation and the MAC calculation are sequentially executed may be the same as described with reference to FIG. 23. Thus, in such a case, the MAC calculation may terminate at the tenth point in time "T10". The ECC calculation and the MAC calculation of the case that the ECC calculation and the MAC calculation are independently executed in parallel may also be the same as described with reference to FIG. 23. However, when no error occurs as a result of the syndrome decoding calculation of the ECC calculation, the adding calculation of the MAC calculation may be executed during a period from the fourth point in time "T4" till the seventh point in time "T7" because the multiplication result compensation calculation is unnecessary for the MAC calculation. Thus, if the ECC calculation and the MAC calculation are independently executed in parallel and no error occurs as a result of the syndrome decoding calculation of the ECC calculation, it may be possible to reduce a calculation time by a period between the seventh point in time "T7" and the tenth point in time "T10" as compared with the case that the ECC calculation and the MAC calculation are sequentially executed.

Figure 25:
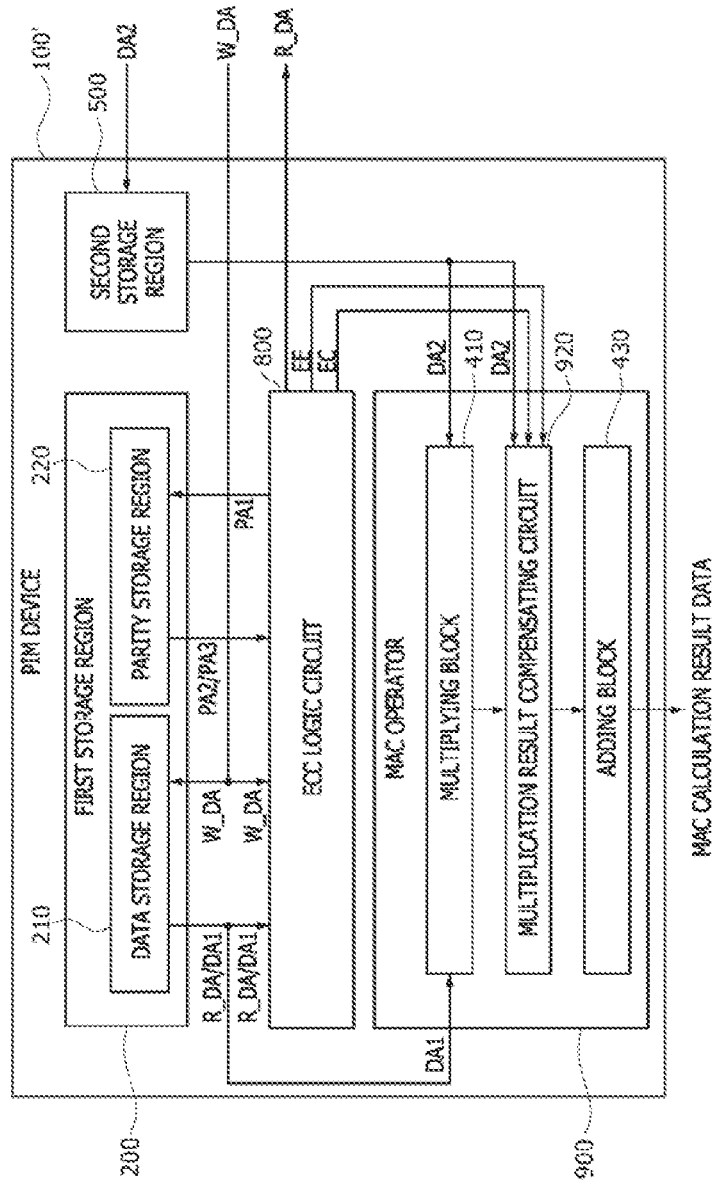
FIG. 25 is a block diagram illustrating a configuration of a PIM device according to another embodiment of the present disclosure.

FIG. 25 is a block diagram illustrating a configuration of a PIM device 100' according to another embodiment of the present disclosure. In FIG. 25, the same reference numerals as used in FIG. 4 denote the same elements. Thus, descriptions of the same elements as set forth with reference to FIG. 4 will be omitted or briefly mentioned to avoid duplicate descriptions. Referring to FIG. 25, the PIM device 100' may include an ECC logic circuit 800 corresponding to the ECC logic circuit 300 illustrated in FIG. 4. The ECC logic circuit 800 may sequentially output an error signal EE and the error code EC in the MAC mode. The error signal EE may be a signal including only information on whether an error exists as a result of the ECC calculation. For example, the error signal EE having a value of "0" may indicate that no error occurs as a result of the ECC calculation, and the error signal EE having a value of "1" may indicate that an error occurs as a result of the ECC calculation. The ECC logic circuit 800 may output the error signal EE and may output the error code EC only when an error exists in the first data DA1 after outputting the error signal EE. As described with reference to FIG. 4, the error code EC may include information on an error location.

The PIM device 100' may include a MAC operator 900 corresponding to the MAC operator 400 illustrated in FIG. 4, and the MAC operator 900 may include a multiplication result compensating circuit 920 corresponding to the multiplication result compensating circuit 420 illustrated in FIG. 4. The multiplication result compensating circuit 920 may receive the error signal EE in addition to the error code EC from the ECC logic circuit 800. The multiplication result compensating circuit 920 may transmit the multiplication result data output from the multiplying block 410 to the adding block 430 without executing any compensating calculation when the error signal EE having a value of "0" is input to the multiplication result compensating circuit 920. In contrast, when the error signal EE having a value of "1" is input to the multiplication result compensating circuit 920 from the ECC logic circuit 800, the multiplication result compensating circuit 920 may execute a compensating calculation of the multiplication result data according to the error code EC input to the multiplication result compensating circuit 920 and may output the compensated multiplication result data to the adding block 430.

Figure 26:
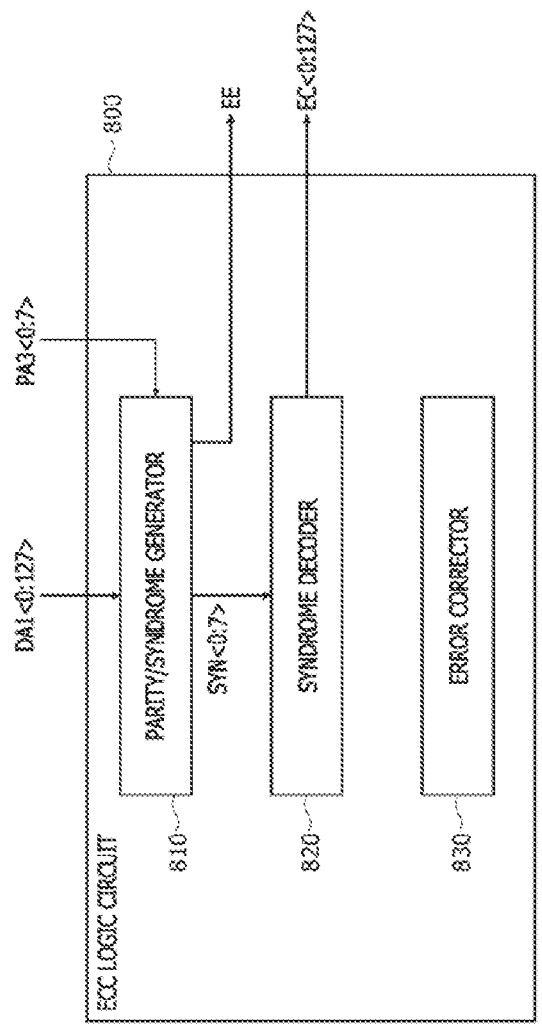
FIG. 26 is a block diagram illustrating a configuration of an error correction code (ECC) logic circuit included in a PIM device according to another embodiment of the present disclosure.

FIG. 26 is a block diagram illustrating a configuration of the ECC logic circuit 800 included in the PIM device 100'. The ECC logic circuit 800 includes a parity/syndrome generator 810, a syndrome decoder 820, and an error corrector 830. The ECC logic circuit 800 including the parity/syndrome generator 810, the syndrome decoder 820, and the error corrector 830 may perform the same operations as the ECC logic circuit 300 described with reference to FIGS. 4 and 5 during the read and write operations performed in the memory mode and during the write operation performed in the MAC mode. Thus, only the read operation of the ECC logic circuit 800 performed in the MAC mode will be described hereinafter. During the read operation in the MAC mode, the parity/syndrome generator 810 may receive the first data DA1<0:127> and the parity PA3<0:7> from the first storage region 200 to generate the syndrome SYN<0:7>. In general, while the syndrome SYN<0:7> is generated by the parity/syndrome generator 810, whether the first data DA1<0:127> are erroneous data may be discriminated. That is, if the syndrome SYN<0:7> is generated, information on whether an error exists in the first data DA1<0:127> may be obtained even though the error location is not found.

When no error exists in the first data DA1<0:127> as a result of the syndrome calculation, the parity/syndrome generator 810 may output the error signal EE having a value of "0". In an embodiment, if the error signal EE has a value of "0", the syndrome SYN<0:7> generated by the parity/syndrome generator 810 is not input to the syndrome decoder 820. In another embodiment, even though the syndrome SYN<0:7> is input to the syndrome decoder 820, no decoding calculation is executed by the syndrome decoder 820 and no error code EC<0:127> is generated by the syndrome decoder 820. When an error exists in the first data DA1<0:127> as a result of the syndrome calculation, the parity/syndrome generator 810 may output the error signal EE has a value of "1" and may output the syndrome SYN<0:7> to the syndrome decoder 820. The syndrome decoder 820 may generate and output the error code EC<0:127> indicating an error location based on the syndrome SYN<0:7>. The error code EC<0:127> output from the syndrome decoder 820 may be input to the multiplication result compensating circuit 920 of the MAC operator 900, as described with reference to FIG. 25. The error corrector 830 may perform an error correction operation only in the memory mode and does not perform any error correction operation in the MAC mode.

Figure 27:
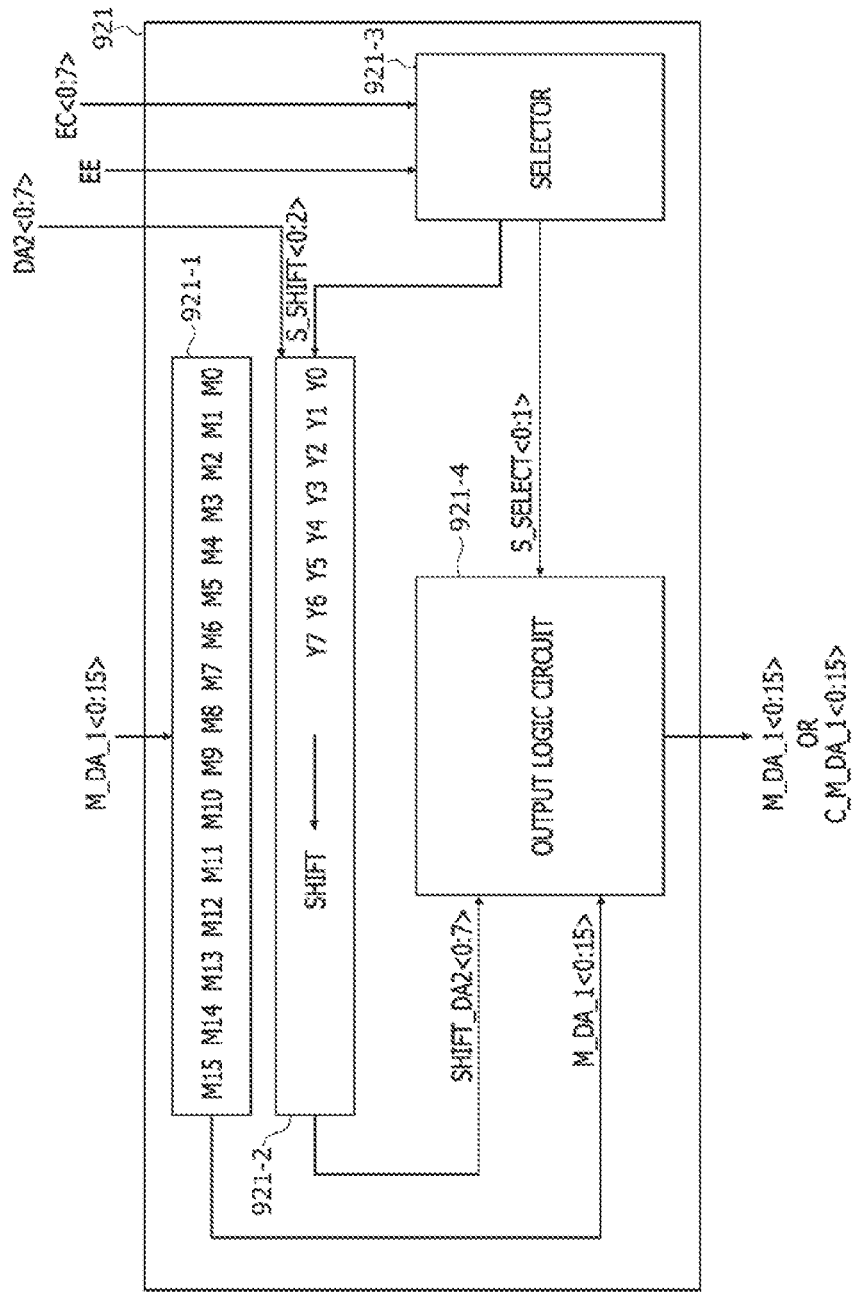
FIG. 27 illustrates one of multiplication result compensators included in a PIM device according to another embodiment of the present disclosure.

FIG. 27 illustrates one of multiplication result compensators 921 constituting the multiplication result compensating circuit 920 included in the PIM device 100'. In the present embodiment, the multiplication result compensator 921 may correspond to one of the plurality of multiplication result compensators 421 constituting the multiplication result compensating circuit 420 described with reference to FIG. 6. Referring to FIG. 27, the multiplication result compensator 921 may be configured to include a register 921-1, a shift register 921-2, a selector 921-3, and an output logic circuit 921-4. The multiplication result data M_DA_1<0:15> output from the multiplier 411 of the multiplying block 410 may be stored into the register 921-1. The second data DA2<0:7> may be stored into the shift register 921-2. The second data DA2<0:7> stored in the shift register 921-2 may be shifted by a certain number of bits in a direction from the LSB toward the MSB of the second data DA2<0:7> in response to the shift signal S_SHIFT<0:2> output from the selector 921-3, and the shifted data of the second data DA2<0:7> may be output from the shift register 921-2. The number of bits by which the second data DA2<0:7> are shifted may be determined according to the shift signal S_SHIFT<0:2>.

The selector 921-3 may output the selection signal S_SELECT<0:1> to the output logic circuit 921-4 in response to the error signal EE output from the parity/syndrome generator 810 of the ECC logic circuit 800. In addition, the selector 921-3 may output the shift signal S_SHIFT<0:2> and the selection signal S_SELECT<0:1> to respective ones of the shift register 921-2 and the output logic circuit 921-4 in response to the error code EC<0:7> output from the syndrome decoder 820 of the ECC logic circuit 800. In an embodiment, the selection signal S_SELECT<0:1> may be a 2-bit binary stream. For example, when no error exists in the first data DA1 (i.e., the error signal EE having a value of "0" is input to the selector 921-3), the selector 921-3 may output the selection signal S_SELECT<0:1> of "00". When an error exists in the first data DA1 and an adding calculation is required as the compensating calculation, the selector 921-3 may output the selection signal S_SELECT<0:1> of "01". When an error exists in the first data DA1 and a subtracting calculation is required as the compensating calculation, the selector 921-3 may output the selection signal S_SELECT<0:1> of "10".

The output logic circuit 921-4 may receive the multiplication result data M_DA_1<0:15> from the register 921-1. In addition, the output logic circuit 921-4 may receive the shifted second data SHIFT_DA2<0:7> from the shift register 921-2. When the error signal EE having a value of "0" is input to the selector 921-3 (i.e., no compensating calculation is required because no error occurs), the output logic circuit 921-4 does not receive the shifted second data SHIFT_DA2<0:7>. In such a case, the output logic circuit 921-4 may output the multiplication result data M_DA_1<0:15> without executing any compensating calculation of the multiplication result data M_DA_1<0:15> in response to the selection signal S_SELECT<0:1> of "00". In contrast, when the error signal EE having a value of "1" and the error code EC<0:7> are input to the selector 921-3, the selector 921-3 may output the selection signal S_SELECT<0:1> of "01" or "10" and the output logic circuit 921-4 may execute an adding calculation of the multiplication result data M_DA_1<0:15> and the shifted second data SHIFT_DA2<0:7> or a subtracting calculation for subtracting the shifted second data SHIFT_DA2<0:7> from the multiplication result data M_DA_1<0:15> in response to the selection signal S_SELECT<0:1> of "01" or "10" to generate and output the compensated multiplication result data C_M_DA_1<0:15>.

Figure 28:
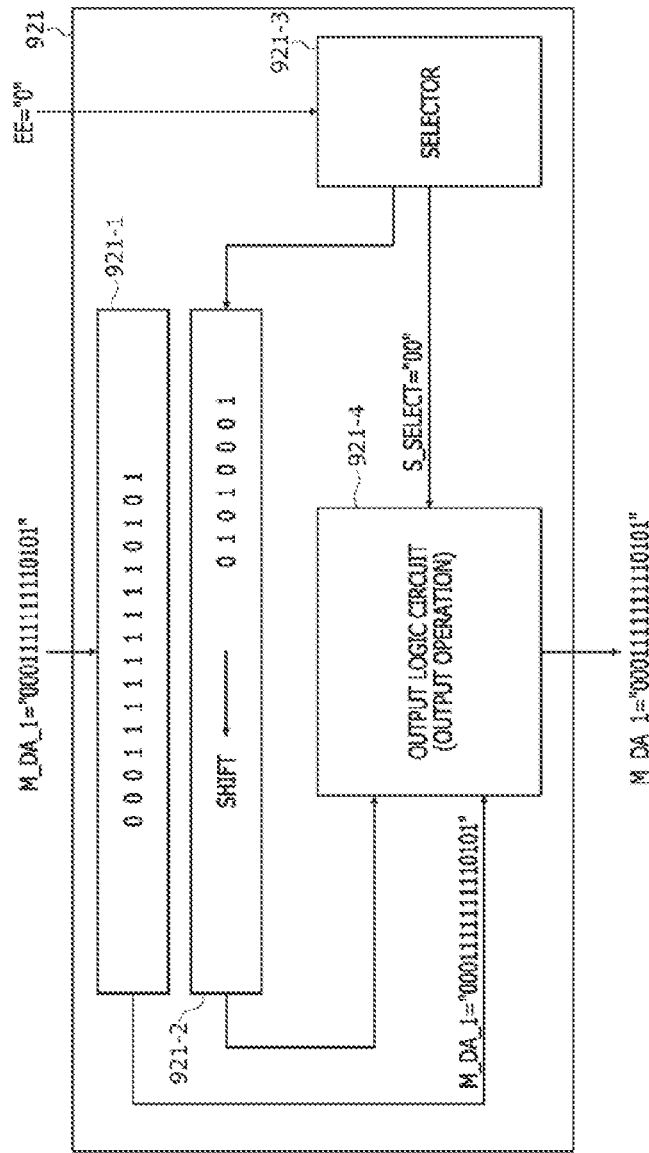
FIG. 28 illustrates an operation of the multiplication result compensator shown in FIG. 27 when no error occurs in a PIM device according to another embodiment of the present disclosure.

FIG. 28 illustrates an operation of the multiplication result compensator 921 shown in FIG. 27 when no error occurs in the PIM device 100'. In FIG. 28, the same reference numerals as used in FIG. 27 denote the same elements. In the present embodiment, it may be assumed that the first data DA1 are "01100101", the second data DA2 are "01010001", and the multiplication result data M_DA_1 output from the multiplier 411 of the multiplying block 410 are "0001111111110101" (see FIG. 14). Referring to FIG. 28, the multiplication result data M_DA_1 of "0001111111110101" output from the multiplier 411 may be stored into the register 921-1. The multiplication result data M_DA_1 of "0001111111110101" stored in the register 921-1 may be input to the output logic circuit 921-4. The second data DA2 of "01010001" may be stored into the shift register 921-2. Because the present embodiment corresponds to a case that no error exists in the first data DA1, the error signal EE of "0" may be input to the selector 921-3. The selector 921-3 may output the selection signal S_SELECT of "00" to the output logic circuit 921-4 to drive the output logic circuit 921-4 in the first output operation mode. The output logic circuit 921-4 may transmit the multiplication result data M_DA_1 of "0001111111110101" output from the register 921-1 to the adding block 430.

Figure 29:
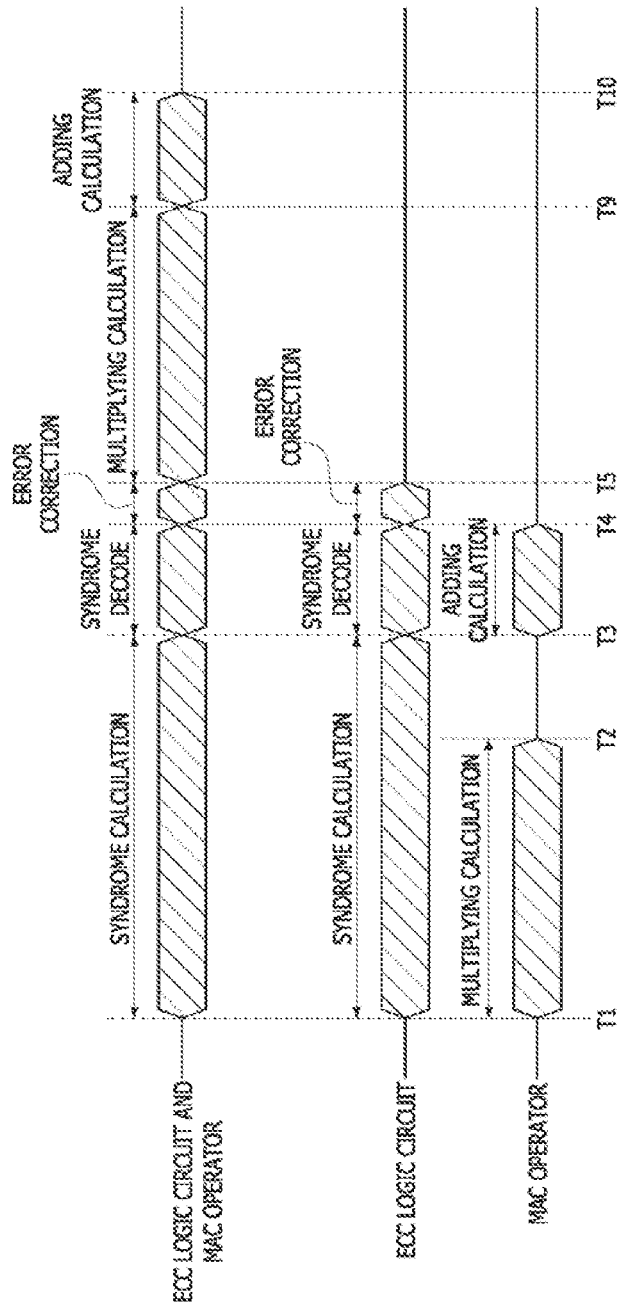
FIG. 29 is a timing diagram illustrating a MAC operation performed when no error occurs in an MAC mode of a PIM device according to another embodiment of the present disclosure.

FIG. 29 is a timing diagram illustrating a MAC operation performed when no error occurs in the MAC mode of the PIM device 100'. In FIG. 29, a topmost timing diagram denotes a case that the ECC calculation and the MAC calculation are sequentially executed, and an intermediate timing diagram and a bottommost timing diagram denote a case that the ECC calculation and the MAC calculation are independently executed in parallel, respectively. Referring to FIG. 29, the case that ECC calculation and the MAC calculation are sequentially executed may be the same as described with reference to FIG. 23. Thus, in such a case, the MAC calculation may terminate at the tenth point in time "T10". The ECC calculation and the MAC calculation of the case that the ECC calculation and the MAC calculation are independently executed in parallel may also be the same as described with reference to FIG. 23. However, when no error occurs as a result of the syndrome decoding calculation of the ECC calculation (i.e., the error signal EE of "0" is generated), it may be unnecessary to execute the multiplication result compensation calculation. Thus, in such a case, an adding calculation of the MAC calculation may be executed during a period from the third point in time "T3" till the fourth point in time "T4" if a time it takes the adding calculation of the MAC calculation to be executed is equal to a time it takes the syndrome decoding calculation of the ECC calculation to be executed. Accordingly, if the ECC calculation and the MAC calculation are independently executed in parallel and no error occurs as a result of the syndrome decoding calculation of the ECC calculation, it may be possible to reduce a calculation time by a period between the fourth point in time "T4" and the tenth point in time "T10" as compared with the case that the ECC calculation and the MAC calculation are sequentially executed.

According to the embodiments described above, the ECC calculation and the MAC calculation for data output from the first storage region of the PIM device may be independently executed in parallel, and the multiplication result data may then be compensated only when an error exists in the data output from the first storage region. Thus, it may be possible to improve a calculation speed of the MAC operation performed in the PIM device.

Figure 30:
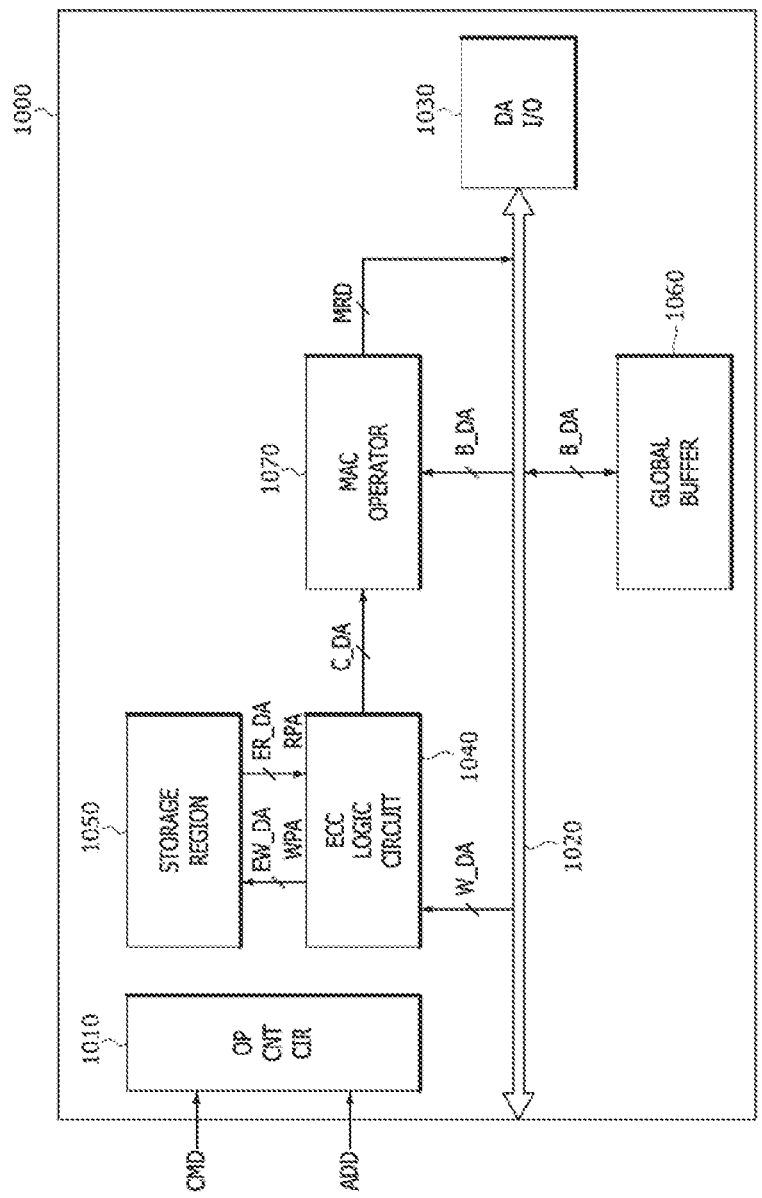
FIG. 30 is a block diagram illustrating a configuration of a PIM device according to another embodiment of the present disclosure.

FIG. 30 is a block diagram illustrating a configuration of a PIM device 1000 according to another embodiment of the present disclosure. Referring to FIG. 30, the PIM device 1000 may include an operation control circuit (OP CNT CTR) 1010, a data line 1020, a data input/output circuit 1030, an ECC logic circuit 1040, a storage region 1050, a global buffer 1060, and a MAC operator 1070.

The operation control circuit 1010 may control the ECC logic circuit 1040 and the storage region 1050 when a write operation in an operation mode is performed. The operation control circuit 1010 may control the ECC logic circuit 1040 so that write data EW_DA and write parity WPA are generated from write input data W_DA when the write operation in the operation mode is performed. The operation control circuit 1010 may control the storage region 1050 to receive and store the write data EW_DA and the write parity WPA generated in the ECC logic circuit 1040 when the write operation in the operation mode is performed. The operation control circuit 1010 may include a command decoder (not illustrated) that decodes a command CMD, an address decoder (not illustrated) that decodes an address ADD, and input/output control circuits (not illustrated) that control data to be input/output in/from the storage region 1050.

The operation control circuit 1010 may control the ECC logic circuit 1040 and the storage region 1050 when a read operation in the operation mode is performed. The operation control circuit 1010 may control the storage region 1050 so that read data ER_DA and read parity RPA are output when the read operation in the operation mode is performed. The operation control circuit 1010 may control the ECC logic circuit 1040 so that converted data C_DA is generated from the read data ER_DA and the read parity RPA when the read operation in the operation mode is performed.

The operation control circuit 1010 may control the MAC operator 1070 when a MAC arithmetic operation in the operation mode is performed. The operation control circuit 1010 may control the MAC operator 1070 so that a MAC arithmetic operation for the converted data C_DA and buffer data B_DA is performed when the MAC arithmetic operation in the operation mode is performed.

The ECC logic circuit 1040 may receive the write input data W_DA that is input through the data input/output circuit 1030 when the write operation in the operation mode is performed through the data line 1020. The ECC logic circuit 1040 may remove some bits from the bits included in the write input data W_DA and generate write data EW_DA, based on the remaining bits when the write operation in the operation mode is performed. As an example, the ECC logic circuit 1040 may remove 8 bits from the write input data W_DA including 128 bits to generate the write data EW_DA from the write input data W_DA including the remaining 120 bits. Some bits removed from the bits included in the write input data W_DA in the ECC logic circuit 1040 may be variously set according to embodiments. As an example, when the write input data W_DA including 128 bits includes 8 pieces of 16-bit data implemented in a floating-point method, 1 bit included in a mantissa part may be removed for each piece of piece of 16-bit data. As another example, when the write input data W_DA including 128 bits includes 8 pieces of 16-bit data implemented in a floating-point method, 1 bit included in an exponent part may be removed for each piece of piece of 16-bit data. The method of generating the write data EW_DA from the write input data W_DA including the remaining bits after some bits are removed in the ECC logic circuit 1040 may be variously set according to embodiments. As an example, when 8 bits are removed from the write input data W_DA including 128 bits, the write input data W_DA including the remaining 120 bits may be output as the write data EW_DA. As another example, when 8 bits are removed from the write input data W_DA including 28 bits and the remaining write input data W_DA includes 8 pieces of 15-bit data implemented in a floating-point method, the bit combination of the bits included in a mantissa part may be adjusted by rounding methods according to the removed bits for each piece of the remaining 15-bit data, and the write input data W_DA including 120 bits whose bit combination is adjusted may be output as the write data EW_DA. The rounding methods are often done to obtain a value that is easier to report and communicate than the original. Many rounding methods exist because it is not usually possible for a method to satisfy all ideal characteristics. As another example, when 8 bits are removed from the write input data W_DA including 128 bits and the remaining write input data W_DA includes 8 pieces of 15-bit data implemented in a floating-point method, the bit combination of the bits included in an exponent part may be adjusted in a preset bit combination according to the removed bits for each piece of the remaining 15-bit data, and the write input data W_DA including 120 bits whose bit combination is adjusted may be output as the write data EW_DA. The word "preset" as used herein with respect to a parameter, such as a preset bits or preset bit combination, means that a value for the parameter is determined prior to the parameter being used in a process or algorithm. For some embodiments, the value for the parameter is determined before the process or algorithm begins. In other embodiments, the value for the parameter is determined during the process or algorithm but before the parameter is used in the process or algorithm.

The ECC logic circuit 1040 may generate write parity WPA, based on the write data EW_DA when the write operation in the operation mode is performed. The ECC logic circuit 1040 may encode the write data EW_DA to generate the write parity WPA. A Hamming code may be used to encode the write data EW_DA to generate the write parity WPA in the ECC logic circuit 1040. As an example, the ECC logic circuit 1040 may encode write data EW_DA including 120 bits to generate write parity WPA including 8 bits when the write operation in the operation mode is performed. The ECC circuit 1040 may apply the write data EW_DA and the write parity WPA to the storage region 1050, based on the control of the operation control circuit 1010 when the write operation in the operation mode is performed.

The ECC circuit 1040 may receive read data ER_DA and read parity RPA from the storage region 1050 when a read operation in the operation mode is performed. The read data ER_DA may be the same data as the write data EW_DA stored when the write operation in the operation mode is performed. The read parity RPA may be the same parity as the write parity WPA stored when the write operation in the operation mode is performed.

The ECC logic circuit 1040 may generate syndrome (SYN of FIG. 31), based on the read data ER_DA and the read parity RPA when the read operation in the operation mode is performed. The ECC logic circuit 1040 may decode the read data ER_DA and the read parity RPA to generate the syndrome (SYN of FIG. 31). A Hamming code may be used to decode the read data ER_DA and the read parity RPA in order to generate the syndrome (SYN in FIG. 31) in the ECC logic circuit 1040. As an example, the ECC logic circuit 1040 may decode read data ER_DA including 120 bits and read parity RPA including 8 bits to generate the syndrome (SYN of FIG. 31) when the read operation in the operation mode is performed. The ECC circuit 1040 may generate corrected read data (CR_DA of FIG. 31) from the read data ER_DA, based on the syndrome (SYN of FIG. 31) when the read operation in the operation mode is performed. The ECC logic circuit 1040 may correct an error included in the read data ER_DA by the syndrome (SYN of FIG. 31) to generate the corrected read data (CR_DA of FIG. 31).

The ECC circuit 1040 may generate converted data C_DA, based on the corrected read data (CR_DA of FIG. 31) when the read operation in the operation mode is performed. The ECC logic circuit 1040 may add preset bits to the corrected read data (CR_DA of FIG. 31) to generate the converted data (C_DA of FIG. 31) when the read operation in the operation mode is performed. As an example, the ECC logic circuit 1040 may generate the converted data C_DA including 128 bits generated by adding 8 bits to the corrected read data including 120 bits (CR_DA of FIG. 31). A method of adding the preset bits to the corrected read data (CR_DA of FIG. 31) in the ECC logic circuit 1040 may be variously set according to embodiments. As an example, when the corrected read data (CR_DA of FIG. 31) including 120 bits includes 8 pieces of 15-bit data implemented in a floating-point method, 1 bit may be added to a mantissa part for each piece of the 15-bit data. As another example, when the corrected read data including 120 bits (CR_DA in FIG. 31) includes 8 pieces of 15-bit data implemented in a floating-point method, 1 bit may be added to an exponent part for each piece of the 15-bit data. In this embodiment, the bits added to the corrected read data (CR_DA in FIG. 31) in the ECC logic circuit 1040 may be set to '0', it may be set to '1' or differently for each piece of piece of data implemented in a floating-point method according to embodiments.

The storage region 1050 may receive the write data EW_DA and the write parity WPA generated in the ECC logic circuit 1040 when the write operation in the operation mode is performed. The storage region 1050 may store the write data EW_DA and the write parity WPA in a memory region accessed based on the control of the operation control circuit 1010 when the write operation in the operation mode is performed. The storage region 1050 may apply the read data ER_DA and the read parity RPA to the ECC logic circuit 1040 when the read operation in the operation mode is performed. The storage region 1050 may output the write data EW_DA and the write parity WPA stored in the memory region accessed based on the control of the operation control circuit 1010 as the read data ER_DA and the read parity RPA. The storage region 1050 may include a plurality of memory regions implemented as banks.

The global buffer 1060 may store the buffer data B_DA. The global data 1060 may receive and store the buffer data B_DA input through the data input/output circuit 1030 through a data line 1020. The global buffer 1060 may apply the buffer data B_DA to the MAC operator 1070 through the data line 1020 when a MAC arithmetic operation is performed.

The MAC operator 1070 may receive the converted data C_DA from the ECC logic circuit 1040 and may receive the buffer data B_DA from the global buffer 1060 when a MAC arithmetic operation is performed. In this embodiment, the converted data C_DA may be weight data applied to a neural network circuit, and the buffer data B_DA may be vector data applied to the neural network circuit. According to embodiments, the converted data C_DA may be vector data applied to a neural network circuit, and the buffer data B_DA may be weight data applied to the neural network circuit. The MAC operator 1070 may perform MAC arithmetic operations including a multiplication operation and an addition operation for the converted data C_DA and the buffer data B_DA. The MAC operator 1070 may output the MAC operation result data MRD to the data input/output circuit 1030 through the data line 1020.

Figure 31:
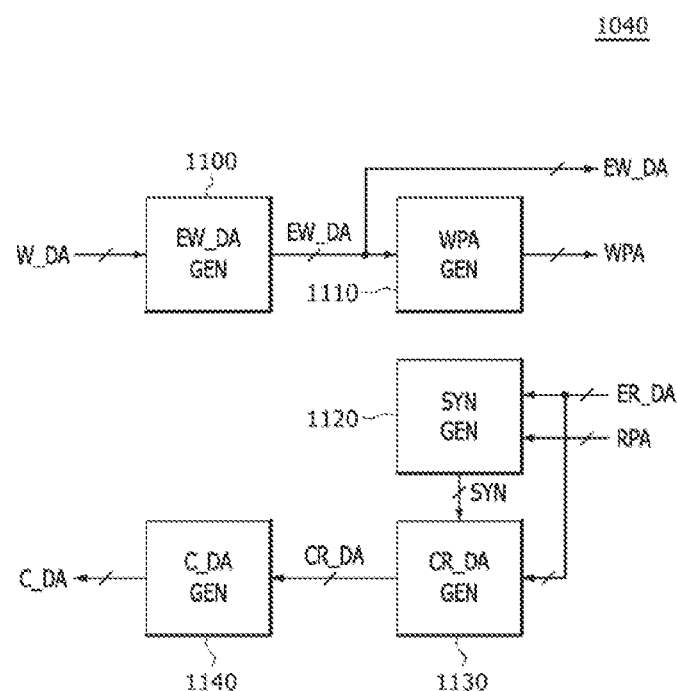
FIG. 31 is a block diagram illustrating a configuration according to an example of an ECC logic circuit included in the PIM device illustrated in FIG. 30.

FIG. 31 is a block illustrating a configuration according to an example of the ECC logic circuit 1040. Referring to FIG. 31, the ECC logic circuit 1040 may include a write data generator (EW_DA GEN) 1100, a write parity generator (WPA GEN) 1110, a syndrome generator (SYN GEN) 1120, a corrected read data generator (CR_DA GEN) 1130, and a converted data generator (C_DA GEN) 1140.

The write data generator 1100 may remove some bits included in the write input data W_DA and generate write data EW_DA, based on the remaining bits when a write operation in an operation mode is performed. As an example, the write data generator 1100 may remove 8 bits from the write input data W_DA including 128 bits and generate the write data EW_DA from the write input data W_DA including the remaining 120 bits.

The write parity generator 1110 may receive the write data EW_DA from the write data generator 1100 when the write operation in the operation mode is performed. The write parity generator 1110 may encode the write data EW_DA to generate the write parity WPA when the write operation in the operation mode is performed. As an example, the write parity generator 1110 may encode the write data EW_DA including 120 bits to generate the write parity WPA including 8 bits when the write operation in the operation mode is performed.

The syndrome generator 1120 may decode read data ER_DA and read parity RPA to generate syndrome SYN when the read operation in the operation mode is performed. As an example, the syndrome generator 1120 may decode the read data ER_DA including 120 bits and the read parity including 8 bits to generate the syndrome including 8 bits.

The corrected read data generator 1130 may receive the syndrome SYN from the syndrome generator 1120 when the read operation in the operation mode is performed. The corrected read data generator 1130 may correct an error included in the read data ER_DA based on the syndrome SYN to generate corrected read data CR_DA when the read operation in the operation mode is performed.

The converted data generator 1140 may receive the corrected read data CR_DA from the corrected read data generator 1130 when the read operation in the operation mode is performed. In an embodiment, the converted data generator 1140 may generate the converted data C_DA, based on the corrected read data CR_DA when the read operation in the operation mode is performed. The converted data generator 1140 may add preset bits to the corrected read data CR_DA to generate the converted data C_DA when the read operation in the operation mode is performed. As an example, the converted data generator 1140 may add 8 bits to the corrected read data CR_DA including 120 bits to generate the converted data C_DA including 128 bits.

Figure 32:
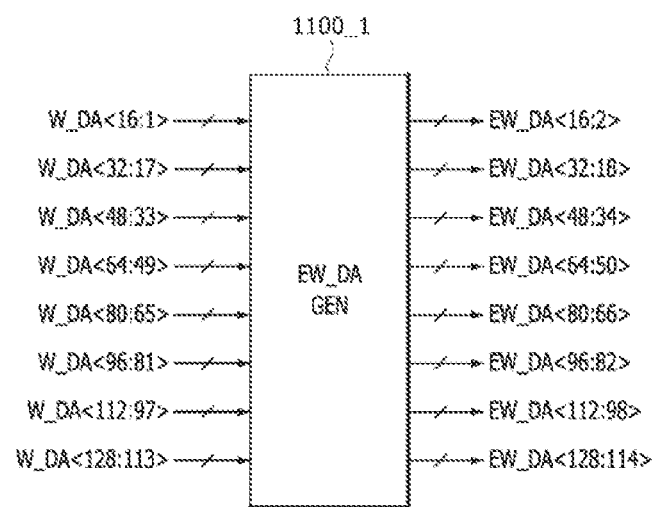
FIG. 32 is a block diagram illustrating a configuration according to an example of a write data generator included in the ECC logic circuit illustrated in FIG. 31.

FIG. 32 is a block diagram illustrating a configuration of a write data generator 1100_1 according to an example of the write data generator 1100. As illustrated in FIG. 32, the write data generator 1100_1 may receive the write input data W_DA including 8 pieces of 16-bit data to generate the write data EW_DA including 8 pieces of 15-bit data. The write data generator 1100_1 may remove 1 bit from first data W_DA<16:1> of the write input data W_DA including 16 bits to generate first data EW_DA<16:2> of the write data EW_DA including 15 bits. In addition, the write data generator 1100_1 may remove 1 bit from the second data W_DA<32:17> of the write input data W_DA including 16 bits to generate second data EW_DA<32:18> of the write data EW_DA including 15 bits. In this way, the write data generator 1100_1 may remove 1 bit from eighth data W_DA<128:113> of the write input data W_DA including 16 bits to generate eighth data EW_DA<128:114> of the write data EW_DA including 15 bits. For example, for each piece of the data from the first data W_DA<16:1> of the write input data W_DA to the eighth data W_DA<128:113> of the write input data W_DA implemented in a floating-point method, 1 bit may be allocated to a sign part, 8 bits may be allocated to an exponent part, and 7 bits may be allocated to a mantissa part. As an example, for each piece of the data from the first data EW_DA<16:2> of the write data EW_DA implemented in a floating-point method to the eighth data EW_DA<128:114> of the write data EW_DA, 1 bit may be allocated to a sign part, 8 bits may be allocated to an exponent part, and 6 bits may be allocated to a mantissa part. As another example, for each piece of the data from the first data EW_DA<16:2> of the write data EW_DA implemented in a floating-point method to the eighth data EW_DA<128:114> of the write data EW_DA, 1 bit may be allocated to the sign part, 7 bits may be allocated to the exponent part, and 7 bits may be allocated to the mantissa part.

The operation of generating the write data EW_DA from the write input data W_DA in the write data generator 1100_1 illustrated in FIG. 32 and the operation of generating the parity WPA in the write parity generator 1110 illustrated in FIG. 31 will be described with reference to FIGS. 33 to 36.

Figure 33:
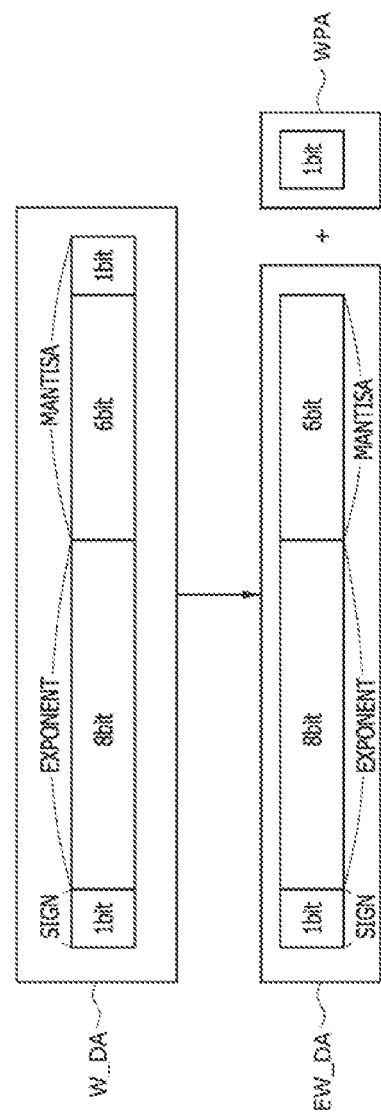
FIGS. 33, 34, 35, and 36 are diagrams illustrating operations of a write data generator and a write parity generator illustrated in FIGS. 31 and 32.

As illustrated in FIG. 33, the write data generator 1100_1 may remove 1 bit from a mantissa part of the write data EW_DA including 16 bits implemented in a floating-point method in which 1 bit is allocated to a sign part, 8 bits are allocated to an exponent part, and 7 bits are allocated to the mantissa part to generate write data EW_DA including 15 bits implemented in a floating-point method in which 1 bit is allocated to the sign part, 8 bits are allocated to the exponent part, and 6 bits are allocated to the mantissa part. The write parity generator 1110 may apply 1 bit of the bits included in the write parity WPA generated by encoding the write data EW_DA to the storage region 1050 together with the write data EW_DA including 15 bits.

Figure 34:
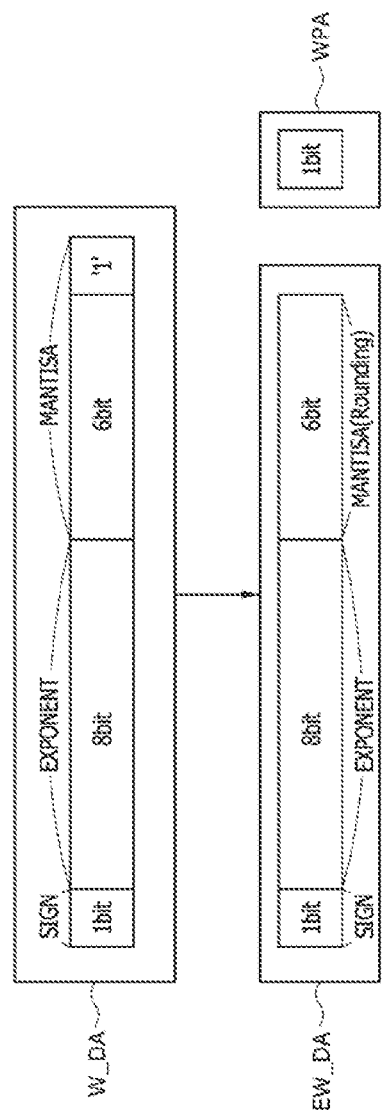

As illustrated in FIG. 34, the write data generator 1100_1 may remove 1 bit from a mantissa part of the write data EW_DA including 16 bits implemented in a floating-point method in which 1 bit is allocated to a sign part, 8 bits are allocated to an exponent part, and 6 bits are allocated to the mantissa part to generate the write data EW_DA including 15 bits implemented in a floating-point method in which 1 bit is allocated to the sign part, 8 bits are allocated to the exponent part, and 6 bits are allocated to the mantissa part. The bit combination of the 6 bits allocated to the mantissa part included in the write data EW_DA may be adjusted according to the 1 bit removed from the mantissa part. As an example, when the removed 1 bit of the mantissa part is '0', the bit combination of the 6 bits allocated to the mantissa part is not adjusted, but when the removed 1 bit of the mantissa part is '1', the bit combination of the 6 bits allocated to the mantissa part may be adjusted by rounding methods. The write parity generator 1110 may apply 1 bit of the bits included in the write parity WPA generated by encoding the write data EW_DA to the storage region 1050 together with the write data EW_DA including 15 bits.

Figure 35:
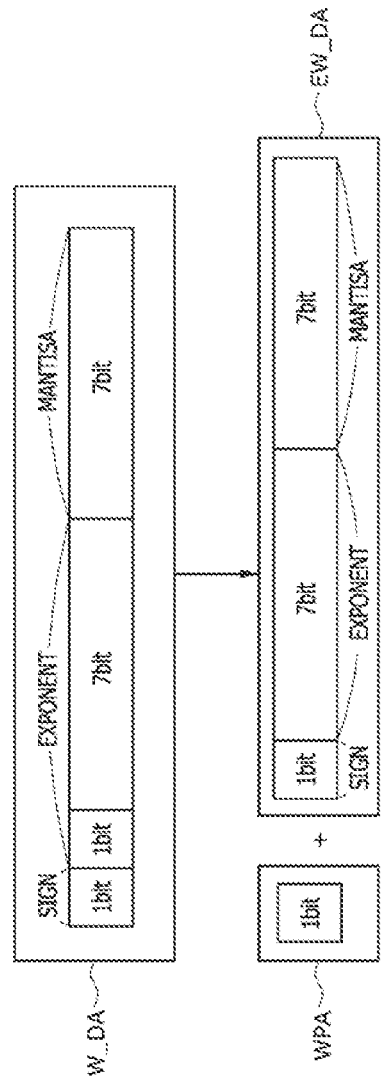

As illustrated in FIG. 35, the write data generator 1100_1 may remove 1 bit from an exponent part of the write data EW_DA including 16 bits implemented in a floating-point method in which 1 bit is allocated to a sign part, 8 bits are allocated to the exponent part, and 7 bits are allocated to a mantissa part to generate the write data EW_DA including 15 bits implemented in a floating-point method in which 1 bit is allocated to the sign part, 7 bits are allocated to the exponent part, and 7 bits are allocated to the mantissa part. The write data generator 1100_1 may apply 1 bit of the bits included in the write parity WPA generated by encoding the write data EW_DA to the storage region 1050 together with the write data EW_DA including 15 bits.

Figure 36:
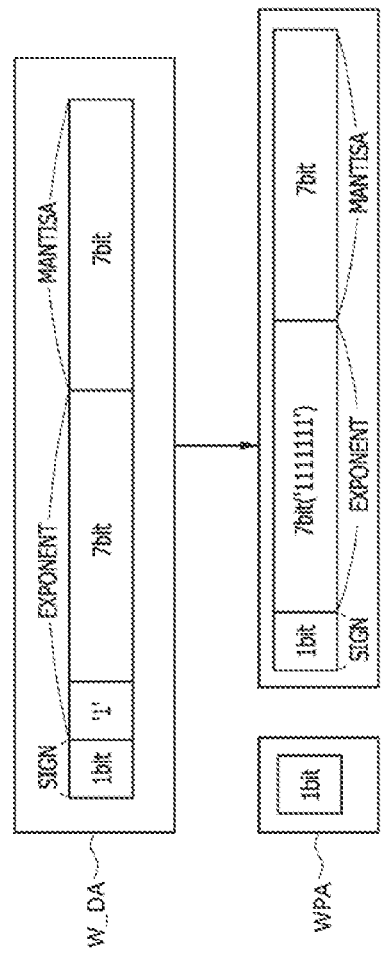

As illustrated in FIG. 36, the write data generator 1100_1 may remove 1 bit from an exponent part of the write data EW_DA including 16 bits implemented in a floating-point method in which 1 bit is allocated to a sign part, 8 bits are allocated to the exponent part, and 7 bits are allocated to a mantissa part to generate the write data EW_DA including 15 bits implemented in a floating-point method in which 1 bit is allocated to the sign part, 7 bits are allocated to the exponent part, and 7 bits are allocated to the mantissa part. The bit combination of the 7 bits allocated to the exponent part included in the write data EW_DA may be adjusted according to the 1 bit removed from the exponent part. For example, when the 1 bit removed from the exponent part is the most significant bit and is '1', the bit combination of the 7 bits allocated to the exponent part may be adjusted to a preset bit combination, '1111111'. The preset bit combination to which the bit combination allocated to the exponent part is adjusted may be variously set according to embodiments. The write parity generator 1100 may apply 1 bit of the bits included in the write parity WPA generated by encoding the write data EW_DA to the storage region 1050 together with the write data EW_DA including 15 bits.

Figure 37:
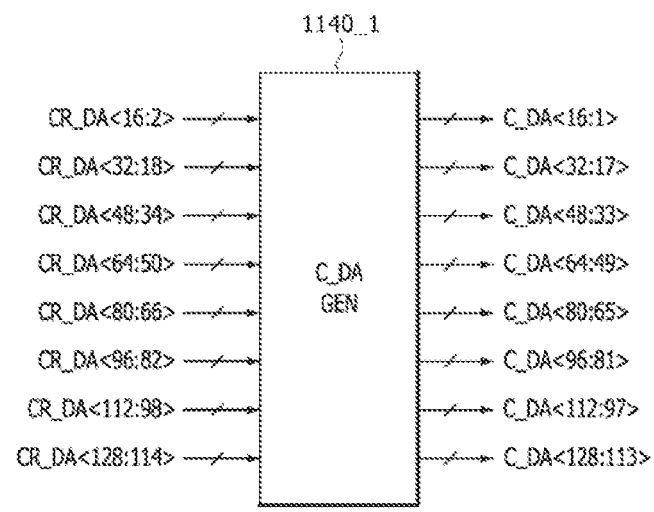
FIG. 37 is a block diagram illustrating a configuration according to an example of a converted data generator included in the ECC logic circuit illustrated in FIG. 31.

FIG. 37 is a block diagram illustrating a configuration of a converted data generator 1140_1 according to an example of the converted data generator 1140. Referring to FIG. 37, the converted data generator 1140_1 may receive corrected read data CR_DA including 8 pieces of 15-bit data to generate converted data C_DA including 8 pieces of 16-bit data. The converted data generator 1140_1 may add 1 bit to first data CR_DA<16:2> of the corrected read data CR_DA including 15 bits to generate first data C_DA<16:1> of the converted data C_DA including 16 bits. In addition, the converted data generator 1140_1 may add 1 bit to second data CR_DA<32:18> of the corrected read data CR_DA including 15 bits to generate second data C_DA<32:17> of the converted data C_DA including 16 bits. In this way, the converted data generator 1140_1 may add 1 bit to eighth data CR_DA<128:114> of the corrected read data CR_DA including 15 bits to generate eighth data C_DA<128:113> of the converted data C_DA including 16 bits. As an example, for each piece of the data from the first data CR_DA<16:2> of the corrected read data CR_DA implemented in a floating-point method to the eighth data CR_DA<128:114> of the corrected read data CR_DA, 1 bit may be allocated to a sign part, 8 bits may be allocated to an exponent part, and 6 bits may be allocated to a mantissa part. As another example, for each piece of the data from the first data CR_DA<16:2> of the corrected read data CR_DA implemented in the floating-point method to the eighth data CR_DA<128:114> of the corrected read data CR_DA, 1 bit may be allocated to the sign part, 7 bits may be allocated to the exponent part, and 7 bits may be allocated to the mantissa part. As an example, for each piece of the data from the first data CR_DA<16:1> of the converted data C_DA implemented in the floating-point method to the eighth data C_DA<128: 113> of the converted data C_DA, 1 bit may be allocated to the sign part, 8 bits may be allocated to the exponent part, and 7 bits may be allocated to the mantissa part.

The operation of generating the converted data C_DA from the corrected read data CR_DA in the converted data generator 1140_1 will be described with reference to FIGS. 38 and 39.

Figure 38:
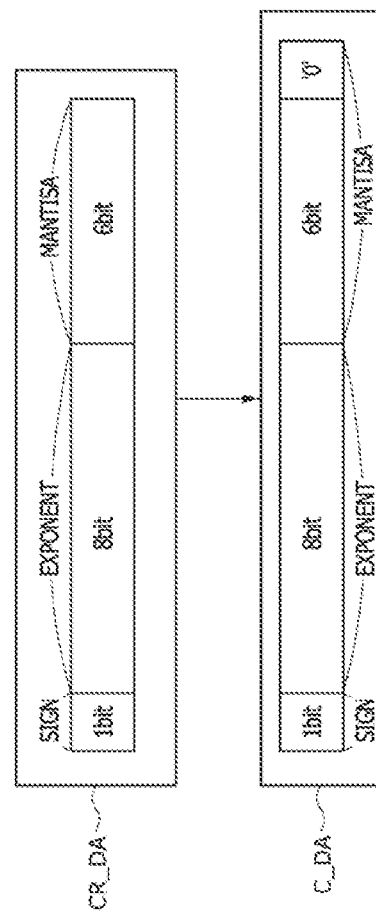
FIGS. 38 and 39 are diagrams illustrating an operation of generating converted data in the converted data generator illustrated in FIG. 37.

As illustrated in FIG. 38, the converted data generator 1140_1 may add 1 bit set to '0' to the mantissa part of the corrected read data CR_DA including 15 bits implemented in a floating-point method in which 1 bit is allocated to a sign part, 8 bits are allocated to an exponent part, and 6 bits are allocated to a mantissa part to generate converted data C_DA including 16 bits implemented in the floating-point method in which 1 bit is allocated to the sign part, 8 bits are allocated to the exponent part, and 7 bits are allocated to the mantissa part.

Figure 39:
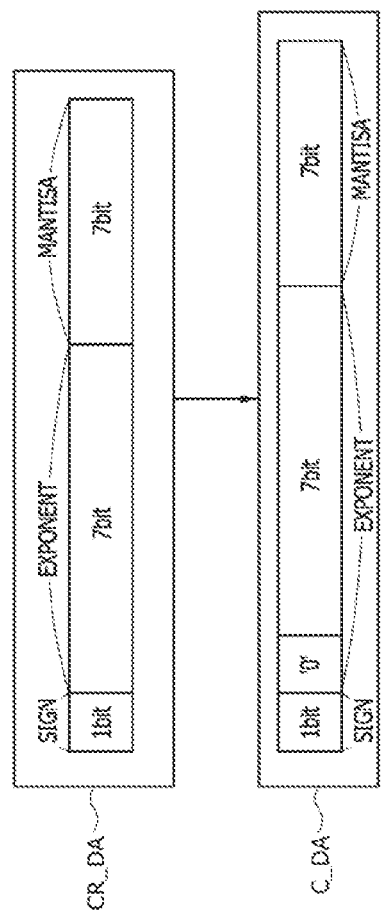

As illustrated in FIG. 39, the converted data generator 1140_1 may add 1 bit set to '0' to the exponent part of the corrected read data CR_DA including 15 bits implemented in a floating-point method in which 1 bit is allocated to a sign part, 7 bits are allocated to an exponent part, and 7 bits are allocated to a mantissa part to generate converted data C_DA including 16 bits implemented in the floating-point method in which 1 bit is allocated to the sign part, 8 bits are allocated to the exponent part, and 7 bits are allocated to the mantissa part.

The PIM device 1000 according to another embodiment of the present disclosure described above may convert some of the bits included in the data into parity to store the same in the storage region 1050, and may correct an error in data used in a MAC arithmetic operation by using the data and parity stored in the storage region 1050, thereby improving the accuracy of the MAC arithmetic operation.

Figure 40:
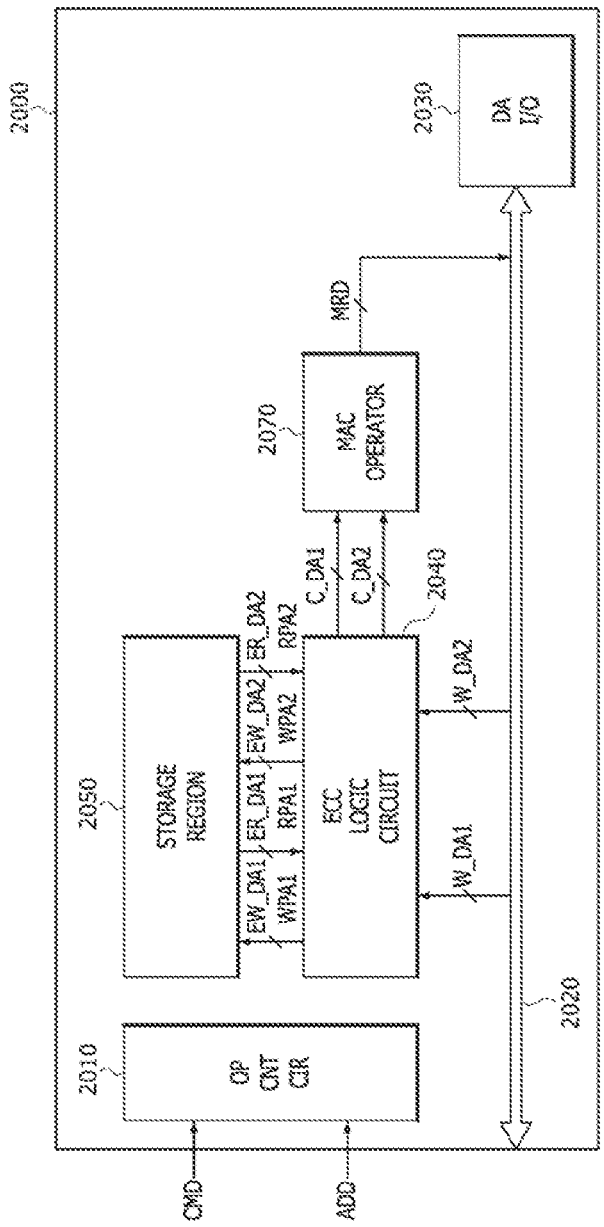
FIG. 40 is a block diagram illustrating a configuration of a PIM device according to yet another embodiment of the present disclosure.

FIG. 40 is a block diagram illustrating a configuration of a PIM device 2000 according to another embodiment of the present disclosure. Referring to FIG. 40, the PIM device 2000 may include an operation control circuit (OP CNT CTR) 2010, a data line 2020, a data input/output circuit (DA I/O) 2030, an ECC logic circuit 2040, a storage region 2050, and a MAC operator 2070.

The operation control circuit 2010 may control the ECC logic circuit 2040 and the storage region 2050 when a write operation in an operation mode is performed. The operation control circuit 2010 may control the ECC logic circuit 2040 so that first write data EW_DA1, first write parity WPA1, second write data EW_DA2, and second write parity WPA2 are generated from first write input data W_DA1 and second write input data W_DA2 when the write operation in the operation mode is performed. The operation control circuit 2010 may control the storage region 2050 to receive and store the first write data EW_DA1, the first write parity WPA1, the second write data EW_DA2, and the second write parity WPA2 generated in the ECC logic circuit 2040 when the write operation in the operation mode is performed. The operation control circuit 2010 may include a command decoder (not illustrated) that decodes a command CMD, an address decoder (not illustrated) that decodes an address ADD, and input/output control circuits (not illustrated) that control data to be input/output in/from the storage region 2050.

The operation control circuit 2010 may control the ECC logic circuit 2040 and the storage region 2050 when a read operation in an operation is performed. The operation control circuit 2010 may control the storage region 2050 so that first read data ER_DA1, first read parity RPA1, second read data ER_DA1, and second read parity RPA2 are output when the read operation in the operation is performed. The operation control circuit 2010 may control the ECC logic circuit 2040 so that first converted data C_DA1 and second converted data C_DA2 are generated from the first read data ER_DA1, the first read parity RPA1, the second read data ER_DA1, and the second read parity RPA2 when the read operation in the operation is performed.

The operation control circuit 2010 may control the MAC operator 2070 when a MAC arithmetic operation in an operation mode is performed. The operation control circuit 2010 may control the MAC operator 2070 so that a MAC arithmetic operation for the first converted data C_DA1 and the second converted data C_DA2 are performed when the MAC arithmetic operation in the operation mode is performed.

The ECC logic circuit 2040 may receive the first write input data W_DA1 and the second write input data W_DA2 input through the data input/output circuit 2030 when the MAC arithmetic operation in the operation mode is performed, through the data line 2020. The ECC logic circuit 2040 may remove some of the bits included in the first write input data W_DA1 and the second write input data W_DA2 to generate the first write data EW_DA1 and the second write data EW_DA2, based on the remaining bits when the write operation in the operation mode is performed. As an example, the ECC logic circuit 2040 may remove 8 bits from each piece of the first write input data W_DA1 and the second write input data W_DA2, and generate the first write data EW_DA1 and the second write data EW_DA2 from the remaining first write input data W_DA1 and the second write input data W_DA2 respectively including the remaining 120 bits.

The ECC logic circuit 2040 may generate first write parity WPA1 and second write parity WPA2, based on the first write data EW_DA1 and the second write data EW_DA2 when the write operation in the operation mode is performed. The ECC logic circuit 2040 may encode the first write data EW_DA1 and the second write data EW_DA2 to generate the first write parity WPA1 and second write parity WPA2. As an example, the ECC logic circuit 2040 may encode each piece of the first write data EW_DA1 and the second write data EW_DA2 including 120 bits to generate the first write parity WPA1 and second write parity WPA2 including 8 bits, respectively, when the write operation in the operation mode is performed. The ECC logic circuit 2040 may apply the first write data EW_DA1, the second write data EW_DA2, the first write parity WPA1, and the second write parity WPA2 to the storage region 2050, based on the control of the operation control circuit 2010 when the write operation in the operation mode is performed.

The ECC logic circuit 2040 may receive the first read data EW_DA1, the second read data ER_DA2, the first read parity RPA1, and the second read parity RP2 from the storage region 2050 when the read operation in the operation mode is performed. The first read data EW_DA1 and the second read data ER_DA2 may be the same data as the first write data EW_DA1 and the second write data EW_DA2 stored when the write operation in the operation mode is performed. The first read parity RPA1 and the second read parity RP2 may be the same data as the first write parity WPA1 and the second write parity WPA2 stored when the write operation in the operation mode is performed.

The ECC logic circuit 2040 may generate first syndrome (SYN1 of FIG. 41) and second syndrome (SYN2 of FIG. 41), based on the first read data ER_DA1, the second read data ER_DA2, the first read parity RPA1, and the second read parity RPA2 when the read operation in the operation mode is performed. The ECC logic circuit 2040 may decode the first read data ER_DA1 and the first read parity RPA1 to generate the first syndrome (SYN1 of FIG. 41). The ECC logic circuit 2040 may decode the second read data ER_DA2 and the second read parity RPA2 to generate the second syndrome (SYN2 of FIG. 41). As an example, the ECC logic circuit 2040 may decode the first read data ER_DA1 including 120 bits and the first read parity RPA1 including 8 bits to generate the first syndrome (SYN1 of FIG. 41) including 8 bits when the read operation in the operation mode is performed. The ECC logic circuit 2040 may correct an error included in the first read data ER_DA1 based on the first syndrome (SYN1 of FIG. 41) to generate first corrected read data (CR_DA2 of FIG. 41). As an example, the ECC logic circuit 2040 may decode the second read data ER_DA2 including 120 bits and the second read parity RPA2 including 8 bits to generate the second syndrome (SYN2 of FIG. 41) including 8 bits when the read operation in the operation mode is performed. The ECC logic circuit 2040 may correct an error included in the second read data ER_DA2 based on the second syndrome (SYN2 of FIG. 41) to generate second corrected read data (CR_DA2 of FIG. 41).

The ECC logic circuit 2040 may generate first converted data C_DA1 and second converted data C_DA2, based on the first corrected read data (CR_DA1 of FIG. 41) and the second corrected read data (CR_DA2 of FIG. 41) when the read operation in the operation mode is performed. The ECC logic circuit 2040 may add 8 bits to the first corrected read data CR_DA1 including 120 bits to generate the first converted data C_DA1 including 128 bits. As an example, the ECC logic circuit 2040 may generate the first converted data C_DA1 including 128 bits generated by adding 8 bits to the first corrected read data CR_DA1 including 120 bits. The ECC logic circuit 2040 may add preset bits to the second corrected read data (CR_DA2 of FIG. 41) to generate the second converted data C_DA2 when the read operation in the operation mode is performed. As an example, the ECC logic circuit 2040 may generate the second converted data C_DA2 including 128 bits generated by adding 8 bits to the second corrected read data CR_DA2 including 120 bits.

The storage region 2050 may receive the first write data EW_DA1, the second write data EW_DA2, the first write parity WPA1, and the second write parity WPA2 generated in the ECC logic circuit 2040 when the write operation in the operation mode is performed. The storage region 2050 may store the first write data EW_DA1, the second write data EW_DA2, the first write parity WPA1, and the second write parity WPA2 in a memory region accessed based on the control of the operation control circuit 1020 when the write operation in the operation mode is performed. The storage region 2050 may apply the first write data EW_DA1, the second write data EW_DA2, the first write parity WPA1, and the second write parity WPA2 to the EC logic circuit 2040 when the read operation in the operation mode is performed. The storage region 2050 may output the first write data EW_DA1, the second write data EW_DA2, the first write parity WPA1, and the second write parity WPA2 stored in the memory region accessed based on the control of the operation control circuit 2010 as the first read data ER_DA1, the second read data ER_DA2, the first read parity RPA1, and the second read parity RPA2 when the read operation in the operation mode is performed. The storage region 2050 may include a plurality of memory regions implemented as banks.

The MAC operator 2070 may receive the first converted data C_DA1 and the second converted data C_D2 from the ECC logic circuit 2040 when the MAC arithmetic operation is performed. In this embodiment, the first converted data C_DA1 may be weight data applied to a neural network, and the second converted data C_D2 may be vector data applied to the neural network. According to embodiments, the first converted data C_DA1 may be vector data applied to the neural network, and the second converted data C_D2 may be weight data applied to the neural network. The MAC operator 2070 may perform MAC arithmetic operations including a multiplication operation and an addition operation for the first converted data C_DA1 and the second converted data C_DA2 to generate MAC operation result data MRD. The MAC operator 2070 may output the MAC operation result data MRD to the data input/output circuit 2030 through the data line 2020.

Figure 41:
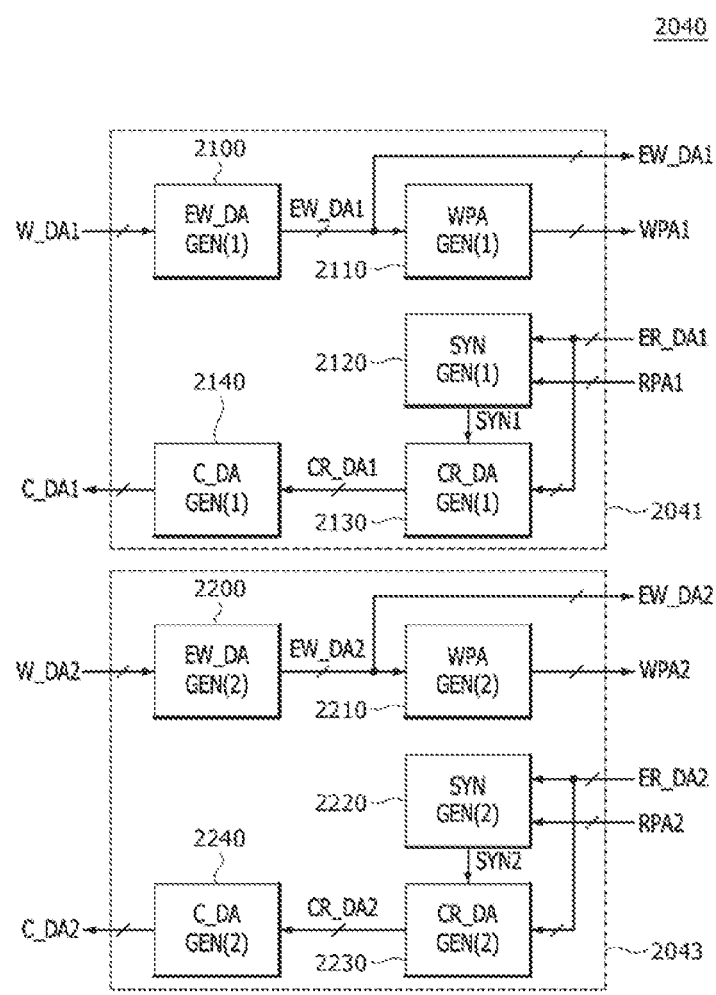
FIG. 41 is a block diagram illustrating a configuration according to an example of an ECC logic circuit included in the PIM device illustrated in FIG. 40.

FIG. 41 is a block diagram illustrating a configuration according to an example of the ECC logic circuit 2040. As illustrated in FIG. 41, the ECC logic circuit 2040 may include a first ECC logic circuit 2041 and a second ECC logic circuit 2043. The first ECC logic circuit 2041 may include a first write data generator (EW_DA GEN(1)) 2100, a first write parity generator (WPA GEN(1)) 2110, a first syndrome generator (SYN GEN(1)) 2120, a first corrected data generator (CR_DA GEN(1)) 2130, and a first converted data generator (C_DA GEN(1)) 2140. The second ECC logic circuit 2043 may include a second write data generator (EW_DA GEN(2)) 2200, a second write parity generator (WPA GEN(2)) 2210, a second syndrome generator (SYN GEN(2)) 2220, a second corrected data generator (CR_DA GEN(2)) 2230, and a second converted data generator (C_DA GEN(2)) 2240.

The first write data generator 2100 may remove some of the bits included in first write input data W_DA1 and generate first write data EW_DA1, based on the remaining bits when a write operation in an operation mode is performed. As an example, the first write data generator 2100 may remove 8 bits from the first write input data W_DA1 including 128 bits and generate the first write data EW_DA1 from the first write input data W_DA1 including the remaining 120 bits.

The first write parity generator 2110 may receive the first write data EW_DA1 from the first write data generator 2100 when the write operation in the operation mode is performed. The first write parity generator 2110 may encode the first write data EW_DA1 to generate the first write parity WPA1 when the write operation in the operation mode is performed. As an example, the first write parity generator 2110 may encode the first write data EW_DA1 including 120 bits to generate the first write parity WPA1 including 8 bits when the write operation in the operation mode is performed.

The first syndrome generator 2120 may decode the first read data ER_DA1 and the first read parity RPA1 to generate the first syndrome SYN1 when a read operation in an operation mode is performed. As an example, the first syndrome generator 2120 may decode the first read data ER_DA1 including 120 bits and the first read parity RPA1 including 8 bits to generate the first syndrome SYN1 including 8 bits when the read operation in the operation mode is performed.

The first corrected data generator 2130 may receive the first syndrome SYN1 from the first syndrome generator 2120 when a read operation in an operation mode is performed. The first corrected data generator 2130 may correct an error included in the first read data ER_DA1 based on first syndrome SYN1 to generate first corrected read data CR_DA1 when the read operation in the operation mode is performed.

The first converted data generator 2140 may receive the first corrected read data CR_DA1 from the first corrected read data generator 2130 when the read operation in the operation mode is performed. The first converted data generator 2140 may add preset bits to the first corrected read data CR_DA1 to generate the first converted data C_DA1 when the read operation in the operation mode is performed. As an example, the first converted data generator 2140 may generate the first converted data C_DA1 including 128 bits generated by adding 8 bits to the first corrected read data CR_DA1 including 120 bits.

The second write data generator 2200 may remove some of bits included in the second write input data W_DA2 and generate second write data EW_DA2, based on the remaining bits when the write operation in the operation mode is performed. As an example, the second write data generator 2200 may remove 8 bits from the second write input data W_DA2 including 128 bits and generate the second write data EW_DA2 from the second write input data W_DA2 including the remaining 120 bits.

The second write parity generator 2210 may receive the second write data EW_DA2 from the second write data generator 2200 when the write operation in the operation mode is performed. The second write parity generator 2210 may encode the second write data EW_DA2 to generate the second write parity WPA2 when the write operation in the operation mode is performed. As an example, the second write parity generator 2210 may encode the second write data EW_DA2 including 120 bits to generate the second write parity WPA2 including 8 bits when the write operation in the operation mode is performed.

The second syndrome generator 2220 may decode the second read data ER_DA2 and the second read parity RPA2 to generate the second syndrome SYN2 when the read operation in the operation mode is performed. As an example, the second syndrome generator 2220 may decode the second read data ER_DA2 including 120 bits and the second read parity RPA2 including 8 bits to generate the second syndrome SYN2 including 8 bits when the read operation in the operation mode is performed.

The second corrected data generator 2230 may receive the second syndrome SYN2 from the second syndrome generator 2220 when the read operation in the operation mode is performed. The second corrected data generator 2230 may correct an error included in the second read data ER_DA2 based on second syndrome SYN2 to generate the second corrected read data CR_DA2 when the read operation in the operation mode is performed.

The second converted data generator 2240 may receive the second corrected read data CR_DA2 from the second corrected read data generator 2230 when the read operation in the operation mode is performed. The second converted data generator 2240 may add preset bits to the second corrected read data CR_DA2 to generate the second converted data C_DA2 when the read operation in the operation mode is performed. As an example, the second converted data generator 2240 may generate the second converted data C_DA2 including 128 bits generated by adding 8 bits to the second corrected read data CR_DA2 including 120 bits.

The PIM device 2000 according to another embodiment of the present disclosure described above may convert some of the bits included in data into parity, store the same in the storage region 2050, and utilize the data and parity stored in the storage region 2050 to correct an error of the data used in the MAC arithmetic operation, thereby improving the accuracy of the MAC arithmetic operation.

Figure 42:
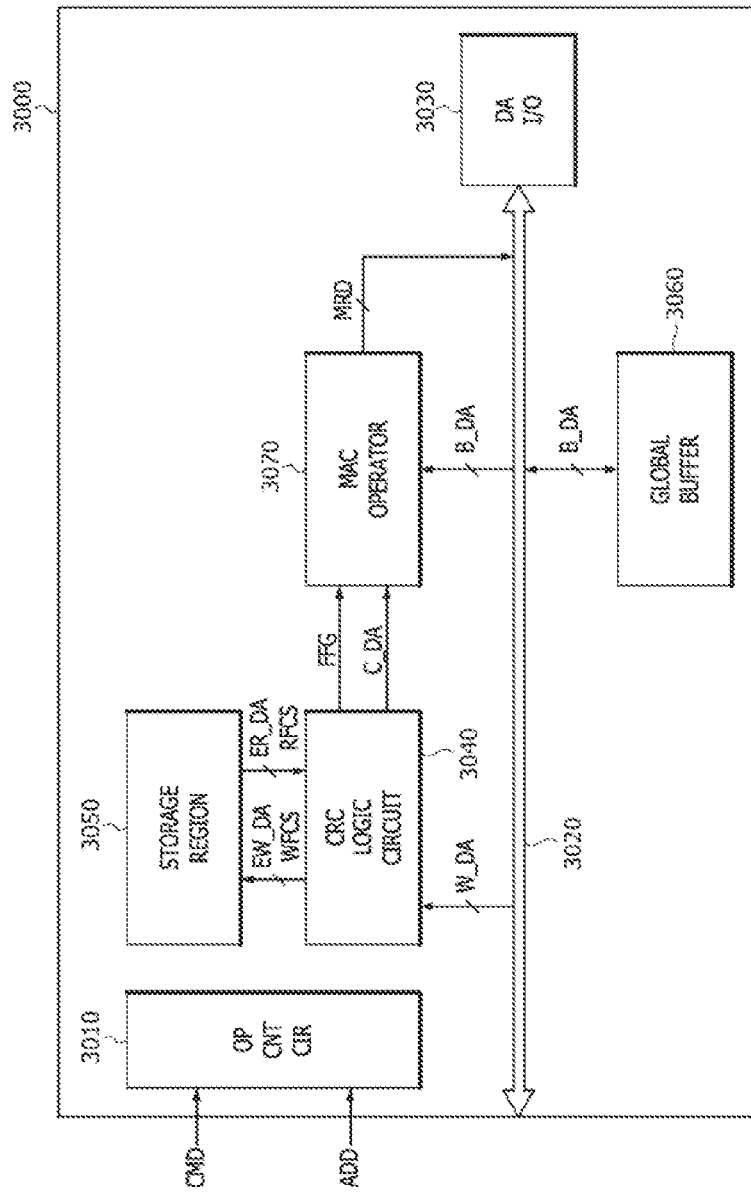
FIG. 42 is a block diagram illustrating a configuration of a PIM device according to yet another embodiment of the present disclosure.

FIG. 42 is a block diagram illustrating a configuration of a PIM device 3000 according to another embodiment of the present disclosure. Referring to FIG. 42, the PIM device 3000 may include an operation control circuit (OP CNT CTR) 3010, a data input/output circuit (DA I/O) 3030, a cyclic redundancy checking (CRC) logic circuit 3040, a storage region 3050, a global buffer 3060, and a MAC operator 3070.

The operation control circuit 3010 may control the CRC logic circuit 3040 and the storage region 3050 when a write operation in an operation mode is performed. The operation control circuit 3010 may control the CRC logic circuit 3040 so that write data EW_DA and a write fail chick signal WFCS are generated from write input data W_DA when the write operation in the operation mode is performed. The operation control circuit 3010 may control the storage region 3050 to receive and store the write data EW_DA and the write fail check signal WFCS generated in the CRC logic circuit 3040 when the write operation in the operation mode is performed. The operation control circuit 3010 may include a command decoder (not illustrated) that decodes a command CMD, an address decode (not illustrated) that decodes an address ADD, and input/output control circuits (not illustrated) that control data to be input/output in/from the storage region 3050.

The operation control circuit 3010 may control the CRC logic circuit 3040 and the storage region 3050 when a read operation in an operation mode is performed. The operation control circuit 3010 may control the storage region 3050 so that read data ER_DA and a read fail check signal RFCS are output when the read operation in the operation mode is performed. The operation control circuit 3010 may control the CRC logic circuit 3040 so that a fail flag FFG and converted data C_DA are generated from the read data ER_DA and the read fail check signal RFCS when the read operation in the operation mode is performed.

The operation control circuit 3010 may control the MAC operator 3070 when a MAC arithmetic operation in an operation mode is performed. The operation control circuit 3010 may control the MAC operator 3070 so that MAC arithmetic operations for the converted data C_DA and buffer data B_DA are performed when the MAC arithmetic operation in the operation mode is performed.

The CRC logic circuit 3040 may receive the write input data W_DA input through the data input/output circuit 3030 when the write operation in the operation mode is performed through the data line 3020. The CRC logic circuit 3040 may remove some of bits included in the write input data W_DA and generate the write data EW_DA, based on the remaining bits when the write operation in the operation mode is performed. As an example, the CRC logic circuit 3040 may remove 8 bits from the write input data W_DA including 128 bits and generate the write data W_DA from the write input data W_DA including 120 bits. Some bits removed from the bits included in the write input data W_DA in the CRC logic circuit 3040 may be variously set according to embodiments. As an example, when the write input data W_DA including 128 bits includes 8 pieces of 16-bit data implemented in a floating-point method, 1 bit included in a mantissa part may be removed for each piece of the 16-bit data. As another example, when the write input data W_DA including 128 bits includes 8 pieces of 16-bit data implemented in the floating-point method, 1 bit included in an exponent part may be removed for each piece of the 16-bit data. The method of generating the write data EW_DA from the write input data W_DA including remaining bits after some bits are removed in the CRC logic circuit 3040 may be variously set according to embodiments. As an example, when 8 bits are removed from the write input data W_DA including 128 bits, the write input data W_DA including the remaining 120 bits may be output. As another example, when 8 bits are removed from the write input data W_DA including 128 bits and the remaining write input data W_DA includes 8 pieces of 15-bits data implemented in the floating-point method, the bit combination of the bits included in the mantissa part may be adjusted by rounding methods according to the removed bits for each piece of the remaining 15-bit data, and the write input data W_DA including 120 bits whose bit combination is adjusted may be output as the write data EW_DA. As another example, when 8 bits are removed from the write input data W_DA including 128 bits and the remaining write input data W_DA includes 8 pieces of 15-bit data implemented in the floating-point method, the bit combination of the bits included in the exponent part may be adjusted to a preset bit combination according to the removed bits for each piece of the remaining 15-bit data, and the write input data W_DA including 120 bits whose bit combination is adjusted may be output as the write data EW_DA.

The CRC logic circuit 3040 may generate the write fail check signal WFCS, based on the write data EW_DA when the write operation in the operation mode is performed. The CRC logic circuit 3040 may encode the write data EW_DA to generate the write fail check signal WFCS. In encoding the write data EW_DA to generate the write fail check signal WFCS in the CRC logic circuit 3040, the cyclic redundancy check (CRC) may be used. Encoding according to the CRC may be performed in a method in which '0' is added to the write data EW_DA as many as the number of bits 1 bit less than the number of bits of the divisor code, and the remainder calculated when '0' is added to the write data EW_DA divided by the divisor code is generated as the write fail check signal WFCS. As an example, the CRC logic circuit 3040 may encode the write data EW_DA including 120 bits to generate the write fail check signal WFCS including 8 bits when the write operation in the operation mode is performed. The CRC logic circuit 3040 may apply the write data EW_DA and the write fail check signal WFCS to the storage region 3050, based on the control of the operation control circuit 3010 when the write operation in the operation mode is performed.

The CRC logic circuit 3040 may receive the read data ER_DA and the read fail check signal RFCS from the storage region 3050 when the read operation in the operation mode is performed. The read data ER_DA may be the same data as the write data EW_DA stored when the write operation in the operation mode is performed. The read fail check signal RFCS may be the same data as the write fail check data WFCS stored when the write operation in the operation mode is performed.

The CRC logic circuit 3040 may generate the fail flag FFG and the converted data C_DA, based on the read data ER_DA and the read fail check signal RFCS when the read operation in the operation mode is performed. The CRC logic circuit 3040 may decode the read data ER_DA and the read fail check signal RFCS to generate the fail flag signal FFG. In decoding the read data ER_DA and the read fail check signal RFCS to generate the fail flag signal FFG in the CRC logic circuit 3040, the CRC may be used. Decoding according to the CRC may be performed in a method in which the read data ER_DA and the read fail check signal RFCS are divided by a divisor code. As an example, the CRC logic circuit 3040 may decode the read data ER_DA including 120 bits and the read fail check signal RFCS including 8 bits to generate the read fail flag signal FFG including 8 bits when the read operation in the operation mode is performed. The fail flag signal FFG may be activated to express that a defect is included in the read data ER_DA in a case that the remainder is not '0' when the read data ER_DA and the read fail check signal RFCS are divided by the divisor code.

The CRC logic circuit 3040 may generate the converted data C_DA from the read data ER_DA when the read operation in the operation mode is performed. The CRC logic circuit 3040 may add preset bits to the read data ER_DA to generate the converted data C_DA when the read operation in the operation mode is performed. As an example, the CRC logic circuit 3040 may generate the converted data C_DA including 128 bits generated by adding 8 bits to the read data ER_DA including 120 bits. The method of adding the preset bits to the read data ER_DA in the CRC logic circuit 3040 may be variously set according to embodiments. As an example, when the read data ER_DA including 120 bits includes 8 pieces of 15-bit data implemented in the floating-point method, 1 bit may be added to a mantissa part for each piece of the 15-bit data. As another example, when the read data ER_DA including 120 bits includes 8 pieces of 15-bit data implemented in the floating-point method, 1 bit included in an exponent part may be added for each piece of the 15-bit data. In this embodiment, the bits added to the read data ER_DA in the CRC logic circuit 3040 may be set to '0', but depending on embodiments, the bits may be set to '1' or set differently for each piece of the data implemented in the floating-point method.

The storage region 3050 may receive the write data EW_DA and the write fail check signal WFCS generated in the CRC logic circuit 3040 when the write operation in the operation mode is performed. The storage region 3050 may store the write data EW_DA and the write fail check signal WFCS in the memory region accessed based on the control of the operation control circuit 3010 when the write operation in the operation mode is performed. The storage region 3050 may apply the write data EW_DA and the write fail check signal WFCS to the CRC logic circuit 3040 when the read operation in the operation mode is performed. The storage region 3050 may output the write data EW_DA and the write fail check signal WFCS stored in the memory region accessed based on the control of the operation control circuit 3010 as the read data ER_DA and the read fail check signal RFCS when the read operation in the operation mode is performed. The storage region 3050 may include a plurality of memory regions implemented as banks.

The global buffer 3060 may store the buffer data B_DA. The global buffer 3060 may receive and store the buffer data B_DA input through the data input/output circuit 3030 through the data line 3020. The global buffer 3060 may apply the buffer data B_DA to the MAC operator 3070 through the data line 3020 when a MAC arithmetic operation is performed.

The MAC operator 3070 may receive the fail flag signal FFG and the converted data C_DA from the CRC logic circuit 3040 and may receive the buffer data B_DA from the global buffer 3060 when the MAC arithmetic operation is performed. In this embodiment, the converted data C_DA may be weight data applied to a neural network circuit, and the buffer data B_DA may be vector data applied to the neural network circuit. According to embodiments, the converted data C_DA may be vector data applied to the neural network circuit, and the buffer data B_DA may be weight data applied to the neural network circuit. The MAC operator 3070 may perform MAC arithmetic operations including multiplication and addition operations on the converted data C_DA and the buffer data B_DA, based on the fail flag signal FFG to generate MAC operation result data MRD. The MAC operator 3070 may be set so that at least one of the multiplication and addition operations on the converted data C_DA and the buffer data B_DA when a defect is included in the read data ER_DA and the fail flag signal FFG is activated. The MAC operator 3070 may output the MAC operation result MRD to the data input/output circuit 3030 through the data line 3020.

Figure 43:
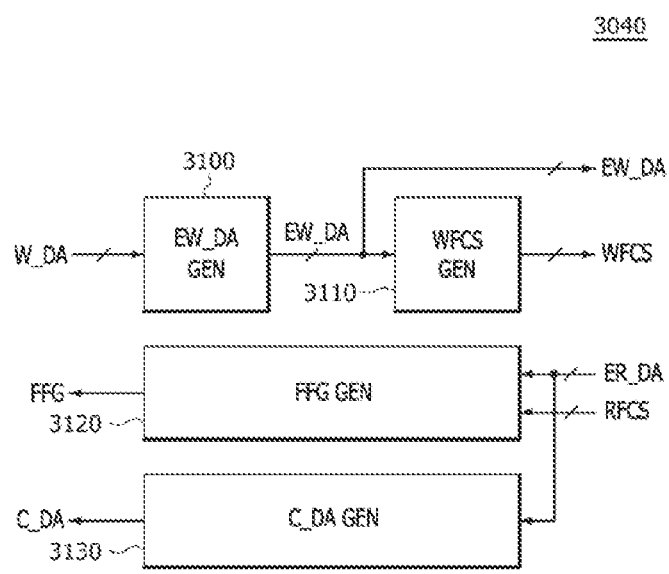
FIG. 43 is a block diagram illustrating a configuration according to an example of a CRC logic circuit included in the PIM device illustrated in FIG. 42.

FIG. 43 is a block diagram illustrating a configuration according to an example of the CRC logic circuit 3040. Referring to FIG. 43, the CRC logic circuit 3040 may include a write data generator (EW_DA GEN) 3100, a write fail check signal generator (WFCS GEN) 3110, a fail flag signal generator (FFG GEN) 3120, and a converted data generator (C_DA GEN) 3130.

The write data generator 3100 may remove some of bits included in write input data W_DA and generate write data EW_DA, based on the remaining bits when a write operation in an operation mode is performed. As an example, the write data generator 3100 may remove 8 bits from the write input data W_DA including 128 bits and generate the write data EW_DA from the write input data W_DA including 120 bits.

The write fail check signal generator 3110 may receive the write data EW_DA from the write data generator 3100 when the write operation in the operation mode is performed. The write fail check signal generator 3110 may encode the write data EW_DA to generate a write fail check signal WFCS when the write operation in the operation mode is performed. As an example, the write fail check signal generator 3110 may encode the write data EW_DA including 120 bits to generate the write fail check signal WFCS including 8 bits when the write operation in the operation mode is performed.

The fail flag signal generator 3120 may decode read data ER_DA and read fail check signal RFCS to generate the fail flag signal FFG when a read operation in an operation mode is performed. As an example, the fail flag signal generator 3120 may decode the read data ER_DA including 120 bits and the read fail check signal RFCS including 8 bits to generate the fail flag signal FFG including 8 bits when the read operation in the operation mode is performed.

The converted data generator 3130 may add preset bits to the read data ER_DA to generate converted data C_DA when the read operation in the operation mode is performed. As an example, the converted data generator 3130 may generate the converted data C_DA including 128 bits generated by adding 8 bits to the read data ER_DA including 20 bits.

The operation of generating the write data EW_DA from the write input data W_DA in the write data generator 3100 illustrated in FIG. 43 and the operation of generating the write fail check signal WFCS in the write fail check signal generator 3110 illustrated in FIG. 43 will be described with reference to FIGS. 44 to 47.

Figure 44:
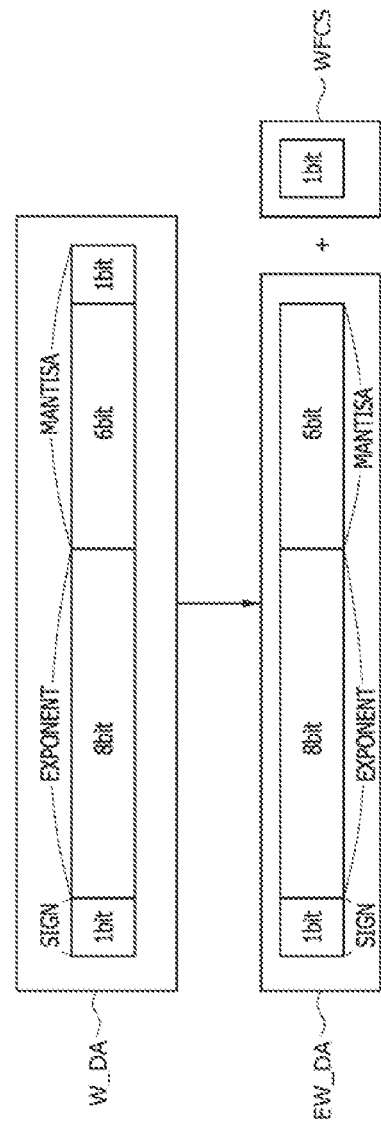
FIGS. 44 to 47 are diagrams illustrating operations of a write data generator and a write fail check signal generator included in the CRC logic circuit illustrated in FIG. 43.

As illustrated in FIG. 44, the write data generator 3100 may remove 1 bit from a mantissa part of the write input data W_DA including 16 bits implemented in a floating-point method in which 1 bit is allocated to a sign part, 8 bits are allocated to an exponent part, and 7 bits are allocated to a mantissa part to generate the write data EW_DA including 15 bits implemented in the floating-point method in which 1 bit is allocated to the sign part, 8 bits are allocated to the exponent part, and 6 bits are allocated to the mantissa part. The write parity generator 3110 may apply 1 bit of the bits included in the write fail check signal WFCS generated by encoding the write data EW_DA to the storage region 3050 together with the write data EW_DA including 15 bits.

Figure 45:
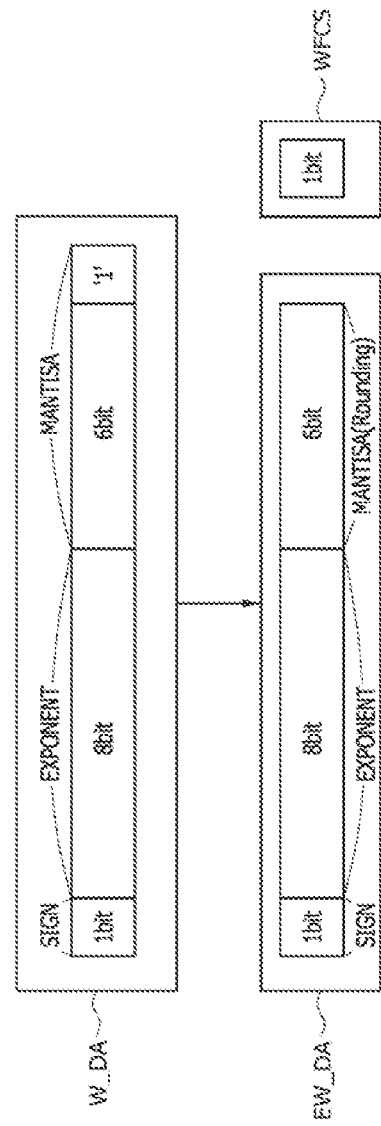

As illustrated in FIG. 45, the write data generator 3100 may remove 1 bit from the mantissa part of the write input data W_DA including 16 bits implemented in the floating-point method in which 1 bit is allocated to the sign part, 8 bits are allocated to the exponent part, and 7 bits are allocated to the mantissa part to generate the write data EW_DA including 15 bits implemented in the floating-point method in which 1 bit is allocated to the sign part, 8 bits are allocated to the exponent part, and 6 bits are allocated to the mantissa part. The bit combination of the 6 bits allocated to the mantissa part included in the write data EW_DA may be adjusted according to the removed 1 bit of the mantissa part. As an example, when the removed bit of the mantissa part is '0', the bit combination of the 6 bits allocated to the mantissa part might not be adjusted, but when the removed bit of the mantissa part is '1', the bit combination of the 6 bits allocated to the mantissa part may be adjusted by rounding methods. The write parity generator 3110 may apply 1 bit of the bits included in the write fail check signal WFCS generated by encoding the write data EW_DA to the storage region 3050 together with the write data EW_DA including 15 bits.

Figure 46:
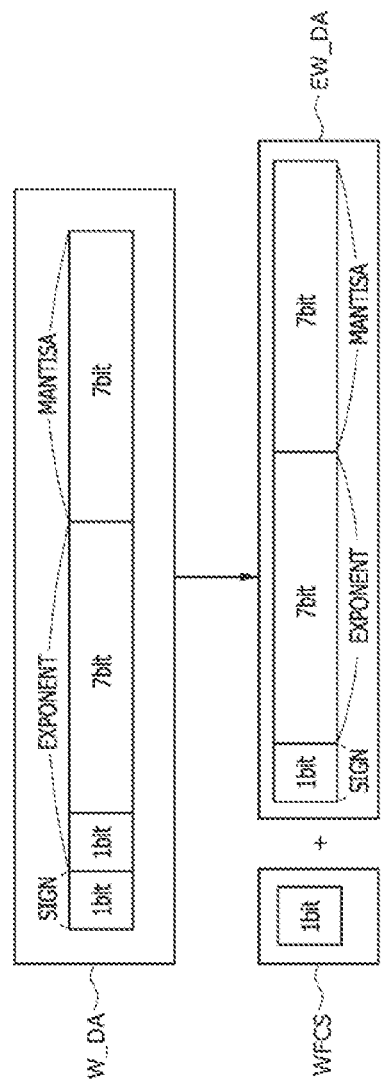

As illustrated in FIG. 46, the write data generator 3100 may remove 1 bit from the exponent part of the write input data W_DA including 16 bits implemented in a floating-point method in which 1 bit is allocated to a sign part, 8 bits are allocated to an exponent part, and 7 bits are allocated to a mantissa part to generate the write data EW_DA including 15 bits implemented in the floating-point method in which 1 bit is allocated to the sign part, 7 bits are allocated to the exponent part, and 7 bits are allocated to the mantissa part. The write parity generator 3110 may apply 1 bit of the bits included in the write fail check signal WFCS generated by encoding the write data EW_DA to the storage region 3050 together with the write data EW_DA including 15 bits.

Figure 47:
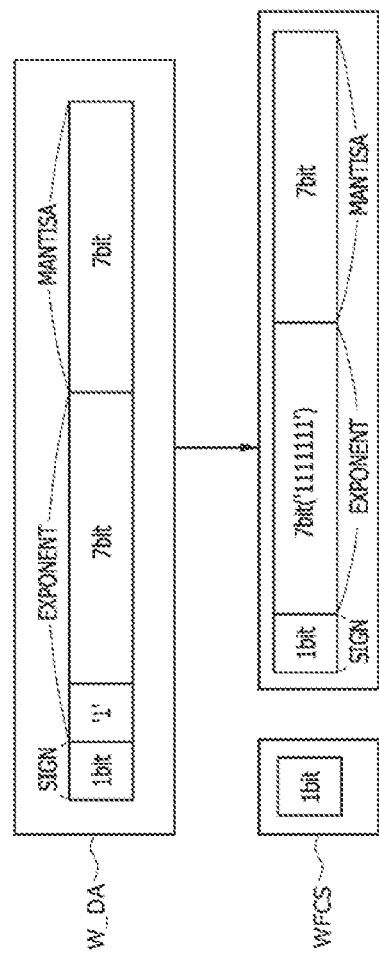

As illustrated in FIG. 47, the write data generator 3100 may remove 1 bit from an exponent part of the write input data W_DA including 16 bits implemented in the floating-point method in which 1 bit is allocated to a sign part, 8 bits are allocated to the exponent part, and 7 bits are allocated to a mantissa part to generate the write data EW_DA including 15 bits implemented in the floating-point method in which 1 bit is allocated to the sign part, 7 bits are allocated to the exponent part, and 7 bits are allocated to the mantissa part. The bit combination of the 7 bits allocated to the exponent part included in the write data EW_DA may be adjusted according to the removed bit of the exponent part. As an example, when the 1 bit removed from the exponent part is the most significant bit and is '1', the bit combination of the 7 bits allocated to the exponent part may be adjusted to a preset bit combination, '1111111'. The preset bit combination to which the bit combination allocated to the exponent part is adjusted may be variously set according to embodiments. The write parity generator 3110 may apply 1 bit of the bits included in the write fail check signal WFCS generated by encoding the write data EW_DA to the storage region 3050 together with the write data EW_DA including 15 bits.

Figure 48:
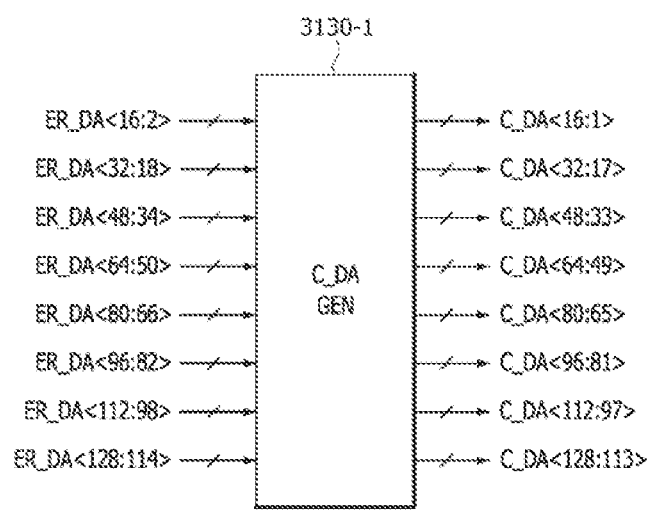
FIG. 48 is a block diagram illustrating a configuration according to an example of a converted data generator included in the CRC logic circuit illustrated in FIG. 43.

FIG. 48 is a block diagram illustrating a configuration of a converted data generator 3130_1 according to an example of the converted data generator 3130. Referring to FIG. 48, the converted data generator 3130_1 may receive read data ER_DA including 8 pieces of 15-bit data to generate converted data C_DA including 8 pieces of 16-bit data. The converted data generator 3130_1 may add 1 bit to first data CR_DA<16:2> of the read data ER_DA including 15 bits to generate first data C_DA<16:1> of the converted data C_DA including 16 bits. In addition, the converted data generator 3130_1 may add 1 bit to second data CR_DA<32:18> of the read data ER_DA including 15 bits to generate second data C_DA<32:17> of the converted data C_DA including 16 bits. In this manner, the converted data generator 3130_1 may add 1 bit to eighth data CR_DA<128:114> of the read data ER_DA including 15 bits to generate eighth data C_DA<128:113> of the converted data C_DA including 16 bits. As an example, in each piece of the data from the first data CR_DA<16:2> of the read data ER_DA implemented in a floating-point method to the eighth data CR_DA<128:114> of the read data ER_DA, 1 bit may be allocated to a sign part, 8 bits may be allocated to an exponent part, and 6 bits may be allocated to a mantissa part. As another example, in each piece of the data from the first data CR_DA<16:2> of the read data ER_DA implemented in the floating-point method to the eighth data CR_DA<128:114> of the read data ER_DA, 1 bit may be allocated to the sign part, 7 bits may be allocated to the exponent part, and 7 bits may be allocated to the mantissa part. As an example, in each piece of the data from the first data C_DA<16:1> of the converted data C_DA implemented in the floating-point method to the eighth data C_DA<128:113> of the converted data C_DA, 1 bit may be allocated to the sign part, 8 bits may be allocated to the exponent part, and 7 bits may be allocated to the mantissa part.

An operation of generating the converted data C_DA from the read data ER_DA in the converted data generator 3130_1 will be described with reference to FIGS. 49 and 50.

Figure 49:
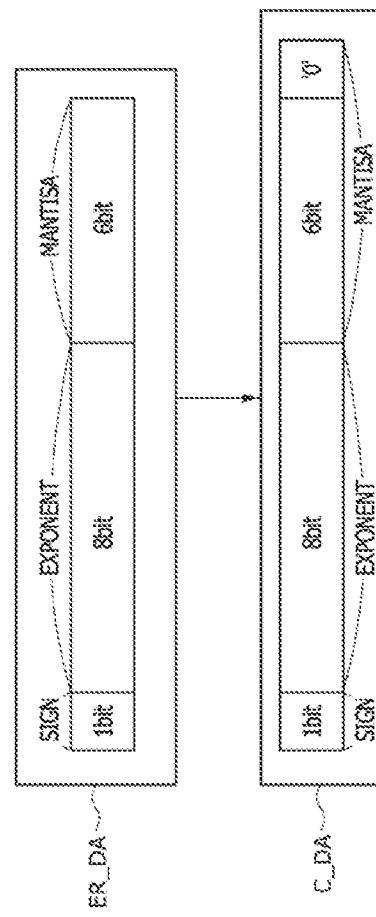
FIGS. 49 and 50 are diagrams illustrating an operation of generating converted data in the converted data generator illustrated in FIG. 48.

As illustrated in FIG. 49, the converted data generator 3130_1 may add 1 bit to read data ER_DA including 15 bits implemented in a floating-point method in which 1 bit is allocated to a sign part, 8 bits are allocated to an exponent part, and 6 bits are allocated to a mantissa part to generate converted data C_DA including 16 bits implemented in the floating-point method in which 1 bit is allocated to the sign part, 8 bits are allocated to the exponent part, and 7 bits are allocated to the mantissa part.

Figure 50:
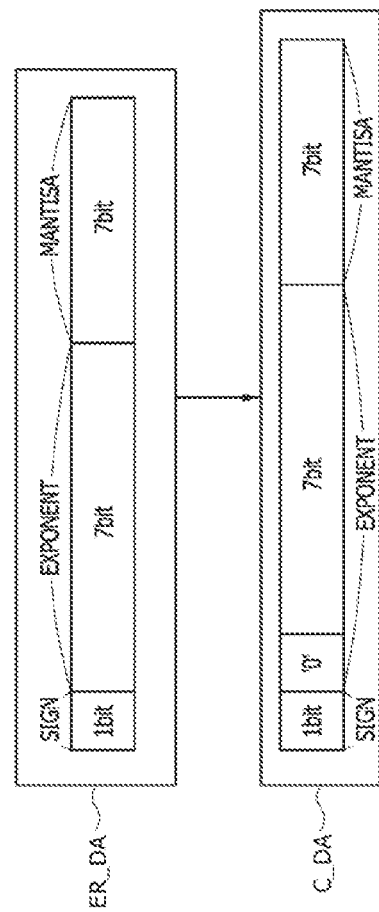

As illustrated in FIG. 50, the converted data generator 3130_1 may add 1 bit to the read data ER_DA including 15 bits implemented in the floating-point method in which 1 bit is allocated to the sign part, 7 bits are allocated to the exponent part, and 6 bits are allocated to the mantissa part to generate converted data C_DA including 16 bits implemented in the floating-point method in which 1 bit is allocated to the sign part, 8 bits are allocated to the exponent part, and 7 bits are allocated to the mantissa part.

Figure 51:
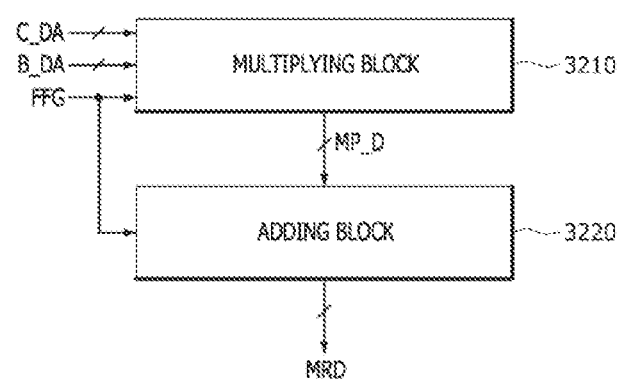
FIG. 51 is a block diagram illustrating a configuration according to an example of a MAC operator included in the PIM device illustrated in FIG. 42.

FIG. 51 is a block diagram illustrating a configuration according to an example of the MAC operator 3070 included in the PIM device illustrated in FIG. 42. Referring to FIG. 51, the MAC operator 3070 may include a multiplying block 3210, and an adding block 3220. The multiplying block 3210 may perform a multiplication operation on converted data C_DA and buffer data B_DA, based on the fail flag signal FFG to generate multiplication result data MP_D. The multiplying block 3210 may perform the multiplication operation for the converted data C_DA and the buffer data B_DA to generate the multiplication result data MP_D when an inactivated fail flag signal FFG is input because a defect is not included in the read data ER_DA. The multiplying block 3210 may stop the multiplication operation for the converted data C_DA and the buffer data B_DA when an activated fail flag signal FFG is input because a defect is included in the read data ER_DA. The adding block 3220 may perform an addition operation for the multiplication result data MP_D, based on the fail flag signal FFG to generate MAC operation result data MRD. The adding block 3220 may perform the addition operation for the multiplication result data MP_D to generate the MAC operation result data MRD when an inactivated fail flag signal FFG is input because a defect is not included in the read data ER_DA. The adding block 3220 may stop the addition operation for the multiplication result data MP_D when an activated fail flag signal FFG is input because a defect is included in the read data ER_DA.

The PIM device 3000 according to another embodiment of the present disclosure described above may convert some of the bits included in data into fail check signals to store the same in the storage region 3050, and use the data and the fail check signal stored in the storage region 3050 to correct the data used in the MAC arithmetic operation, thereby improving the MAC arithmetic operation accuracy.

Figure 52:
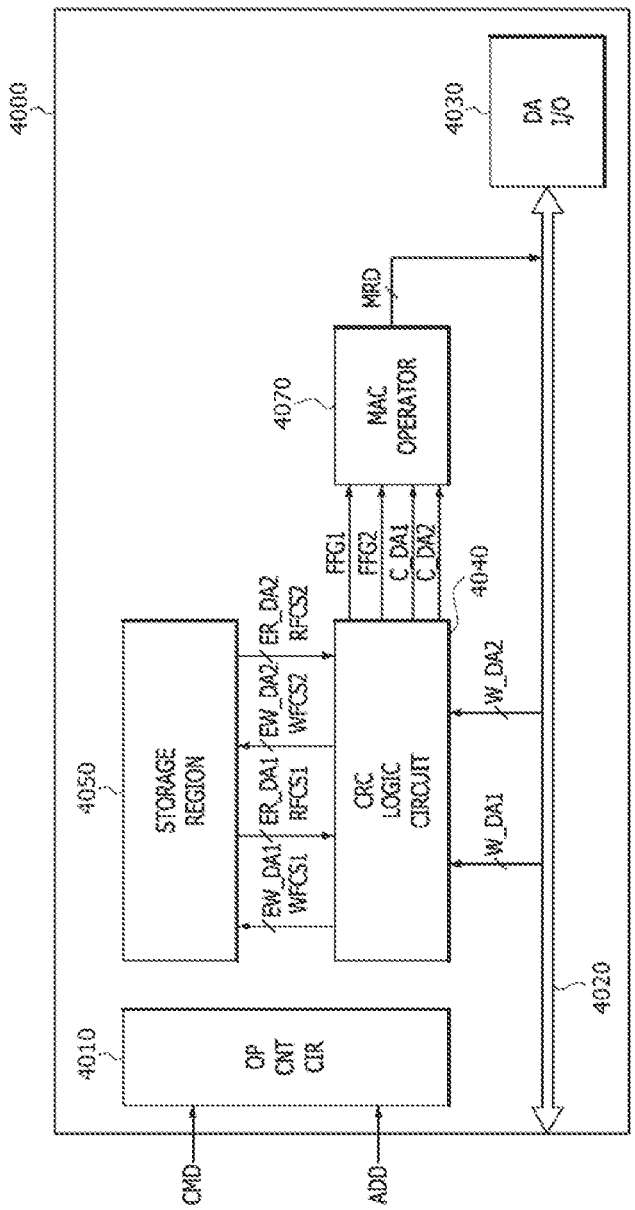
FIG. 52 is a block diagram illustrating a configuration of a PIM device according to still yet another embodiment of the present disclosure.

FIG. 52 is a block diagram illustrating a configuration of a PIM device 4000 according to still yet another embodiment of the present disclosure. Referring to FIG. 52, the PIM device 4000 may include an operation control circuit (OP CONT CTR) 4010, a data line 4020, a data input/output line (DA I/O) 4030, a cyclic redundancy checking (CRC) logic circuit 4040, a storage region 4050, and a MAC operator 4070.

The operation control circuit 4010 may control the CRC logic circuit 4040 and the storage region 4050 when a write operation in an operation mode is performed. The operation control circuit 4010 may control the CRC logic circuit 4040 so that first write data EW_DA1, a first write fail check signal WFCS1, second write data EW_DA2, and a second write fail chick signal WFCS are generated from first write input data W_DA1 and second write input data W_DA2 when the write operation in the operation mode is performed. The operation control circuit 4010 may control the storage region 3050 to receive and store the first write data EW_DA1, the first write fail check signal WFCS1, the second write data EW_DA2, and the second write fail chick signal WFCS generated in the CRC logic circuit 4040 when the write operation in the operation mode is performed. The operation control circuit 4010 may include a command decoder (not illustrated) that decodes a command CMD, an address decoder (not illustrated) that decodes an address ADD, and input/output control circuits (not illustrated) that control data to be input/output in/from the storage region 4050.

The operation control circuit 4010 may control the CRC logic circuit 4040 and the storage region 4050 when a read operation in an operation is performed. The operation control circuit 4010 may control the storage region 4050 so that first read data ER_DA1, a first read fail check signal RFCS1, second read data ER_DA1, and a second read fail check signal RFCS2 are output when the read operation in the operation is performed. The operation control circuit 4010 may control the CRC logic circuit 4040 so that a first fail flag signal FFG1, a second fail flag signal FFG2, first converted data C_DA1, and second converted data C_DA2 are generated from the first read data ER_DA1, the first read fail check signal RFCS1, the second read data ER_DA1, and the second read fail check signal RFCS2 when the read operation in the operation is performed.

The operation control circuit 4010 may control the MAC operator 4070 when a MAC arithmetic operation in an operation mode is performed. The operation control circuit 4010 may control the MAC operator 4070 so that MAC arithmetic operations for the first converted data C_DA1 and the second converted data C_DA2 are performed when the MAC arithmetic operation in the operation mode is performed.

The CRC logic circuit 4040 may receive the first write input data W_DA1 and the second write input data W_DA2 input through the data input/output circuit 4030 through the data line 4020 when the write operation in the operation mode is performed. The CRC logic circuit 4040 may remove some of the bits included in the first write input data W_DA1 and generate the first write data EW_DA1, based on the remaining bits when the write operation in the operation mode is performed. As an example, the CRC logic circuit 4040 may remove 8 bits from the first write input data W_DA1 including 128 bits and generate the first write data EW_DA1 from the first write input data W_DA1 including the remaining 120 bits. The CRC logic circuit 4040 may remove some of the bits included in the second write input data W_DA2 and generate the second write data EW_DA2, based on the remaining bits when the write operation in the operation mode is performed. As an example, the CRC logic circuit 4040 may remove 8 bits from the second write input data W_DA2 including 128 bits and generate the second write data EW_DA2 from the second write input data W_DA2 including the remaining 120 bits.

The CRC logic circuit 4040 may generate the first write fail check signal WFCS1 and the second write fail check signal WFCS2, based on the first write data EW_DA1 and the second write data EW_DA2 when the write operation in the operation mode is performed. The CRC logic circuit 4040 may encode the first write data EW_DA1 to generate the first write fail check signal WFCS1. The CRC logic circuit 4040 may encode the second write data EW_DA2 to generate the second write fail check signal WFCS2. Cyclic redundancy check (CRC) may be used to encode the first write data EW_DA1 to generate the first write fail check signal WFCS1 and to encode the second write data EW_DA2 to generate the second write fail check signal WFCS2. As an example, the CRC logic circuit 4040 may encode the first write data EW_DA1 and the second write data EW_DA2 including 120 bits to generate the first write fail check signal WFCS1 and second write fail check signal WFCS2 including 8 bits, respectively, when the write operation in the operation mode is performed. The CRC logic circuit 4040 may apply the first write data EW_DA1, the second write data EW_DA2, the first write fail check signal WFCS1, and the second write fail check signal WFCS2 to the storage region 4050, based on the control of the operation control circuit 4010 when the write operation in the operation mode is performed.

The CRC logic circuit 4040 may receive first read data ER_DA1, a first read fail check signal RFCS1, second read data ER_DA2, and a second read fail check signal RFCS2 from the storage region 4050 when a read operation in an operation mode is performed. The first read data ER_DA1 may be the same data as the first write data EW_DA1 stored when the write operation in the operation mode is performed, and the second read data ER_DA2 may be the same data as the second write data EW_DA2 stored when the write operation in the operation mode is performed. The first read fail check signal RFCS1 may be the same signal as the first write fail check signal WFCS1 stored when the write operation in the operation mode is performed, and the second read fail check signal RFCS2 may be the same signal as the second write fail check signal WFCS2 stored when the write operation in the operation mode is performed.

The CRC logic circuit 4040 may generate a first fail flag signal FFG1, a second fail flag signal FFG2, first converted data C_DA1, and second converted data C_DA2, based on the first read data ER_DA1, the first read fail check signal RFCS1, the second read data ER_DA2, and the second read fail check signal RFCS2 when the read operation in the operation mode is performed. The CRC logic circuit 4040 may decode the first read data ER_DA1 and the first read fail check signal RFCS1 to generate the first fail flag signal FFG1. Cyclic redundancy checking (CRC) may be used to decode the first read data ER_DA1 and the first read fail check signal RFCS1 to generate the first fail flag signal FFG1 in the CRC logic circuit 4040. As an example, the CRC logic circuit 4040 may decode the first read data ER_DA1 including 120 bits and the first read fail check signal RFCS1 including 8 bits to generate the first fail flag signal FFG1 including 8 bits when the read operation in the operation mode is performed. The first fail flag signal FFG1 may be activated to express that a defect is included in the first read data ER_DA1 in a case that the remainder is not '0' when the first read data ER_DA1 and the first read fail check signal RFCS1 are divided by a divisor code. The CRC logic circuit 4040 may decode the second read data ER_DA2 and the second read fail check signal RFCS2 to generate the second fail flag signal FFG2. Cyclic redundancy checking (CRC) may be used to decode the second read data ER_DA2 and the second read fail check signal RFCS2 to generate the second fail flag signal FFG2 in the CRC logic circuit 4040.

The CRC logic circuit 4040 may generate the first converted data C_DA1 and the second converted data C_DA2 from the first read data ER_DA1 and the second read data ER_DA2 when the read operation in the operation mode is performed. The CRC logic circuit 4040 may add preset bits to the first read data ER_DA1 to generate the first converted data C_DA1 when the read operation in the operation mode is performed. As an example, the CRC logic circuit 4040 may generate the first converted data C_DA1 including 128 bits generated by adding 8 bits to the first read data ER_DA1 including 120 bits. The CRC logic circuit 4040 may add preset bits to the second read data ER_DA2 to generate the second converted data C_DA2 when the read operation in the operation mode is performed. As an example, the CRC logic circuit 4040 may generate the second converted data C_DA2 including 128 bits generated by adding 8 bits to the second read data ER_DA2 including 120 bits.

The storage region 4050 may receive the first write data EW_DA1, the second write data EW_DA2, the first write fail check signal WFCS1, and the second write fail check signal WFCS2 generated in the CRC logic circuit 4040 when the write operation in the operation mode is performed. The storage region 4050 may store the first write data EW_DA1, the second write data EW_DA2, the first write fail check signal WFCS1, and the second write fail check signal WFCS2 in a memory region accessed based on the control of the operation control circuit 4010 when the write operation in the operation mode is performed. The storage region 4050 may apply the first read data ER_DA1, the second read data ER_DA2, the first read fail check signal RFCS1, and the second read fail check signal RFCS2 to the CRC logic circuit 4040 when the read operation in the operation mode is performed. The storage region 4050 may output the first write data EW_DA1, the second write data EW_DA2, the first write fail check signal WFCS1, and the second write fail check signal WFCS2 stored in the memory region accessed based on the control of the operation control circuit 4010 as the first read data ER_DA1, the second read data ER_DA2, the first read fail check signal RFCS1, and the second read fail check signal RFCS2 when the read operation in the operation mode is performed. The storage region 4050 may include a plurality of memory regions implemented as banks.

The MAC operator 4070 may receive the first fail flag signal FFG1, the second fail flag signal FFG2, the first converted data C_DA1, and the second converted data C_DA2 from the CRC logic circuit 4040 when the MAC arithmetic operation is performed. In this embodiment, the first converted data C_DA1 may be weight data applied to a neural network circuit, and the second converted data C_DA2 may be vector data applied to the neural network circuit. According to embodiments, the first converted data C_DA1 may be vector data applied to the neural network circuit, and the second converted data C_DA2 may be weight data applied to the neural network circuit. The MAC operator 4070 may perform MAC arithmetic operations including multiplication and addition operations for the first converted data C_DA1 and the second converted data C_DA2, based on the first fail flag signal FFG1 and the second fail flag signal FFG2 to generate the MAC operation result data MRD. The MAC operator 4070 may be set so that at least one of the multiplication and addition operations for the first converted data C_DA1 and the second converted data C_DA2 is not operated when the first fail flag signal FFG1 is activated because a defect is included in the first read data ER_DA1 or the second fail flag signal FFG2 is activated because a defect is included in the second read data ER_DA2. The MAC operator 4070 may output the MAC operation result MRD to the data input/output circuit 4030 through the data line 4020.

Figure 53:
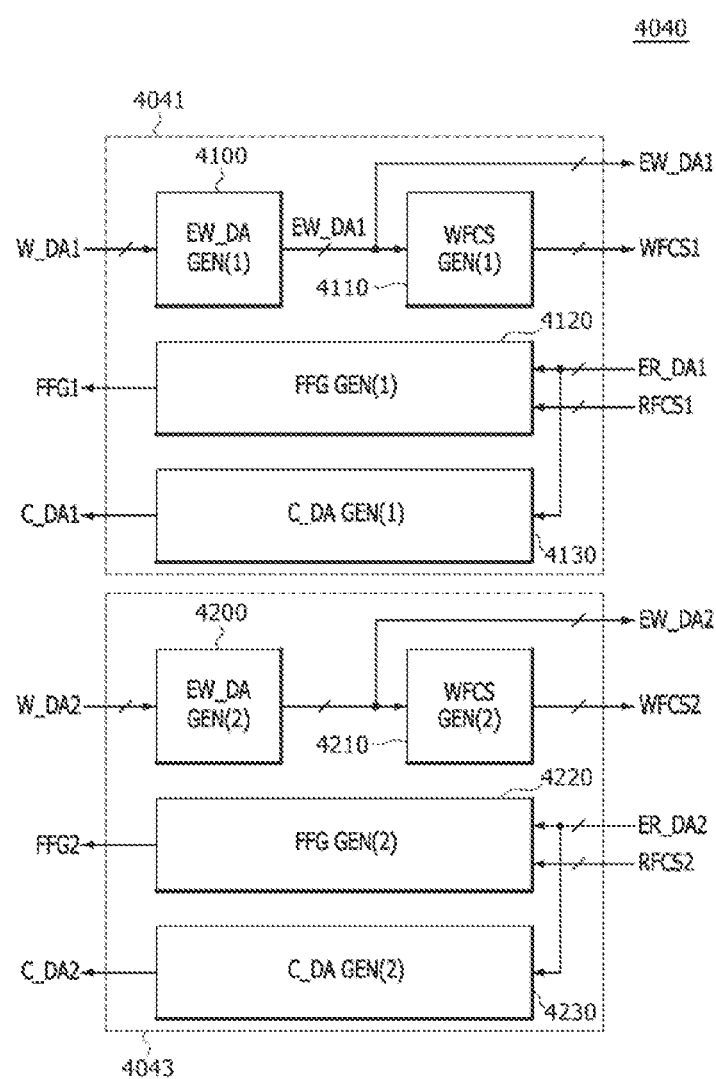
FIG. 53 is a block diagram illustrating a configuration according to an example of a CRC logic circuit included in the PIM device illustrated in FIG. 52.

FIG. 53 is a block diagram illustrating a configuration according to an example of the CRC logic circuit 4040. Referring to FIG. 53, the CRC logic circuit 4040 may include a first CRC logic circuit 4041 and a second CRC logic circuit 4043. The first CRC logic circuit 4041 may include a first write data generator (EW_DA GEN(1)) 4100, a first write fail check signal generator (WFCS GEN(1)) 4110, a first fail flag signal generator (FFG GEN(1)) 4120, and a first converted data generator (C_DA GEN(1)) 4130. The second CRC logic circuit 4043 may include a second write data generator (EW_DA GEN(2)) 4200, a second write fail check signal generator (WFCS GEN(2)) 4210, a second fail flag signal generator (FFG GEN(2)) 4220, and a second converted data generator (C_DA GEN(2)) 4230.

The first write data generator 4100 may remove some of bits included in first write input data W_DA1 and generate first write data EW_DA1, based on the remaining bits when a write operation in an operation mode is performed. As an example, the first write data generator 4100 may remove 8 bits from the first write input data W_DA1 including 128 bits and generate the first write data EW_DA1 from the first write input data W_DA1 including 120 bits.

The first write fail check signal generator 4110 may receive the first write data EW_DA1 from the first write data generator 4100 when the write operation in the operation mode is performed. The first write fail check signal generator 4110 may encode the first write data EW_DA1 to generate a first write fail check signal WFCS1 when the write operation in the operation mode is performed. As an example, the first write fail check signal generator 4110 may encode the first write data EW_DA1 including 120 bits to generate the first write fail check signal WFCS1 including 8 bits when the write operation in the operation mode is performed.

The first fail flag signal generator 4120 may decode first read data ER_DA1 and first read fail check signal RFCS1 to generate first fail flag signal FFG1 when a read operation in an operation mode is performed. As an example, the first fail flag signal generator 4120 may decode the first read data ER_DA1 including 120 bits and the first read fail check signal RFCS1 including 8 bits to generate the first fail flag signal FFG1 including 8 bits when the read operation in the operation mode is performed.

The first converted data generator 4130 may add preset bits to the first read data ER_DA1 to generate first converted data C_DA1 when the read operation in the operation mode is performed. As an example, the first converted data generator 4130 may generate the first converted data C_DA1 including 128 bits generated by adding 8 bits to the first read data ER_DA1 including 20 bits.

The second write data generator 4200 may remove some of bits included in second write input data W_DA2 and generate second write data EW_DA2, based on the remaining bits when the write operation in the operation mode is performed. As an example, the second write data generator 4200 may remove 8 bits from the second write input data W_DA2 including 128 bits and generate the second write data EW_DA2 from the second write input data W_DA2 including the remaining 120 bits.

The second write fail check signal generator 4210 may receive the second write data EW_DA2 from the second write data generator 4200 when the write operation in the operation mode is performed. The second write fail check signal generator 4210 may encode the second write data EW_DA2 to generate second write fail check signal WFCS2 when the write operation in the operation mode is performed. As an example, the second write fail check signal generator 4210 may encode the second write data EW_DA2 including 120 bits to generate the second write fail check signal WFCS2 including 8 bits when the write operation in the operation mode is performed.

The second fail flag signal generator 4220 may decode the second read data ER_DA2 and the second read fail check signal RFCS2 to generate second fail flag signal FFG2 when the read operation in the operation mode is performed. As an example, the second fail flag signal generator 4220 may decode the second read data ER_DA2 including 120 bits and the second read fail check signal RFCS2 including 8 bits to generate the second fail flag signal FFG2 including 8 bits when the read operation in the operation mode is performed.

The second converted data generator 4230 may add preset bits to the second read data ER_DA2 to generate second converted data C_DA2 when the read operation in the operation mode is performed. As an example, the second converted data generator 4230 may generate the second converted data C_DA2 including 128 bits generated by adding 8 bits to the second read data ER_DA2 including 20 bits.

Figure 54:
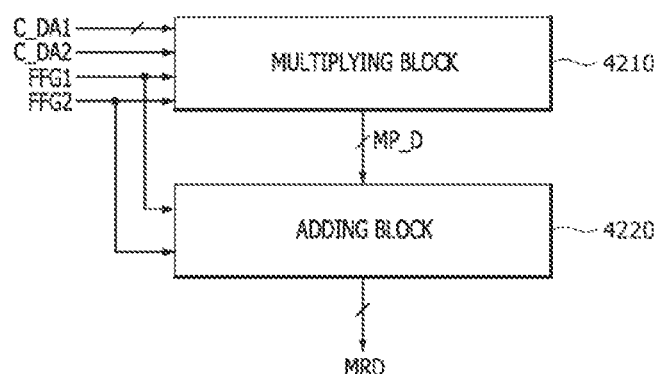
FIG. 54 is a block diagram illustrating a configuration according to an example of a MAC operator included in the PIM device illustrated in FIG. 52.

FIG. 54 is a block diagram illustrating a configuration according to an example of the MAC operator 4070 included in the PIM device illustrated in FIG. 52. Referring to FIG. 54, the MAC operator 4070 may include a multiplying block 4210 and an adding block 4220. The multiplying block 4210 may perform a multiplication operation on the first converted data C_DA1 and the second converted data C_DA2, based on the first fail flag signal FFG1 and the second fail flag signal FFG2 to generate multiplication result data MP_D. The multiplying block 4210 may perform a multiplication operation for the first converted data C_DA1 and the second converted data C_DA2 to generate the multiplication result data MP_D when an inactivated first fail flag signal FFG1 is input because a defect is not included in the first read data ER_DA1 and an inactivated second fail flag signal FFG2 is input because a defect is not included in the second read data ER_DA2. The multiplying block 4210 may stop the multiplication operation for the first converted data C_DA1 and the second converted data C_DA2 when an activated first fail flag signal FFG1 is input because a defect is included in the first read data ER_DA1 or an activated second fail flag signal FFG2 is input because a defect is included in the second read data ER_DA2. The adding block 4220 may perform an addition operation for the multiplication result data MP_D, based on the first fail flag signal FFG1 and the second fail flag signal FFG2 to generate MAC operation result data MRD. The adding block 4220 may perform an addition operation for the multiplication result data MP_D to generate the MAC operation result data MRD when an inactivated first fail flag signal FFG1 is input because a defect is not included in the first read data ER_DA1 and an inactivated second fail flag signal FFG2 is input because a defect is not included in the second read data ER_DA2. The adding block 4220 may stop the addition operation for the multiplication result data MP_D when an activated first fail flag signal FFG1 is input because a defect is included in the first read data ER_DA1 or an activated second fail flag signal FFG2 is input because a defect is included in the second read data ER_DA2.

The PIM device 4000 according to another embodiment of the present disclosure described above converts some of the bits included in the data into fail check signals to store the same in the storage region 4050, and corrects an error of the data used in the MAC arithmetic operation by using the data and the fail check signal stored in the storage region 4050, thereby improving the accuracy of the MAC arithmetic operation.

The concepts have been disclosed in conjunction with some embodiments as described above. Those skilled in the art will appreciate that various modifications, additions and substitutions are possible, without departing from the scope and spirit of the present disclosure. Accordingly, the embodiments disclosed in the present specification should be considered from not a restrictive standpoint but an illustrative standpoint. The scope of the concepts is not limited to the above descriptions but defined by the accompanying claims, and all of distinctive features in the equivalent scope should be construed as being included in the concepts.

The embodiments of the disclosed technology have been disclosed above for illustrative purposes. Those of ordinary skill in the art will appreciate that various modifications, additions, and substitutions are possible. While this patent document contains many specifics, these should not be construed as limitations on the scope of what may be claimed, but rather as descriptions of features that may be specific to particular embodiments. Certain features that are described in this patent document in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

What is claimed is:

1. A processing-in-memory (PIM) device comprising:
an error correction code (ECC) logic circuit configured to generate first write data, first write parity, second write data, and second write parity from first write input data and second write input data when a write operation in an operation mode is performed, and generate first converted data and second converted data from first read data, first read parity, second read data, and second read parity when a read operation in the operation mode is performed; and
a multiplication and accumulation (MAC) operator configured to perform a MAC arithmetic operation for the first converted data and the second converted data to generate MAC operation result data,
wherein the ECC logic circuit removes one or more bits included in the first write input data and the second write input data and generates the first write data and the second write data, based on the remaining bits when the write operation in the operation mode is performed.

2. The PIM device of claim 1, wherein the ECC logic circuit receives the first write input data and the second write input data input through a data input/output circuit when the write operation in the operation mode is performed through a data line.

3. The PIM device of claim 1, wherein the ECC logic circuit removes at least one bit from bits included in a mantissa part of each piece of the first write input data and the second write input data and generates the first write data and the second write data from the first write input data and the second write input data respectively having the mantissa part including the remaining bits when each piece of the first write input data and the second write input data is implemented in a floating-point method, when the write operation in the operation mode is performed.

4. The PIM device of claim 1, wherein the ECC logic circuit removes at least one bit from bits included in the mantissa part of each piece of the first write input data and the second write input data when each piece of the first write input data and the second write input data is implemented in a floating-point method, the bit combination of the remaining bits is adjusted by rounding methods according to the removed bit, and the first write data and the second write data are generated from the first write input data and the second write input data respectively having the mantissa part including the bits with a bit combination that has been adjusted, when the write operation in the operation mode is performed.

5. The PIM device of claim 1, wherein the ECC logic circuit removes at least one bit from bits included in an exponent part of each piece of the first write input data and the second write input data when each piece of the first write input data and the second write input data is implemented in a floating-point method, and generates the first write data and the second write data from the first write input data and the second write input data respectively having the exponent part including the remaining bits, when the write operation in an operation mode is performed.

6. The PIM device of claim 1, wherein the ECC logic circuit removes at least one bit from bits included in the exponent part of each piece of the first write input data and the second write input data when each piece of the first write input data and the second write input data is implemented in a floating-point method, the bit combination of the remaining bits is adjusted to a preset bit combination according to the removed bit, and the first write data and the second write data are generated from the first write input data and the second write input data respectively having the exponent part including bits with a bit combination that has been adjusted, when the write operation in the operation mode is performed.

7. The PIM device of claim 1, wherein the ECC logic circuit encodes the first write data to generate the first write parity and encodes the second write data to generate the second write parity when the write operation in the operation mode is performed.

8. The PIM device of claim 7, wherein the ECC logic circuit encodes the first write data, based on a Hamming code to generate the first write parity, and encodes the second write data, based on the Hamming code to generate the second write parity.

9. The PIM device of claim 1, wherein the ECC logic circuit decodes the first read data and the first read parity to generate first syndrome when the read operation in the operation mode is performed, and decodes the second read data and the second read parity to generate second syndrome when the read operation in the operation mode is performed.

10. The PIM device of claim 9, wherein the ECC logic circuit decodes the first read data and the first read parity, based on a Hamming code to generate the first syndrome, and decodes the second read data and the second read parity, based on the Hamming code to generate the second syndrome.

11. The PIM device of claim 9, wherein the ECC logic circuit corrects an error included in the first read data, based on the first syndrome to generate the first corrected read data when the read operation in the operation mode is performed, and corrects an error included in the second read data, based on the second syndrome to generate the second corrected read data when the read operation in the operation mode is performed.

12. The PIM device of claim 11, wherein the ECC logic circuit adds preset bits to the first corrected read data to generate the first converted data when the read operation in the operation mode is performed, and adds preset bits to the second corrected read data to generate the second converted data when the read operation in the operation mode is performed.

13. The PIM device of claim 12, wherein the ECC logic circuit adds the preset bits to a mantissa part of each piece of the first corrected read data and the second corrected read data to generate the first converted data and the second converted data when each piece of the first corrected read data and the second corrected read data is implemented in a floating-point method.

14. The PIM device of claim 12, wherein the ECC logic circuit adds the preset bits to an exponent part of each piece of the first corrected read data and the second corrected read data to generate the first converted data and the second converted data when each piece of the first corrected read data and the second corrected read data is implemented in a floating-point method.

15. The PIM device of claim 1, wherein the ECC logic circuit applies the first write data, the first write parity, the second write data, and the second write parity to the storage region when the write operation in the operation mode is performed, and receives the first read data, the first read parity, the second read data, and the second read parity when the read operation in the operation mode is performed.

16. The PIM device of claim 15, wherein the storage region outputs the first write data, the second, the second write data, and the second write parity write parity stored when the write operation in the operation mode is performed as the first read data, the first read parity, the second read data, and the second read parity when the read operation in the operation mode is performed.

17. The PIM device of claim 1, wherein the ECC logic circuit includes:
a write data generator configured to generate the first write data and the second write data from the first write input data and the second write input data when the write operation in the operation mode is performed; and
a write parity generator configured to encode the first write data and the second write data to generate the first write parity and the second write parity when the write operation in the operation mode is performed.

18. The PIM device of claim 1, wherein the ECC logic circuit includes:
a syndrome generator configured to decode the first read data and the first read parity to generate first syndrome and decode the second read data and the second read parity to generate second syndrome when the read operation in the operation mode is performed;
a corrected read data generator configured to correct an error included in the first read data, based on the first syndrome to generate the first corrected read data and correct an error included in the second read data, based on the second syndrome to generate the second corrected read data when the read operation in the operation mode is performed; and
a converted data generator configured to generate the first converted data and the second converted data, based on the first corrected read data and the second corrected read data when the read operation in the operation mode is performed.

19. The PIM device of claim 1, wherein the MAC operator performs a MAC arithmetic operation for the first converted data, which is weight data applied to a neural network circuit and the second converted data, which is vector data applied to the neural network circuit.

20. The PIM device of claim 1, wherein the MAC operator performs a MAC arithmetic operation for the first converted data, which is vector data applied to a neural network circuit and the second converted data, which is weight data applied to the neural network circuit.

21. A processing-in-memory (PIM) device comprising:
a storage region configured to receive and store first write data, first write parity, second write data, and second write parity when a write operation in an operation mode is performed, and output first read data, first read parity, second read data, and second read parity when a read operation in the operation mode is performed; and
an error correction code (ECC) logic circuit configured to generate the first write data, the first write parity, the second write data, and the second write parity from first write input data and second write input data when the write operation in the operation mode is performed, and generate first converted data and second converted data from the first read data, the first read parity, the second read data, and the second read parity when the read operation in the operation mode is performed,
wherein the ECC logic circuit removes one or more bits included in the first write input data and the second write input data and generates the first write data and the second write data, based on the remaining bits when the write operation in the operation mode is performed.

22. The PIM device of claim 21, wherein the storage region outputs the first write data, the first write parity, the second write data, and the second write parity stored when the write operation in the operation mode is performed as the first read data, the first read parity, the second read data, and the second read parity when the read operation in the operation mode is performed.

23. The PIM device of claim 21, wherein the ECC logic circuit generates the first converted data, which is weight data applied to a neural network circuit and generates the second converted data, which is vector data applied to the neural network circuit.

24. The PIM device of claim 21, wherein the ECC logic circuit generates the first converted data, which is vector data applied to a neural network circuit and generates the second converted data, which is weight data applied to the neural network circuit.

* * * * *